United States Patent
Jinta

(10) Patent No.: US 7,663,593 B2
(45) Date of Patent: Feb. 16, 2010

(54) LEVEL SHIFT CIRCUIT AND SHIFT REGISTER AND DISPLAY DEVICE

(75) Inventor: Seiichiro Jinta, Kanagawa (JP)

(73) Assignee: Sony Corporation, Tokyo (JP)

( * ) Notice: Subject to any disclaimer, the term of this patent is extended or adjusted under 35 U.S.C. 154(b) by 693 days.

(21) Appl. No.: 11/365,949

(22) Filed: Mar. 2, 2006

(65) Prior Publication Data

US 2006/0197554 A1  Sep. 7, 2006

(30) Foreign Application Priority Data

Mar. 2, 2005  (JP) ............................. 2005-057596
Nov. 4, 2005  (JP) ............................. 2005-320938

(51) Int. Cl.
*G09G 3/36* (2006.01)
*G11C 19/00* (2006.01)

(52) U.S. Cl. ........................................ 345/100; 377/64

(58) Field of Classification Search ................. 345/100; 377/64–81; 257/299; 326/81
See application file for complete search history.

(56) References Cited

U.S. PATENT DOCUMENTS

| | | | | |
|---|---|---|---|---|
| 5,237,212 A | * | 8/1993 | Maekawa | 327/333 |
| 5,414,354 A | * | 5/1995 | Bushman et al. | 327/184 |
| 5,517,542 A | * | 5/1996 | Huq | 377/78 |
| 5,705,946 A | * | 1/1998 | Yin | 327/333 |
| 6,522,323 B1 | * | 2/2003 | Sasaki et al. | 345/204 |
| 6,788,108 B2 | * | 9/2004 | Miyake et al. | 326/88 |
| 2003/0150976 A1 | | 8/2003 | Mabuchi | |
| 2004/0202276 A1 | * | 10/2004 | Osame et al. | 377/64 |

FOREIGN PATENT DOCUMENTS

| | | |
|---|---|---|
| JP | 09-160918 | 6/1997 |
| JP | 09-230828 | 9/1997 |
| JP | 10-084259 | 3/1998 |
| JP | 2003-347926 | 12/2003 |

* cited by examiner

*Primary Examiner*—Chanh Nguyen
*Assistant Examiner*—Robert M Stone
(74) *Attorney, Agent, or Firm*—Rader, Fishman & Grauer PLLC

(57) ABSTRACT

A level shift circuit, a shift register, and a display device in which circuit operation is resistant to influence of variations in characteristics of elements such as transistors. The level shift circuit, includes a first switch turning on or off in accordance with a voltage of a first node, switching ON and OFF when the voltage is a first threshold value, and outputting a first voltage when ON state; a second switch turning on or off in accordance with the voltage of a second node, switching ON and OFF when the voltage is a second threshold value, and outputting a second voltage when ON state; a first capacitor receiving a first input signal at one terminal and connected at the other terminal to the first node; a second capacitor receiving a second input signal at one terminal, and connected at the other terminal to the second node; and a circuit for setting the voltage of the first node at the first threshold value and setting the voltage of the second node at the second threshold value in a predetermined period and setting the first node and the second node in a floating state after the predetermined period.

20 Claims, 41 Drawing Sheets

LEVEL SHIFT CIRCUIT AND SHIFT REGISTER AND DISPLAY DEVICE

CROSS REFERENCES TO RELATED APPLICATIONS

The present invention contains subject matter related to Japanese Patent Application No. 2005-057596 filed in the Japan Patent Office on Mar. 2, 2005 and Japanese Patent Application No. 2005-320938 filed in the Japan Patent Office on Nov. 4, 2005, the entire contents of which being incorporated herein by reference.

BACKGROUND OF THE INVENTION

1. Field of Invention

The present invention relates to a level shift circuit for converting an amplitude of an input signal and a display device mounting this level shift circuit, more particularly relates to a level shift circuit used in a display device such as a liquid crystal display device and an organic electroluminescence (OLED) display device.

2. Description of the Related Art

There have long been various types of level shift circuits. For example, a level shift circuit configured by using a current mirror circuit is known (see for example Japanese Patent Publication (A) No. 2003-347926).

FIG. 41 is a diagram showing an example of the configuration of a conventional current mirror type level shift circuit. A current mirror type level shift circuit 200 shown in FIG. 41 has a circuit operation controller 201, two bias shifters 202 and 203, a level shifter 204, and an output unit 205.

The circuit operation controller 201 has p-type MOS transistors Qp201 and Qp202 and an n-type MOS transistor Qn201. The p-type MOS transistor Qp201 and the n-type MOS transistor Qn201 are connected in series between a power supply line through which a positive side power supply voltage VDD is supplied (hereinafter described as a "power supply line VDD") and a power supply line through which a negative side power supply voltage VSS is supplied (hereinafter described as a "power supply line VSS"). Their gates and drains are commonly connected to each other. The p-type MOS transistor Qp202 is connected at its source to the power supply line VDD and connected at its gate to gates of the p-type MOS transistor Qp201 and the n-type MOS transistor Qn201.

The commonly connected gates of the p-type MOS transistor Qp201 and the n-type MOS transistor Qn201 receive a circuit operation control signal XSTB as input. This circuit operation control signal XSTB is set at a low level at the time of standby of the circuit (when not driven) and set at a high level at the time of the drive of the circuit.

The bias shifter 202 has p-type MOS transistors Qp203 and 204 and an n-type MOS transistor Qn202. The p-type MOS transistor Qp203 and the n-type MOS transistor Qn202 are connected in series between the power supply line VDD and the power supply line VSS. Their gates are commonly connected to drains of the p-type MOS transistor Qp201 and the n-type MOS transistor Qn201. The p-type MOS transistor Qp204 is connected in parallel with the n-type MOS transistor Qn202 and receives a clock signal CK as input at its gate. This bias shifter 202 performs an operation of shifting a DC bias of the clock signal CK.

The bias shifter 203 has p-type MOS transistors Qp205 and Qp206 and the n-type MOS transistor Qn203. The p-type MOS transistor Qp205 and the n-type MOS transistor Qn203 are connected in series between the power supply line VDD and the power supply line VSS. Their gates are commonly connected with each other. The p-type MOS transistor Qp206 is connected in parallel to the n-type MOS transistor Qn203 and receives a clock signal xCK as input at its gate. The clock signal xCK is a signal having an inverse phase with respect to the clock signal CK. This bias shifter 203 performs the operation of shifting the DC bias of the clock signal xCK having an inverse phase.

The level shifter 204 has p-type MOS transistors Qp207 and Qp208 and n-type MOS transistors Qn204 and Qn205. The p-type MOS transistors Qp207 and Qp208 configure a current mirror circuit. Sources of the p-type MOS transistors Qp207 and Qp208 are commonly connected to the power supply line VDD, and their gates are commonly connected to the drain of the p-type MOS transistor Qp207. The drain of the p-type MOS transistor Qp207 is connected to the drain of the p-type MOS transistor Qp202. The n-type MOS transistor Qn204 is connected at its drain to the drain of the p-type MOS transistor Qp207, is connected at its gate to drains of the p-type MOS transistor Qp203 and the n-type MOS transistor Qn202, and receives the clock signal xCK as input at its source. The n-type MOS transistor Qn205 is connected at its drain to the drain of the p-type MOS transistor Qp208, is connected at its gate to drains of the p-type MOS transistor Qp205 and the n-type MOS transistor Qn203, and receives as input the clock signal CK at its source. This level shifter 204 configures a current mirror amplifier for inputting clock signal xCK and CK having inverse phases to each other to sources of the n-type MOS transistors Qn204 and Qn205.

The output unit 205 has an n-type MOS transistor Qn206. The n-type MOS transistor Qn206 is connected at its drain to drains of the p-type MOS transistor Qp208 and the n-type MOS transistor Qn205, is connected at its source to the power supply line VSS, and is connected at its gate to gates of the p-type MOS transistor Qp205 and the n-type MOS transistor Qn203.

In the level shift circuit 200 shown in FIG. 41, the characteristics of the pair of the p-type MOS transistors Qp207 and Qp208 configuring the current mirror circuit must be uniform, therefore the operation of the circuit is easily affected by variation of characteristics of transistors.

Further, in this level shift circuit 200, a leakage current flows in the transistors along with the operation of the current mirror circuit. Namely, in the bias shifters 202 and 203 for shifting the DC biases of clock signals CK and xCK and the level shifter 204 for converting amplitudes of these clock signals CK and xCK to the amplitude of power supply voltage VSS–VDD, the leakage current flows through a route indicated by a dotted line in the figure. For this reason, in the level shift circuit 200, the power consumption due to the leakage current becomes large.

SUMMARY OF THE INVENTION

It is therefore desirable to provide a level shift circuit and a shift register in which the circuit operation is resistant to variation in the characteristics of the transistors and other elements and a display device mounting such a level shift circuit and shift register.

According to a first aspect of the present invention, there is provided a level shift circuit for shifting the level of an input signal and outputting the result. This level shift circuit has a first switch turning on or off in accordance with a voltage of a first node, switching ON and OFF when the voltage is a first threshold value, and outputting a first voltage to an output terminal of the level shift signal at the time of the ON state; a second switch turning on or off in accordance with the voltage of a second node, switching ON and OFF when the voltage is a second threshold value, and outputting a second voltage to the output terminal at the time of the ON state; a first capacitor receiving a first input signal at one terminal and connected at the other terminal to the first node; a second capacitor receiving a second input signal at one terminal, and connected at the other terminal to the second node; and a voltage setting circuit for setting the voltage of the first node at the first threshold value and setting the voltage of the second node at the second threshold value in a predetermined period and setting the first node and the second node in a floating state after the predetermined period.

According to a second aspect of the present invention, there is provided a shift register provided with a plurality of cascade-connected shift stages for successively transmitting pulse signals input to an initial stage to latter stages. Each shift stage has a detection circuit for detecting a period during which the pulse signal is input from a former stage and a period during which the pulse signal is output to a next stage; a level shift circuit for shifting the level of the pulse signal included in one cycle of the input clock signal and outputting the result in an input period and an output period of the pulse signal detected by the detection circuit; and an output circuit for outputting the signal output from the level shift circuit to the next stage as the pulse signal in the input period and the output period of the pulse signal detected by the detection circuit and outputting a signal of a constant level to the next stage in a predetermined period for initializing the level shift circuit. The level shift circuit has a first switch which turns on when the voltage of the first node is at a second voltage side with respect to a first threshold value included within a range from the first voltage to the second voltage, turns off when the voltage of the first node is at the first voltage side with respect to the first threshold value, and outputs the first voltage to the output terminal of the level shift signal at the time of the ON state; a second switch which turns ON when the voltage of the second node is at the first voltage side with respect to the second threshold value included within the range from the first voltage to the second voltage, turns OFF when the voltage of the second node is at the second voltage side with respect to the second threshold value, and outputs the second voltage to the output terminal at the time of the ON state; a first capacitor receiving as input the clock signal at one terminal and connected at the other terminal to the first node; a second capacitor receiving as input the clock signal at one terminal and connected at the other terminal to the second node; a voltage setting circuit for setting the voltage of the first node at the first threshold value and setting the voltage of the second node at the second threshold value in a predetermined period and setting the first node and the second node in a floating state after the predetermined period; a first input circuit for inputting the clock signal to the first capacitor and the second capacitor in the input period and the output period of the pulse signal detected by the detection circuit; and a second input circuit for inputting a predetermined voltage included in a range from a third voltage to a fourth voltage to the first capacitor and the second capacitor in place of the clock signal in a period during which the voltage setting circuit sets the voltage of the first node and the second node. The clock signal is a signal alternately repeating the third voltage and the fourth voltage. Two cascade-connected shift stages receive as input clock signals having equal cycles with each other but having different phases from each other.

According to a third aspect of the present invention, there is provided a display device having a level shift circuit for shifting the level of an input signal and outputting the result; a pixel array including a plurality of pixels; and a drive circuit for driving pixels of the pixel array in response to the level shift signal output from the level shift circuit. The display device according to the third aspect has a level shift circuit according to the first aspect of the invention as this level shift circuit.

According to a fourth aspect of the present invention, there is provided a display device provided with a pixel array including a plurality of pixels arranged in a matrix and a drive circuit. The drive circuit has a first shift register for generating pulse signals for successively selecting rows of the pixel array and a second shift register for generating pulse signals for successively selecting pixels belonging to the selected row. The display device according to the fourth aspect has shift registers according to the second aspect of the invention as these first shift register and second shift register.

According to the present invention, in the predetermined period, the voltage of the first node is set at the first threshold value, and the voltage of the second node is set at the second threshold value. Then, after this predetermined period, the first node and the second node are set in the floating state. In this state, when the voltage of the first input signal slightly changes, since the first node is in the floating state, the voltage of the first node changes from the first threshold value in accordance with the change of voltage of the first input signal and the ON and OFF states of the first switch change. Further, in this state, when the voltage of the second input signal slightly changes, since the second node is in the floating state, the voltage of the second node changes from the second threshold value in accordance with the change of voltage of the second input signal, and the ON and OFF states of the second switch change. For example, when voltages of the first input signal and the second input signal slightly change so that the first switch changes from OFF to ON and the second switch changes from ON to OFF, the voltage of the output terminal changes from the second voltage to the first voltage. Conversely, when voltages of the first input signal and the second input signal slightly change so that the first switch changes from ON to OFF and the second switch changes from OFF to ON, the voltage of the output terminal changes from the first voltage to the second voltage. In this way, according to a slight change of voltages of the first input signal and the second input signal, a level shift signal changing between the first voltage and the second voltage is output from the output terminal.

The first threshold value and the second threshold value are preferably included within a range from the first voltage to the second voltage. Further preferably, the first switch turns on when the voltage of the first node is at the second voltage side with respect to the first threshold value and turns off when it is at the first voltage side, while the second switch turns on when the voltage of the second node is at the first voltage side with respect to the second threshold value and turns off when it is at the second voltage side. In this case, the voltage setting circuit may also charge the first capacitor so that the voltage of the first node is at the second voltage side with respect to the first threshold value in a first period, supply the voltage output from the first switch in the ON state to the first node in a second period after the charging, charge the second capacitor so that the voltage of the second node is at the first voltage side with respect to the second threshold value in a third period, and supply the voltage output from the second switch in the ON state to the second node in a fourth period after the charging.

Further, the voltage setting circuit may charge the second capacitor in the third period after the first switch turns off in the second period. In this case, preferably the voltage setting circuit charges the second capacitor so that the voltage of the second node is at the second voltage side with respect to the second threshold value in the first period. Further, in this case, the voltage setting circuit may disconnect the first switch and the output terminal or may disconnect the second switch and the output terminal in the first period, the second period, the third period, and the fourth period. Alternatively, the voltage setting circuit may disconnect the first switch and the output terminal and connect the second switch and the output terminal in the first period and the second period and may connect the first switch and the output terminal and disconnect the second switch and the output terminal in the third period and the fourth period.

Further, the voltage setting circuit may disconnect the first switch and the output terminal or disconnect the second switch and the output terminal in a fifth period in which at least a portion of the first period and the second period and at least a portion of the third period and the fourth period overlap. In this case, the voltage setting circuit may charge the second capacitor in the third period parallel to the charging of the first capacitor in the first period or supply voltage to the second node in the fourth period parallel to the supply of voltage to the first node in the second period.

Summarizing the effect of the invention, it is therefore possible to keep variations in characteristic of transistors and other elements from greatly affecting the operation of the circuit.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, embodiments of the present invention will be explained with reference to the drawings.

First Embodiment

Figure 1:
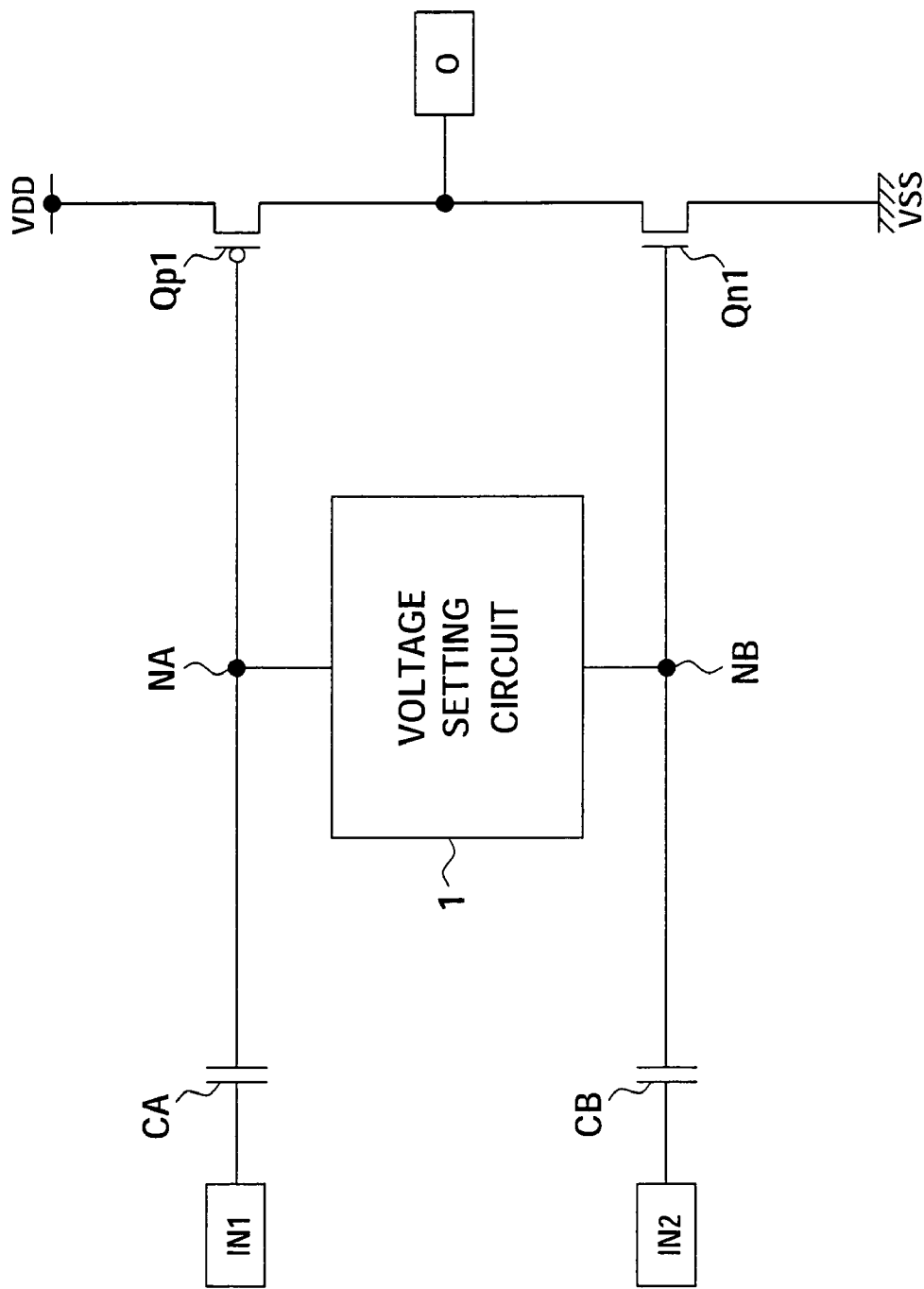
FIG. 1 is a diagram showing an example of the configuration of a level shift circuit according to a first embodiment; p

FIG. 1 is a diagram showing an example of the configuration of a level shift circuit according to a first embodiment of the present invention. The level shift circuit shown in FIG. 1 has a p-type MOS transistor Qp1, an n-type MOS transistor Qn1, a capacitor CA, a capacitor CB, and a voltage setting circuit 1.

The circuit including the p-type MOS transistor Qp1 is an embodiment of the first switch of the present invention. The circuit including the n-type MOS transistor Qn1 is an embodiment of the second switch of the present invention. The capacitor CA is an embodiment of the first capacitor of the present invention. The capacitor CB is an embodiment of the second capacitor of the present invention.

The p-type MOS transistor Qp1 operates as a switch turning on or off in accordance with the voltage of a node NA. The p-type MOS transistor Qp1 switches ON and OFF when the voltage of the node NA is at "VDD−Vthp" and outputs a positive side voltage "VDD" to the output terminal of a level shift signal O at the time of that ON state. Note that "Vthp" indicates the threshold voltage of the p-type MOS transistor Qp1. The p-type MOS transistor Qp1 turns off when the voltage of the node NA is higher than "VDD−Vthp" and turns on where it is lower than "VDD−Vthp". As shown in the example of FIG. 1, the source of the p-type MOS transistor Qp1 is connected to the power supply line VDD, its drain is connected to the output terminal of the level shift signal O, and its gate is connected to the node NA.

The n-type MOS transistor Qn1 operates as a switch turning on or off in accordance with the voltage of a node NB. The n-type MOS transistor Qn1 switches ON and OFF when the voltage of the node NB is at "VSS+Vthn" and outputs the negative side voltage "VSS" to the output terminal of the level shift signal O at the time of that ON state. Note that "Vthn" indicates the threshold voltage of the n-type MOS transistor Qn1. The n-type MOS transistor Qn1 turns on when the voltage of the node NB is higher than "VSS+Vthn" and turns off when it is lower than "VSS+Vthn". As shown in the example of FIG. 1, the source of the n-type MOS transistor Qn1 is connected to the power supply line VSS, its drain is connected to the output terminal of the level shift signal O, and its gate is connected to the node NB.

The capacitor CA receives as input a first input signal IN1 at one terminal and has the other terminal connected to the node NA.

The capacitor CB receives as input a second input signal IN2 at one terminal and has the other terminal connected to the node NB.

The voltage setting circuit 1 sets the voltage of the node NA at "VDD−Vthp" and sets the voltage of the node NB at "VSS+Vthn" for example before the start of the level shift operation or in a predetermined period during the level shift operation. Then, after the predetermined period, it sets the nodes NA and NB in the floating state.

The voltage setting circuit 1 sets the nodes NA and NB at the above voltages in for example the following way. Namely, the voltage setting circuit 1 charges the capacitor CA so that the voltage of the node NA becomes a voltage lower than "VDD−Vthp" in the first period at first and supplies the voltage output from the p-type MOS transistor Qp1 in the ON state to the node NA in the second period after this charging. Due to this, the voltage of the node NA rises toward the voltage "VDD". When the voltage reaches "VDD−Vthp", the p-type MOS transistor Qp1 turns on by itself. As a result, the voltage of the node NA is set at "VDD−Vthp". Further, the voltage setting circuit 1 charges the capacitor CB so that the voltage of the node NB becomes a voltage higher than "VSS+Vthn" in a third period and supplies the voltage output from the n-type MOS transistor Qn1 in the ON state to the node NB in a fourth period after this charging. Due to this, the voltage of the node NB falls toward the voltage "VSS". When the voltage reaches "VSS+Vthn", the n-type MOS transistor Qn1 turns off by itself. As a result, the voltage of the node NB is set at "VSS+Vthn".

Here, an explanation will be given of the operation of the level shift circuit shown in FIG. 1 having the above configuration. In a predetermined period, voltages of the nodes NA and NB are set at voltages of switch points of ON/OFF of the p-type MOS transistor Qp1 and the n-type MOS transistor Qn1 ("VDD−Vthp", "VSS+Vthn"). Then, after the predetermined period, the nodes NA and NB are set in the floating state. In this state, when the voltage of the first input signal IN1 changes to the falling direction, since the node NA is in the floating state, the voltage of the node NA also changes to a direction becoming lower than "VDD−Vthp" in response to the first input signal IN1. Due to this, the p-type MOS transistor Qp1 turns on. Further, when the voltage of the second input signal changes to the falling direction, since the node NB is in the floating state, the voltage of the node NB also changes to a direction becoming lower than "VSS+Vthn" in response to the second input signal IN2. Due to this, the n-type MOS transistor Qn1 turns off. Accordingly, in this case, the p-type MOS transistor Qp1 turns on, and the n-type MOS transistor Qn1 turns off, therefore the voltage of the level shift signal O becomes "VDD". Conversely, when both of the voltages of the first input signal IN1 and the second input signal IN2 change to the rising direction, the voltages of the nodes NA and NB change to the rising direction in accordance with this, therefore the p-type MOS transistor Qp1 turns off, and the n-type MOS transistor Qn1 turns on. As a result, the voltage of the level shift signal O becomes "VSS". In this way, according to the level shift circuit shown in FIG. 1, the first input signal IN1 and the second input signal IN2 having relatively small amplitudes can be converted to the level shift signal O having a large amplitude changing within the range from the power supply voltage VDD to VSS.

Further, in the level shift circuit shown in FIG. 1, the voltage of the node NA is set at "VDD−Vthp" and the voltage of the node NB is set at "VSS+Vthn" by the voltage setting circuit 1. Due to this, even if the threshold voltages "Vthp" and "Vthn" of the transistors vary due for example to variations in production, the voltages of the nodes NA and NB are set at suitable voltages considering these variations by the voltage setting circuit 1. Accordingly, according to the level shift circuit shown in FIG. 1, a stable level shift operation can be carried out without the influence of variation of the threshold voltages of the transistors (Qp1, Qn1).

Further, in the level shift circuit shown in FIG. 1, by making the first input signal IN1 and the second input signal IN2 signals having the same phase, either of the p-type MOS transistor Qp1 or the n-type MOS transistor Qn1 can be made ON and the other can be set OFF, therefore almost no leakage current penetrating through the p-type MOS transistor Qp1 and the n-type MOS transistor Qn1 flows. Also, the nodes NA and NB become the floating state at the time of the level shift operation, therefore no leakage current flows. Accordingly, according to the level shift circuit shown in FIG. 1, leakage current along with the level shift operation can be suppressed, and the power consumption can be reduced.

In addition, in the level shift circuit shown in FIG. 1, the voltages of the nodes NA and NB are set at voltages of switch points of ON/OFF of the p-type MOS transistor Qp1 and the n-type MOS transistor Qn1. Due to this, even if the signal amplitudes of the first input signal IN1 and the second input signal IN2 are amplitudes smaller than the threshold voltages "Vthp" and "Vthn", the level shift operation is possible. Accordingly, according to the level shift circuit shown in FIG. 1, even a signal having an amplitude smaller than the threshold voltage of the transistor can be converted to a signal having a large amplitude changing within the range from the power supply voltage VDD to VSS, and the conversion range of the signal can be broadened.

Second Embodiment

Next, an explanation will be given of a second embodiment of the present invention.

The level shift circuit according to the present embodiment shows a more specific configuration of the voltage setting circuit in the level shift circuit according to the first embodiment explained above.

Figure 2:
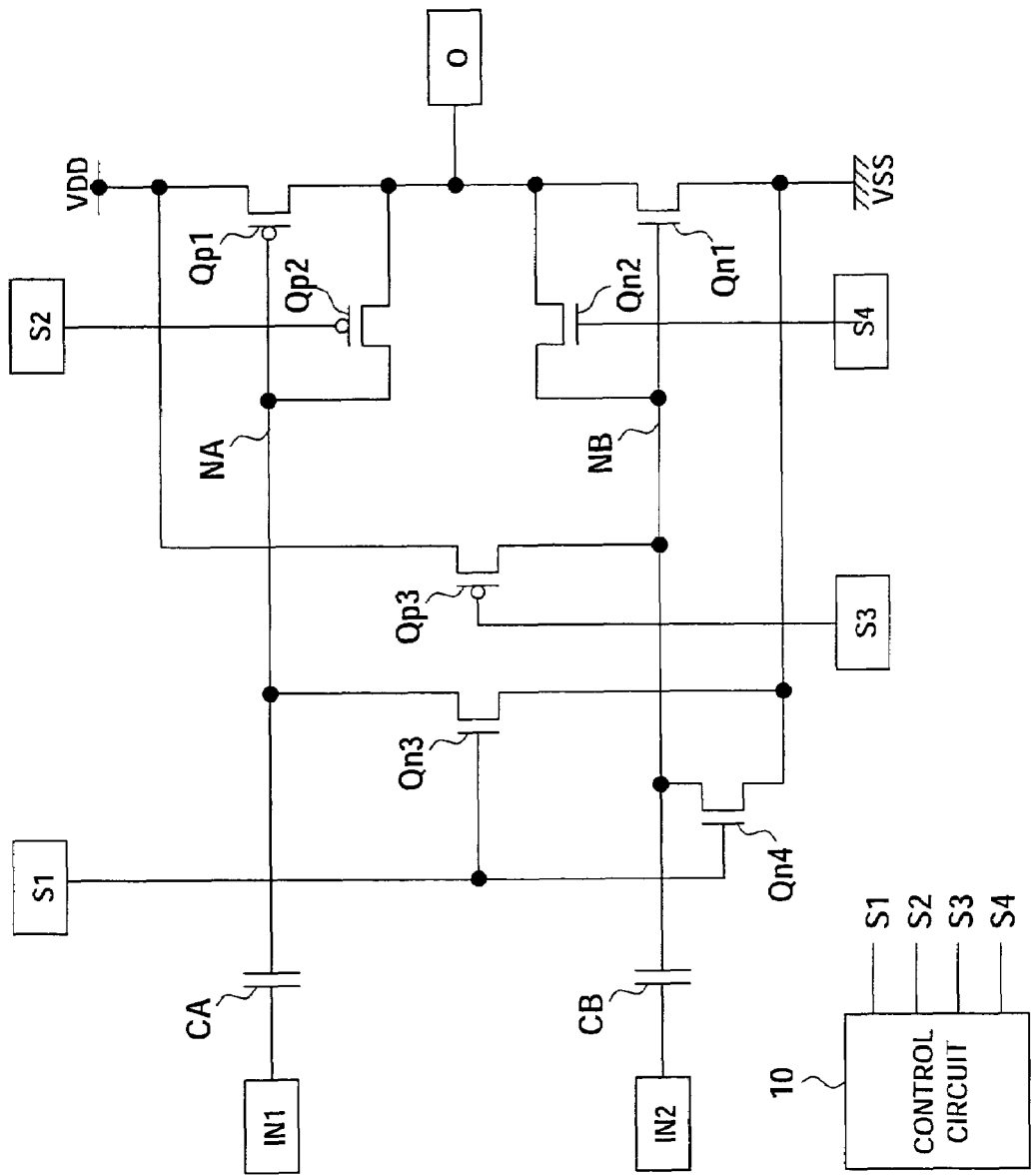
FIG. 2 is a diagram showing an example of the configuration of a level shift circuit according to a second embodiment.

FIG. 2 is a diagram showing an example of the configuration of the level shift circuit according to a second embodiment of the present invention, wherein the same notations of FIG. 1 and FIG. 2 indicate the same configurations. The level shift circuit shown in FIG. 2 has, as the voltage setting circuit 1 in the level shift circuit shown in FIG. 1, p-type MOS transistors Qp2 and Qp3, n-type MOS transistors Qn2, Qn3, and Qn4, and a control circuit 10. The rest of the configuration is the same as in the level shift circuit shown in FIG. 1.

In the level shift circuit shown in FIG. 2, the circuit including the p-type MOS transistor Qp1 is an embodiment of the first switch of the present invention. The circuit including the n-type MOS transistor Qn1 is an embodiment of the second switch of the present invention. The capacitor CA is an embodiment of the first capacitor of the present invention. The capacitor CB is an embodiment of the second capacitor of the present invention. The circuit including the n-type MOS transistors Qn3 and Qn4 is an embodiment of the first voltage supply circuit of the present invention. The circuit including the p-type MOS transistor Qp3 is an embodiment of the second voltage supply circuit of the present invention. The circuit including the p-type MOS transistor Qp2 is an embodiment of the third switch of the present invention. The circuit including the n-type MOS transistor Qn2 is an embodiment of the fourth switch of the present invention.

The n-type MOS transistor Qn3 supplies the voltage "VSS" to the node NA in response to a control signal S1 input to the gate. The n-type MOS transistor Qn3 is connected between the node NA and the power supply line VSS and set in the ON state in the first period (times t1 to t2 in FIG. 3).

The n-type MOS transistor Qn4 supplies the voltage "VSS" to the node NB in response to the control signal S1 input to the gate. The n-type MOS transistor Qn4 is connected between the node NB and the power supply line VSS and becomes the ON state in the first period (times t1 to t2 in FIG. 3).

The p-type MOS transistor Qp2 operates as the switch for connecting or disconnecting the drain of the p-type MOS transistor Qp1 and the node NA in response to a control signal S2 input to the gate. The p-type MOS transistor Qp2 connects the drain of the p-type MOS transistor Qp1 and the node NA in the second period (times t2 to t3 in FIG. 3).

The p-type MOS transistor Qp3 supplies the voltage "VDD" to the node NB in response to a control signal S3 input to the gate. The p-type MOS transistor Qp3 is connected between the node NB and the power supply line VDD and set in the ON state in the third period (times t3 to t4 in FIG. 3).

The n-type MOS transistor Qn2 operates as the switch for connecting or disconnecting the drain of the n-type MOS transistor Qn1 and the node NB in response to a control signal S4 input to the gate. The n-type MOS transistor Qn2 connects the drain of the n-type MOS transistor Qn1 and the node NB in the fourth period (times t4 to t5 in FIG. 3).

The control circuit 10 generates the above control signals S1 to S4 so that suitable voltages are set in the nodes NA and NB. Namely, in the first period (t1 to t2), the control signal S1 is set at the voltage "VDD", and the control signal S1 is set at the voltage "VSS" in the other period. The control signal S2 is set at the voltage "VSS" in the second period (t2 to t3) continuing after the first period, and the control signal S2 is set at the voltage "VDD" in the other periods. In the third period (t3 to t4) continuing after the second period, the control signal S3 is set at the voltage "VSS", and the control signal S3 is set at the voltage "VDD" in the other periods. The control signal S4 is set at the voltage "VDD" in the fourth period (t4 to t5) continuing after the third period, and the control signal S4 is set at the voltage "VSS" in the other periods.

Next, an explanation will be given of the operation of the level shift circuit shown in FIG. 2 having the above configuration with reference to FIG. 3.

Figure 3:
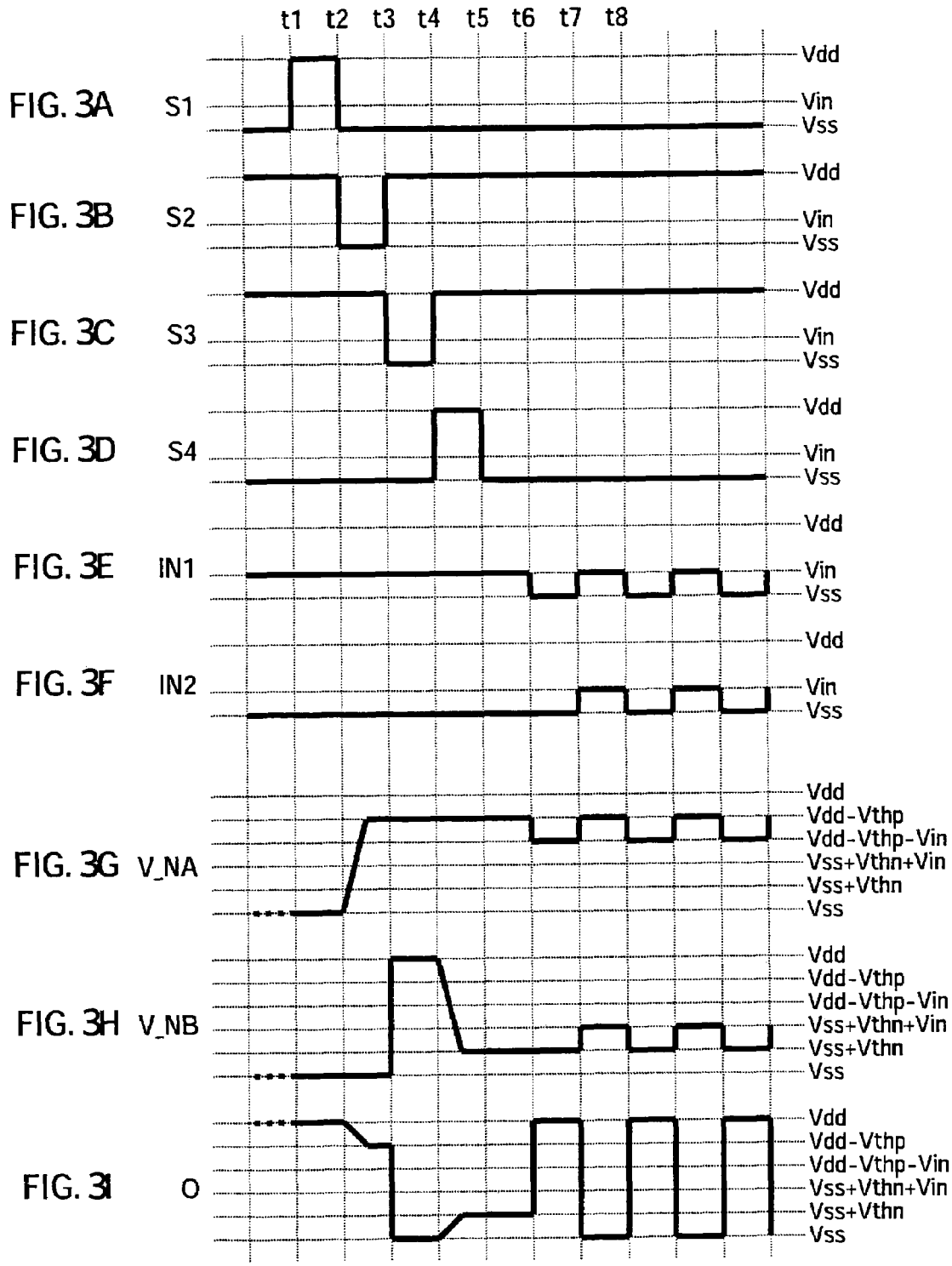
FIG. 3 is a diagram showing an example of signal waveforms of portions in the level shift circuit shown in FIG. 2.

FIG. 3 is a diagram showing an example of signal waveforms of portions in the level circuit shown in FIG. 2. FIG. 3A shows the voltage waveform of the control signal S1. FIG. 3B shows the voltage waveform of the control signal S2. FIG. 3C shows the voltage waveform of the control signal S3. FIG. 3D shows the voltage waveform of the control signal S4. FIG. 3E shows the voltage waveform of the first input signal IN1. FIG. 3F shows the voltage waveform of the second input signal IN2. FIG. 3G shows the voltage waveform of a voltage V_NA of the node NA. FIG. 3H shows the voltage waveform of a voltage V_NB of the node NB. FIG. 3I shows the voltage waveform of the level shift signal O.

In the initial state before the voltages of the nodes NA and NB are set, the control circuit 10 sets the control signals S1 and S4 at the voltage "VSS" and sets the control signals S2 and S3 at the voltage "VDD". In this case, all of transistors (Qp2, Qp3, Qn2, Qn3, qn4) of the voltage setting circuit are turned off.

Further, in this initial state, the first input signal In1 is set at the voltage "Vin", and the second input signal IN2 is set at the voltage "VSS". Note that, the first input signal IN1 and the second input signal IN2 are binary signals setting the voltage "Vin" at the high level and setting the voltage "VSS" at the low level.

In the first period (t1 to t2), the control circuit 10 sets the control signal S1 at the voltage "VDD". Due to this, the n-type MOS transistor Qn3 turns on, the node NA is set at the voltage "VSS", and the p-type MOS transistor Qp1 turns on.

At this time, the n-type MOS transistor Qn4 turns on and also the node NB is set at the voltage "VSS", therefore the n-type MOS transistor Qn1 turns off. By turning off the n-type MOS transistor Qn1 in the first period (t1 to t2), the generation of a penetration current due to the p-type MOS transistor Qp1 and the n-type MOS transistor Qn1 simultaneously turning on can be prevented.

In the second period (t2 to t3) after the node NA is set at the voltage "VSS", the control circuit 10 returns the control signal S1 to the voltage "VSS" and boosts down the control signal S2 to the voltage "VSS". Due to this, the p-type MOS transistor Qp2 turns on, and the node NA and the drain of the p-type MOS transistor Qp1 are connected. At this time, the p-type MOS transistor Qp1 is in the ON state, and the current flows in the node NA via the p-type MOS transistor Qp1 from the power supply line VDD, therefore the voltage V_NA of the node NA rises toward the voltage "VDD". When the voltage V_NA reaches "VDD−Vthp", the p-type MOS transistor Qp1 turns off by itself, therefore the rise of the voltage V_NA stops. As a result, the voltage V_NA of the node NA is set at "VDD−Vthp".

In the third period (t3 to t4) after the p-type MOS transistor Qp1 turns off, the control circuit 10 returns the control signal S2 to the voltage "VDD" and boosts down the control signal S3 to the voltage "VSS". Due to this, the p-type MOS transistor Qp3 turns on, the node NB is set at the voltage "VDD", and the n-type MOS transistor Qn1 turns on.

Note that the p-type MOS transistor Qp1 is in the OFF state at this time, therefore even when the n-type MOS transistor Qn1 changes to ON, no current penetrating through the two flows.

In the fourth period (t4 to t5) after the node NB is set at the voltage "VDD", the control circuit 10 returns the control signal S3 to the voltage "VDD" and raises the control signal S4 to the voltage "VDD". Due to this, the n-type MOS transistor Qn2 turns on, and the node NB and the drain of the n-type MOS transistor Qn1 are connected. At this time, the n-type MOS transistor Qn1 is in the ON state, and the current flows from the node NB to the power supply line VSS via the n-type MOS transistor Qn1, therefore the voltage V_NB of the node NB falls toward the voltage "VSS". When the voltage V_NB reaches "VSS+Vthn", the n-type MOS transistor Qn1 turns off by itself, therefore the fall of the voltage V_NB stops. As a result, the voltage V_NB of the node NB is set at "VSS+Vthn".

After the voltage V_NA of the node NA is set at "VDD−Vthp" and the voltage V_NB of the node NB is set at "VSS+Vthn", the first input signal IN1 and the second input signal IN2 change to the same phase (after the time t6). For example, at times t6 to t7, the first input signal IN1 and the second input signal IN2 become the low level (VSS), the voltage V_NA becomes "VDD−Vthp−Vin", and the voltage V_NB becomes "VSS+Vthn". Due to this, the p-type MOS transistor Qp1 turns on, and the n-type MOS transistor Qn1 turns off, therefore the level shift signal O becomes the voltage "VDD". Further, at for example times t7 to t8, the first input signal IN1 and the second input signal IN2 become the high level (Vin), the voltage V_NA becomes "VDD−Vthp", and the voltage V_NB becomes "VSS+Vthn+Vin". Due to this, the n-type MOS transistor Qn1 turns on, and the p-type MOS transistor Qp1 turns off, therefore the level shift signal O becomes the voltage "VSS".

As explained above, according to the level shift circuit according to the present embodiment, the voltage of the node NA is set at "VDD−Vthp", and the voltage of the node NB is set at "VSS+Vthn", therefore a stable level shift operation can be carried out without influence due to the variation of the threshold voltages of the transistors (Qp1, Qn1). Further, in the voltage setup period (t1 to t5) of the nodes NA and NB and the period of the level shift operation, the simultaneous turning on of the p-type MOS transistor Qp1 and the n-type MOS transistor Qn1 can be prevented, therefore the leakage current along with the level shift operation is suppressed, and the power consumption can be made smaller. Further, the voltages of the nodes NA and NB are set at voltages of switching points of ON/OFF of the p-type MOS transistor Qp1 and the n-type MOS transistor Qn1, therefore a level shift operation is possible even for a signal having a smaller amplitude than the threshold voltage of the transistor, and the conversion range of the signal can be made wide.

Third Embodiment

Next, an explanation will be given of a third embodiment of the present invention. In the level shift circuit according to the second embodiment (FIG. 2), the voltage of the node NB at a low potential side is set after the voltage of the node NA on a high potential side is set, but in the level shift circuit according to the present embodiment (FIG. 4), the voltage of the node NA on the high potential side is set after the voltage of the node NB on the low potential side is set.

Figure 4:
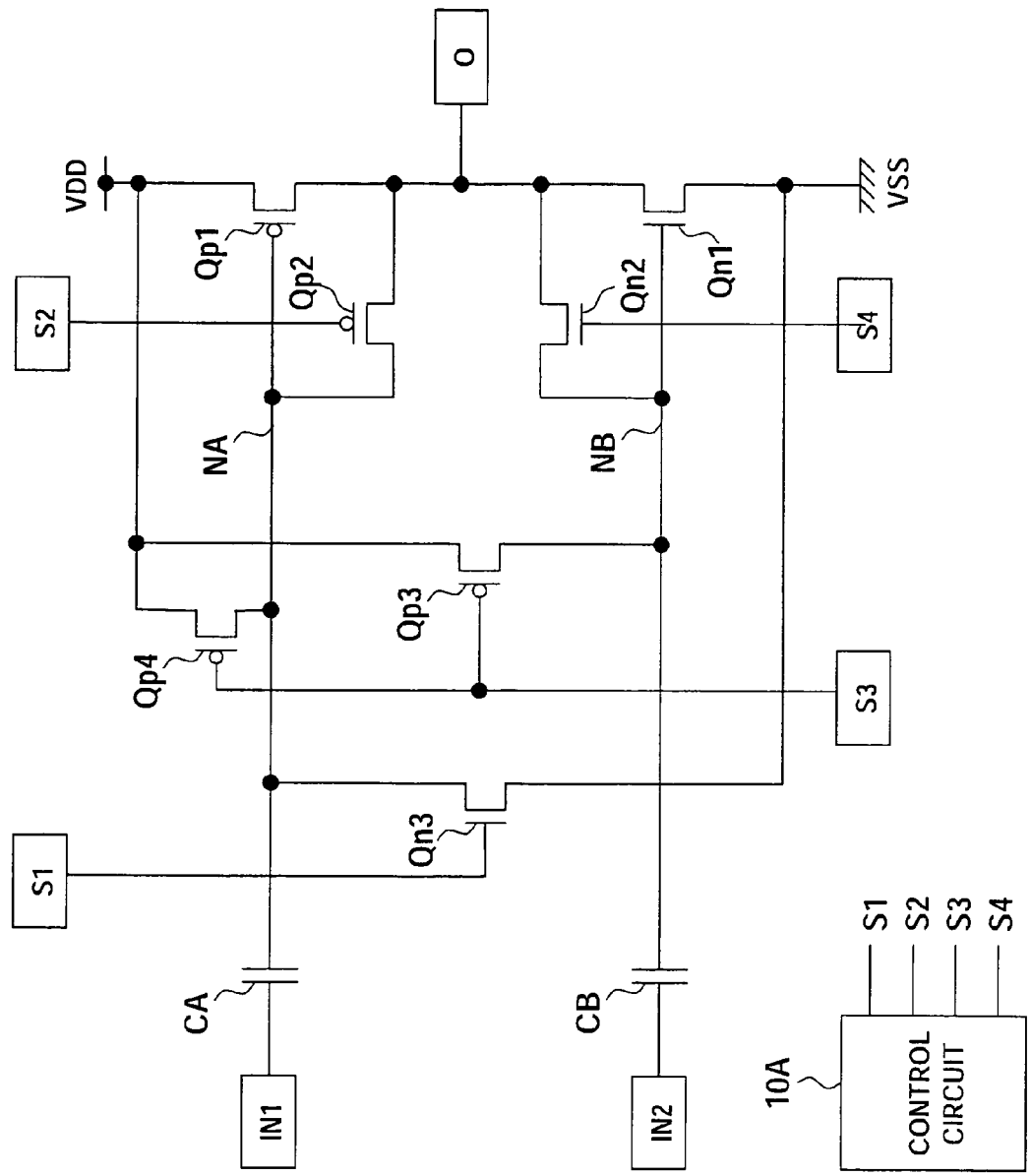
FIG. 4 is a diagram showing an example of the configuration of a level shift circuit according to a third embodiment.

FIG. 4 is a diagram showing an example of the configuration of the level shift circuit according to the third embodiment of the present invention. The same notations of FIG. 1 and FIG. 3 indicate the same configurations. The level shift circuit shown in FIG. 4 has, as the voltage setting circuit 1 in the level shift circuit shown in FIG. 1, p-type MOS transistors Qp2, Qp3, and Qp4, n-type MOS transistors Qn2 and Qn3, and a control circuit 10A. The rest of the configuration is the same as that of the level shift circuit shown in FIG. 1.

In the level shift circuit shown in FIG. 4, the circuit including the n-type MOS transistor Qn1 is an embodiment of the first switch of the present invention. The circuit including the p-type MOS transistor Qp1 is an embodiment of the second switch of the present invention. The capacitor CB is an embodiment of the first capacitor of the present invention. The capacitor CA is an embodiment of the second capacitor of the present invention. The circuit including the p-type MOS transistors Qp3 and Qp4 is an embodiment of the first voltage supply circuit of the present invention. The circuit including the n-type MOS transistor Qn3 is an embodiment of the second voltage supply circuit of the present invention. The circuit including the n-type MOS transistor Qn2 is an embodiment of the third switch of the present invention. The circuit including the p-type MOS transistor Qp2 is an embodiment of the fourth switch of the present invention.

The p-type MOS transistor Qp3 supplies the voltage "VDD" to the node NB in response to the control signal S3 input to the gate. The p-type MOS transistor Qp3 is connected between the node NB and the power supply line VDD and set in the ON state in the first period (times t11 to t12 in FIG. 5).

The p-type MOS transistor Qp4 supplies the voltage "VDD" to the node NA in response to the control signal S3 input to the gate. The p-type MOS transistor Qp4 is connected between the node NA and the power supply line VDD and set in the ON state in the first period (times t11 to t12 in FIG. 5).

The n-type MOS transistor Qn2 operates as the switch for connecting or disconnecting the drain of the n-type MOS transistor Qn1 and the node NB in response to the control signal S4 input to the gate. The n-type MOS transistor Qn2 connects the drain of the n-type MOS transistor Qn1 and the node NB in the second period (times t12 to t13 in FIG. 5).

The n-type MOS transistor Qn3 supplies the voltage "VDD" to the node NA in response to the control signal S1 input to the gate. The n-type MOS transistor Qn3 is connected between the node NA and the power supply line VSS and set in the ON state in the third period (times t13 to t14 in FIG. 5).

The p-type MOS transistor Qp2 operates as the switch for connecting or disconnecting the drain of the p-type MOS transistor Qp1 and the node NA in response to the control signal S2 input to the gate. The p-type MOS transistor Qp2 connects the drain of the p-type MOS transistor Qp1 and the node NA in the fourth period (times t14 to t15 in FIG. 5).

The control circuit 10A generates the above control signals S1 to S4 so that suitable voltages are set in the nodes NA and NB. Namely, in the first period (t11 to t12), the control signal S3 is set at the voltage "VSS", and the control signal S3 is set at the voltage "VDD" in the other periods. The control signal S4 is set at the voltage "VDD" in the second period (t12 to t13) continuing after the first period, and the control signal S4 is set at the voltage "VSS" in the other periods. In the third period (t13 to t14) continuing after the second period, the control signal S1 is set at the voltage "VDD", and the control signal S1 is set at the voltage "VSS" in the other periods. The control signal S2 is set at the voltage "VSS" in the fourth period (t14 to t15) continuing after the third period, and the control signal S2 is set at the voltage "VDD" in the other periods.

Next, an explanation will be given of the operation of the level shift circuit shown in FIG. 4 having the above configuration with reference to FIG. 5.

Figure 5:
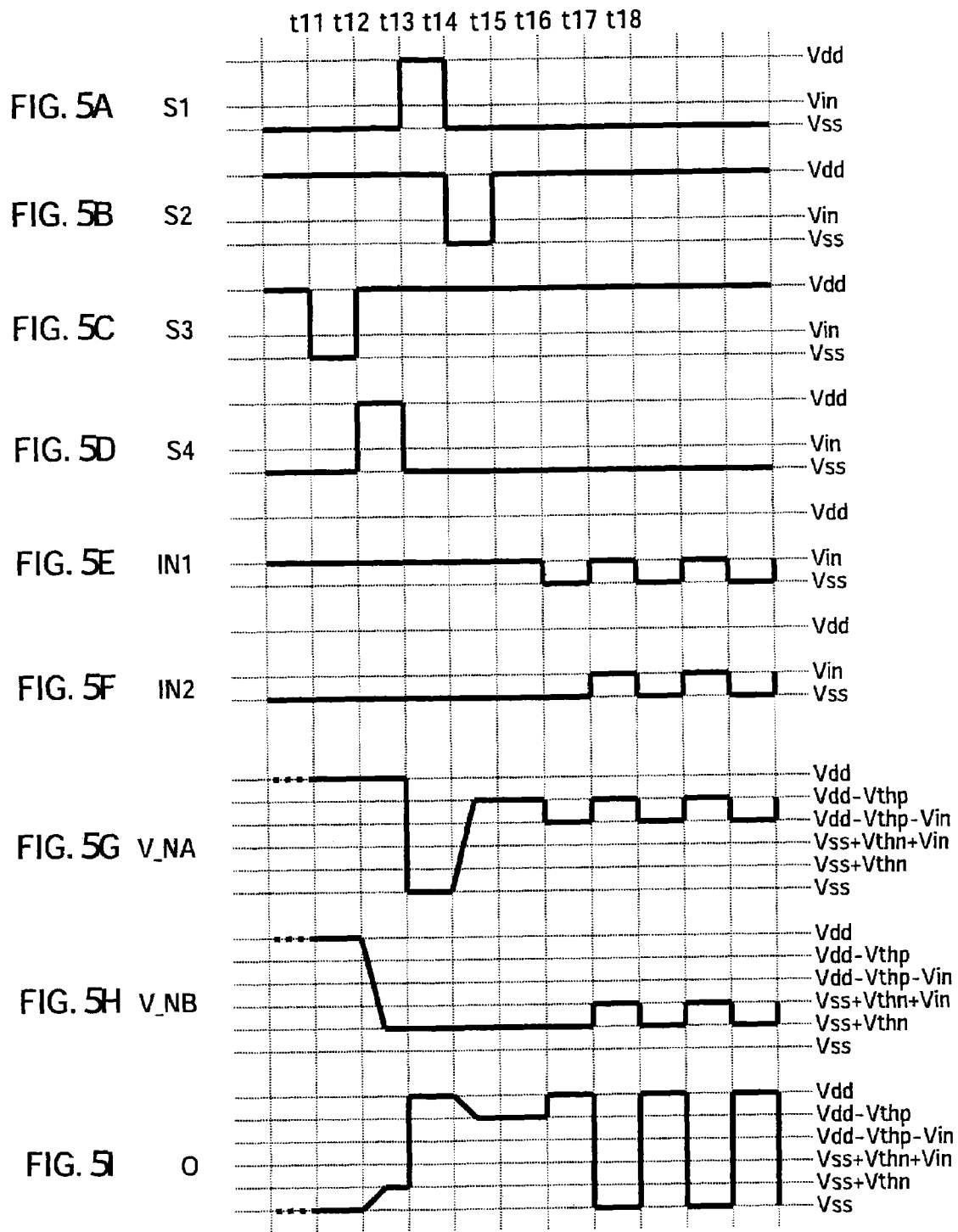
FIG. 5 is a diagram showing an example of signal waveforms of portions in the level shift circuit shown in FIG. 4.

FIG. 5 is a diagram showing an example of signal waveforms of portions in the level circuit shown in FIG. 4. The signal waveforms of FIGS. 5A to 5I correspond to the signal waveforms of FIGS. 3A to 3I.

In the initial state before the voltages of the nodes NA and NB are set, the control circuit 10A sets the control signals S1 and S4 at the voltage "VSS", sets the control signals S2 and S3 at the voltage "VDD", and turns off all of the transistors (Qp2, Qp3, Qp4, Qn2, Qn3) of the voltage setting circuit. Further, in this initial state, the first input signal In1 is set at the voltage "Vin" of the high level, and the second input signal IN2 is set at the voltage "VSS" of the low level.

In the first period (t1 to t2), the control circuit 10A sets the control signal S3 at the voltage "VSS". Due to this, the p-type MOS transistor Qp3 turns on, the node NB is set at the voltage "VDD", and the n-type MOS transistor Qn1 turns on.

At this time, the p-type MOS transistor Qp4 turns on, and the node NA is set at the voltage "VDD", therefore the p-type MOS transistor Qp1 turns off. By turning off the p-type MOS transistor Qp1 in the first period (t11 to t12), the generation of a penetration current due to the p-type MOS transistor Qp1 and the n-type MOS transistor Qn1 simultaneously turning on can be prevented.

In the second period (t12 to t13) after the node NB is set at the voltage "VDD", the control circuit 10A returns the control signal S3 to the voltage "VDD" and raises the control signal S4 to the voltage "VDD". Due to this, the n-type MOS transistor Qn2 turns on, and the drain of the n-type MOS transistor Qn1 and the node NB are connected. At this time, the n-type MOS transistor Qn1 is in the ON state, and the current flows through the power supply line VSS from the node NB via the n-type MOS transistor Qn1, therefore the voltage V_NB of the node NB falls toward the voltage "VSS". When the voltage V_NB reaches "VSS+Vthn", the n-type MOS transistor Qn1 turns off by itself, therefore the fall of the voltage V_NB stops. As a result, the voltage V_NB of the node NB is set at "VSS+Vthn".

In the third period (t13 to t14) after the n-type MOS transistor Qn1 turns off, the control circuit 10A returns the control signal S4 to the voltage "VSS" and raises the control signal S1 to the voltage "VDD". Due to this, the n-type MOS transistor Qn3 turns on, the node NA is set at the voltage "VSS", and the p-type MOS transistor Qp1 turns on.

Note that, the n-type MOS transistor Qn1 is in the OFF state at this time, therefore even when the p-type MOS transistor Qp1 changes to ON, no current penetrating through the two flows.

In the fourth period (t14 to t15) after the node NA is set at the voltage "VSS", the control circuit 10A returns the control signal S1 to the voltage "VSS" and boosts down the control signal S2 to the voltage "VSS". Due to this, the p-type MOS transistor Qp2 turns on, and the drain of the p-type MOS transistor Qp1 and the node NA are connected. At this time, the p-type MOS transistor Qp1 is in the ON state, and the current flows in the node NA from the power supply line VDD via the p-type MOS transistor Qp1, therefore the voltage V_NA of the node NA rises toward the voltage "VDD". When the voltage V_NA reaches "VDD−Vthp", the p-type MOS transistor Qp1 turns off by itself, therefore the rise of the voltage V_NA stops. As a result, the voltage V_NA of the node NA is set at "VDD−Vthp".

The operation after the voltage V_NA of the node NA is set at "VDD−Vthp" and the voltage V_NB of the node NB is set at "VSS+Vthn" is the same as that of the level shift circuit shown in FIG. 2. For example, at times t16 to t17, when the first input signal IN1 and the second input signal IN2 become the low level (VSS), the p-type MOS transistor Qp1 turns on, and the n-type MOS transistor Qn1 turns off, therefore the level shift signal O becomes the voltage "VDD". Further, at for example times t17 to t18, when the first input signal IN1 and the second input signal IN2 become the high level (Vin), the n-type MOS transistor Qn1 turns on, and the p-type MOS transistor Qp1 turns off, therefore the level shift signal O becomes the voltage "VSS".

As explained above, in the level shift circuit according to the present embodiment as well, the same operation as that of the level shift circuit shown in FIG. 2 is realized, therefore effects the same as those by it can be exhibited. Namely, the voltage of the node NA is set at "VDD−Vthp", and the voltage of the node NB is set at "VSS+Vthn", therefore a stable level shift operation can be carried out without influence due to variation of the threshold voltages of transistors (Qp1, Qn1). Further, the simultaneous turning on of the p-type MOS transistor Qp1 and the n-type MOS transistor Qn1 can be prevented, so the leakage current along with the level shift operation can be suppressed. Further, voltages of the nodes NA and NB are set at voltages of switching points of ON/OFF of the p-type MOS transistor Qp1 and the n-type MOS transistor Qn1, therefore a level shift operation can be performed even for a signal having a smaller amplitude than the threshold voltage of the transistor.

Fourth Embodiment

Next, an explanation will be given of a fourth embodiment of the present invention. In the level shift circuits according to the second and third embodiment, in order to prevent the generation of a penetration current due to the simultaneous turning on of the p-type MOS transistor Qp1 and the n-type MOS transistor Qn1, the voltages of the nodes NA and NB are separately set, but in the level shift circuit according to the present embodiment, the voltages of the two are set in parallel.

Figure 6:
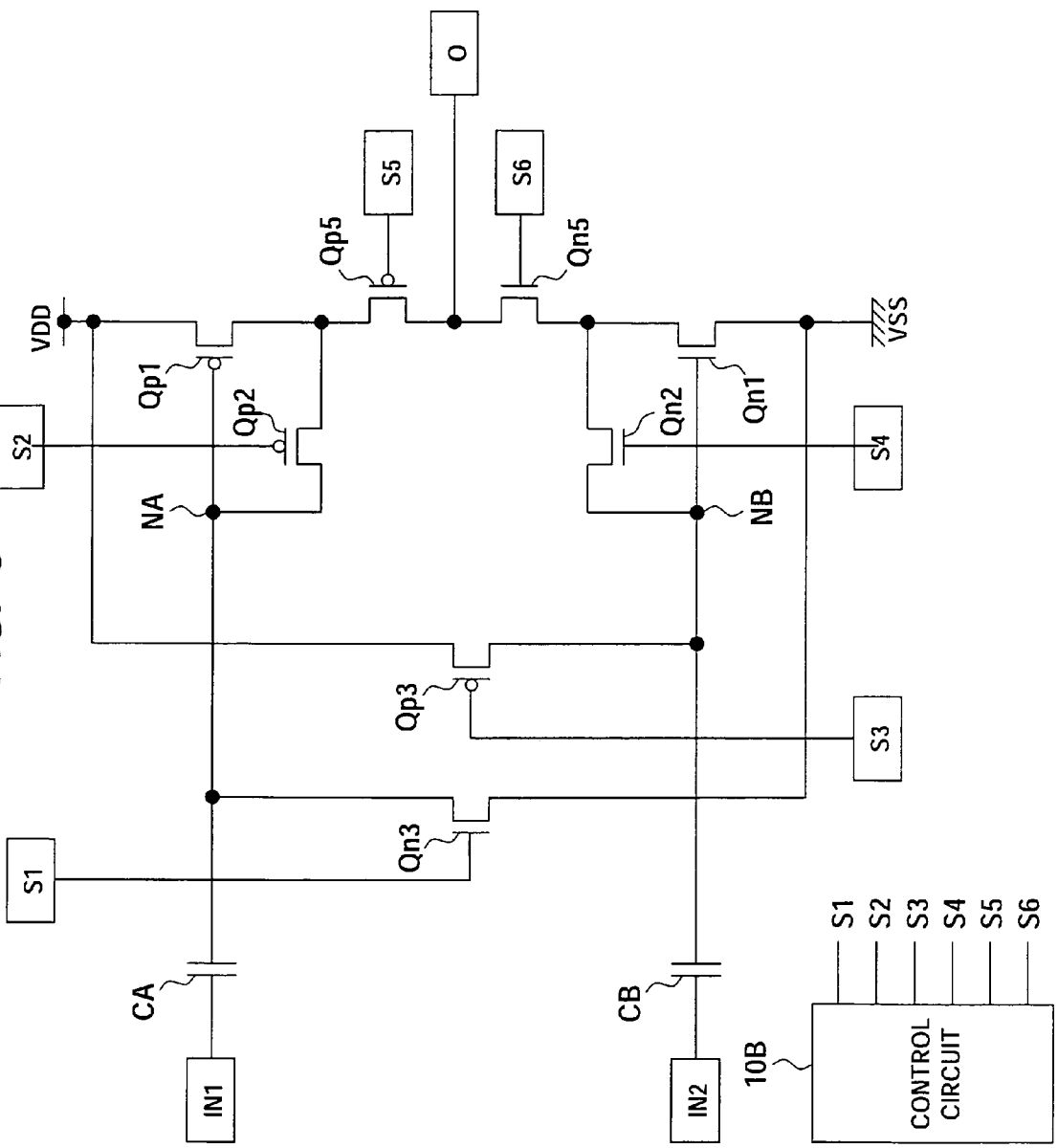
FIG. 6 is a diagram showing an example of the configuration of a level shift circuit according to a fourth embodiment.

FIG. 6 is a diagram showing an example of the configuration of the level shift circuit according to the fourth embodiment of the present invention. The same notations in FIG. 1 and FIG. 6 indicate the same configurations. The level shift circuit shown in FIG. 6 has, as the voltage setting circuit 1 in the level shift circuit shown in FIG. 1, p-type MOS transistors Qp2, Qp3, and Qp5, n-type MOS transistors Qn2, Qn3, and Qn5, and a control circuit 10B. The rest of the configuration is the same as the level shift circuit shown in FIG. 1.

In the level shift circuit shown in FIG. 6, the circuit including the p-type MOS transistor Qp1 is an embodiment of the first switch of the present invention. The circuit including the n-type MOS transistor Qn1 is an embodiment of the second switch of the present invention. The capacitor CA is an embodiment of the first capacitor of the present invention. The capacitor CB is an embodiment of the second capacitor of the present invention. The circuit including the n-type MOS transistor Qn3 is an embodiment of the first voltage supply circuit of the present invention. The circuit including the p-type MOS transistor Qp3 is an embodiment of the second voltage supply circuit of the present invention. The circuit including the p-type MOS transistor Qp2 is an embodiment of the third switch of the present invention. The circuit including the n-type MOS transistor Qn2 is an embodiment of the fourth switch of the present invention. The circuit including the p-type MOS transistor Qp5 and the n-type MOS transistor Qn5 is an embodiment of the fifth switch of the present invention.

The n-type MOS transistor Qn3 supplies the voltage "VSS" to the node NA in response to the control signal S1 input to the gate. The n-type MOS transistor Qn3 is connected between the node NA and the power supply line VSS and set in the ON state in the first period (times t21 to t22 in FIG. 7).

The p-type MOS transistor Qp2 operates as the switch for connecting or disconnecting the drain of the p-type MOS transistor Qp1 and the node NA in response to the control signal S2 input to the gate. The p-type MOS transistor Qp2 connects the drain of the p-type MOS transistor Qp1 and the node NA in the second period (times t22 to t23 of FIG. 7).

The p-type MOS transistor Qp3 supplies the voltage "VDD" to the node NB in response to the control signal S3 input to the gate. The p-type MOS transistor Qp3 is connected between the node NB and the power supply line VDD and set in the ON state in the first period (times t21 to t22 in FIG. 7).

The n-type MOS transistor Qn2 operates as the switch for connecting or disconnecting the drain of the n-type MOS transistor Qn1 and the node NB in response to the control signal S4 input to the gate. The n-type MOS transistor Qn2 connects the drain of the n-type MOS transistor Qn1 and the node NB in the second period (times t22 to t23 in FIG. 7).

The p-type MOS transistor Qp5 operates as the switch for connecting or disconnecting the drain of the p-type MOS transistor Qp1 and the output terminal of the level shift signal O in response to the control signal S5 input to the gate. The p-type MOS transistor Qp5 is set in the ON state in the first period and the second period (t21 to t23 in FIG. 7).

The n-type MOS transistor QN5 operates as the switch for connecting or disconnecting the drain of the n-type MOS transistor Qn1 and the output terminal of the level shift signal O in response to the control signal S6 input to the gate. The n-type MOS transistor Qn5 is set in the OFF state in the first period and the second period (t21 to t23 in FIG. 7).

A control circuit 10B generates the above control signals S1 to S6 so that suitable voltages are set in the nodes NA and NB. Namely, the control signal S1 is set at the voltage "VDD" and the control signal S3 is set at the voltage "VSS" in the first period (t21 to t22), and the control signal S1 is set at the voltage "VSS" and the control signal S3 is set at the voltage "VDD" in the other periods. The control signals S1 and S3 become signals having inverse phases. Further, the control signal S2 is set at the voltage "VSS" and the control signal S4 is set at the voltage "VDD" in the second period (t22 to t23) continuing after the first period and the control signal S2 is set at the voltage "VDD" and the control signal S4 is set at the voltage "VSS" in the other periods. The control signals S2 and S4 become signals having inverse phases. Further, the control signal S5 is set at the voltage "VDD" and the control signal S6 is set at the voltage "VSS" in the first period and the second period (t21 to t23), and the control signal S5 is set at the voltage "VSS" and the control signal S6 is set at the voltage "VDD" in the other period. The control signals S5 and S6 become signals having inverse phases.

Next, an explanation will be given of the operation of the level shift circuit shown in FIG. 6 having the above configuration with reference to FIG. 7.

Figure 7:
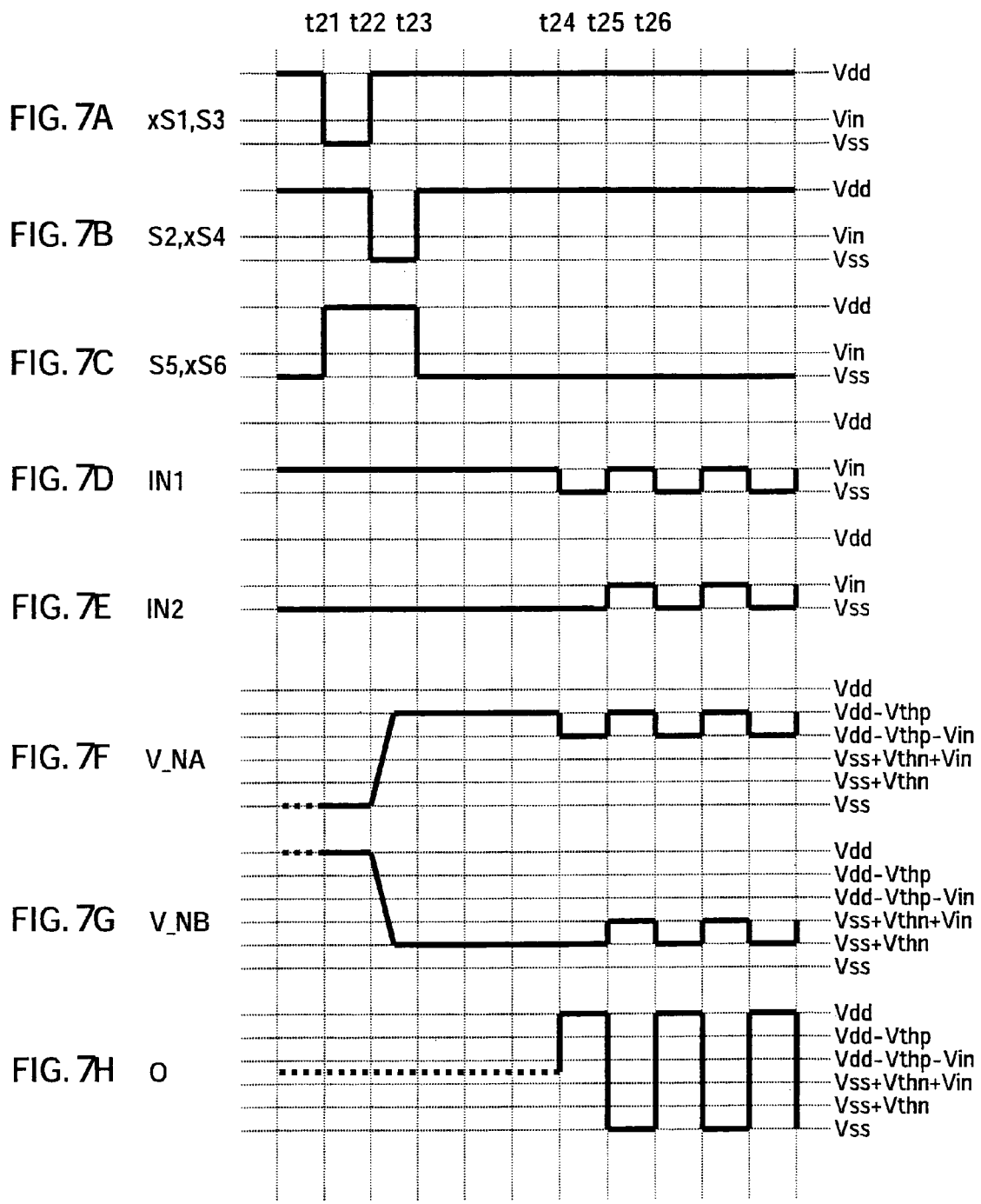
FIG. 7 is a diagram showing an example of signal waveforms of portions in the level shift circuit shown in FIG. 6.

FIG. 7 is a diagram showing an example of signal waveforms of portions in the level shift circuit shown in FIG. 6. FIG. 7A shows the voltage waveform of the control signal S3. FIG. 7B shows the voltage waveform of the control signal S2. FIG. 7C shows the voltage waveform of the control signal S5. Signal waveforms of FIGS. 7A to 7H correspond to the signal waveforms of FIGS. 3E to 3I.

Note that, the voltage waveform of the control signal S1 becomes the inverse phase with respect to the control signal S3 shown in FIG. 7A. The voltage waveform of the control signal S4 becomes the inverse phase with respect to the control signal S2 shown in FIG. 7B. The voltage waveform of the control signal S6 becomes the inverse phase with respect to the control signal S5 shown in FIG. 7C.

In the initial state before the voltages of the nodes NA and NB are set, the control circuit 10B sets the control signals S1 and S4 at the voltage "VSS", sets the control signals S2 and S3 at the voltage "VDD", and turns off the transistors Qp2, Qp3, Qn2, and Qn3. Further, in this initial state, the first input signal IN1 is set at the voltage "Vin" of the high level, and the second input signal IN2 is set at the voltage "VSS" of the low level.

In the first period (t21 to t22), the control circuit 10B sets the control signal S1 at the voltage "VDD" and sets the control signal S3 at the voltage "VSS". Due to this, both of the n-type MOS transistor Qn3 and the p-type MOS transistor Qp3 turn on, the node NA is set at the voltage "VSS", and the node NB is set at the voltage "VDD". Due to this, both of the p-type MOS transistor Qp1 and the n-type MOS transistor Qn1 turn on. On the other hand, at this time, the control circuit 10B sets the control signal S5 at the voltage "VDD" and sets the control signal S6 at the voltage "VSS", therefore both of the p-type MOS transistor Qp5 and the n-type MOS transistor Qn5 turn off. For this reason, even when the p-type MOS transistor Qp1 and the n-type MOS transistor Qn1 simultaneously turn on, no penetration current flows.

In the second period (t22 to t23) after the node NA is set at the voltage "VSS" and the node NB is set at the voltage "VDD", the control circuit 10B returns the control signal S1 to the voltage "VSS", returns the control signal S3 to the voltage "VDD", sets the control signal S2 at the voltage "VSS", and sets the control signal S4 at the voltage "VDD" in place of this. Due to this, the p-type MOS transistor Qp2 turns on, the drain of the p-type MOS transistor Qp1 and the node NA are connected and, at the same time, the n-type MOS transistor Qn2 turns on, and the drain of the n-type MOS transistor Qn1 and the node NB are connected. At this time, since the p-type MOS transistor Qp1 is in the ON state, the voltage V_NA of the node NA rises toward the voltage "VDD". When this voltage V_NA reaches "VDD−Vthp", the p-type MOS transistor Qp1 turns off by itself. Further, the n-type MOS transistor Qn1 is in the ON state, therefore the voltage V_NB of the node NB falls toward the voltage "VSS". When this voltage V_NB reaches "VSS+Vthn", the n-type MOS transistor Qn1 turns off by itself. As a result, the voltage V_NA of the node NA is set at "VDD−Vthp", and the voltage V_NB of the node NB is set at "VSS+Vthn".

Note that, in this second period (t22 to t23), the control circuit 10B subsequently sets the control signal S5 at the voltage "VDD" and sets the control signal S6 at the voltage "VSS", therefore even when the state where the p-type MOS transistor Qp1 and the n-type MOS transistor Qn1 simultaneously turn on is exhibited, no penetration current flows.

The operation after the voltage V_NA of the node NA is set at "VDD−Vthp" and the voltage V_NB of the node NB is set at "VSS+Vthn" is the same as that of the level shift circuit shown in FIG. 2.

As explained above, in the level shift circuit according to the present embodiment as well, the same operation as that of the level shift circuit shown in FIG. 2 is realized, so effects same as those of this can be exhibited. Namely, the voltage of the node NA is set at "VDD−Vthp", and the voltage of the node NB is set at "VSS+Vthn", therefore a stable level shift operation can be carried out without influence due to variation of the threshold voltages of the transistors (Qp1, Qn1). Further, the voltages of the nodes NA and NB are set at the voltages at switching points of ON/OFF of the p-type MOS transistor Qp1 and the n-type MOS transistor Qn1, therefore a level shift operation can be performed even for a signal having a smaller amplitude than that of the threshold voltage of the transistor.

Further, according to the level shift circuit according to the present embodiment, in the period when the p-type MOS transistor Qp1 and the n-type MOS transistor Qn1 simultaneously turn on, by turning off the p-type MOS transistor Qp5 and the n-type MOS transistor Qn5, the generation of a penetration current can be reliably prevented.

Further, according to the level shift circuit according to the present embodiment, voltages of the nodes NA and NB can be set in parallel, therefore the period during which the output of the level shift signal O becomes invalid along with this voltage setting can be shortened.

Fifth Embodiment

Next, an explanation will be given of a fifth embodiment of the present invention.

Figure 8:
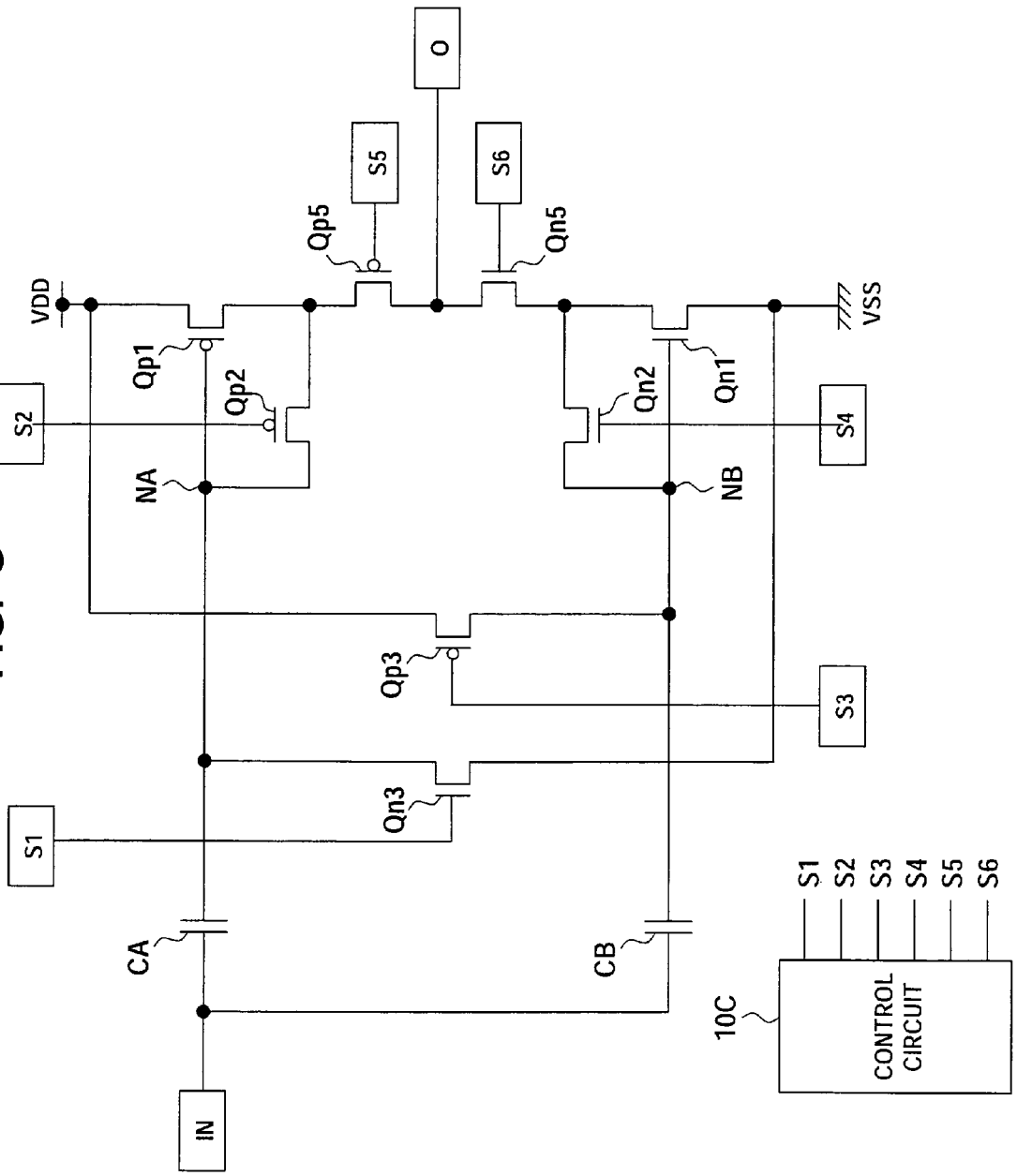
FIG. 8 is a diagram showing an example of the configuration of a level shift circuit according to a fifth embodiment.

FIG. 8 is a diagram showing an example of the configuration of a level shift circuit according to the fifth embodiment of the present invention. The same notations in FIG. 6 and FIG. 8 indicate the same components. The level shift circuit shown in FIG. 8 replaces the control circuit 10B in the level shift circuit shown in FIG. 6 by a control circuit 10C and further applies a common input signal to the capacitors CA and CB. The rest of the configuration is the same as that of the level shift circuit shown in FIG. 6.

The control circuit 10C generates control signals S1 to S6 having the following timings. Namely, the control signal S1 is set at the voltage "VDD" in the first period (times t31 to t32 in FIG. 9), and the control signal S1 is set at the voltage "VSS" in the other periods. In the second period (times t32 to t33 in FIG. 9) continuing after the first period, the control signal S2 is set at the voltage "VSS", and the control signal S2 is set at the voltage "VDD" in the other periods. In the third period (times t33 to t34 in FIG. 9) continuing after the second period, the control signal S3 is set at the voltage "VSS", and the control signal S3 is set at the voltage "VDD" in the other periods. In the fourth period (times t34 to t35 in FIG. 9) continuing after the third period, the control signal S4 is set at the voltage "VDD", and the control signal S4 is set at the voltage "VSS" in the other periods. The control signal S5 is set at the voltage "VDD" in the first period to the fourth period (times t31 to t35 of FIG. 9) and set at the voltage "VSS" in the other periods. The control signal S6 is set at the voltage "VSS" in the first period to the fourth period (times t31 to t35 of FIG. 9) and set at the voltage "VDD" in the other periods.

An explanation will be given of the operation of the level shift circuit shown in FIG. 8 having the above configuration with reference to FIG. 9.

Figure 9:
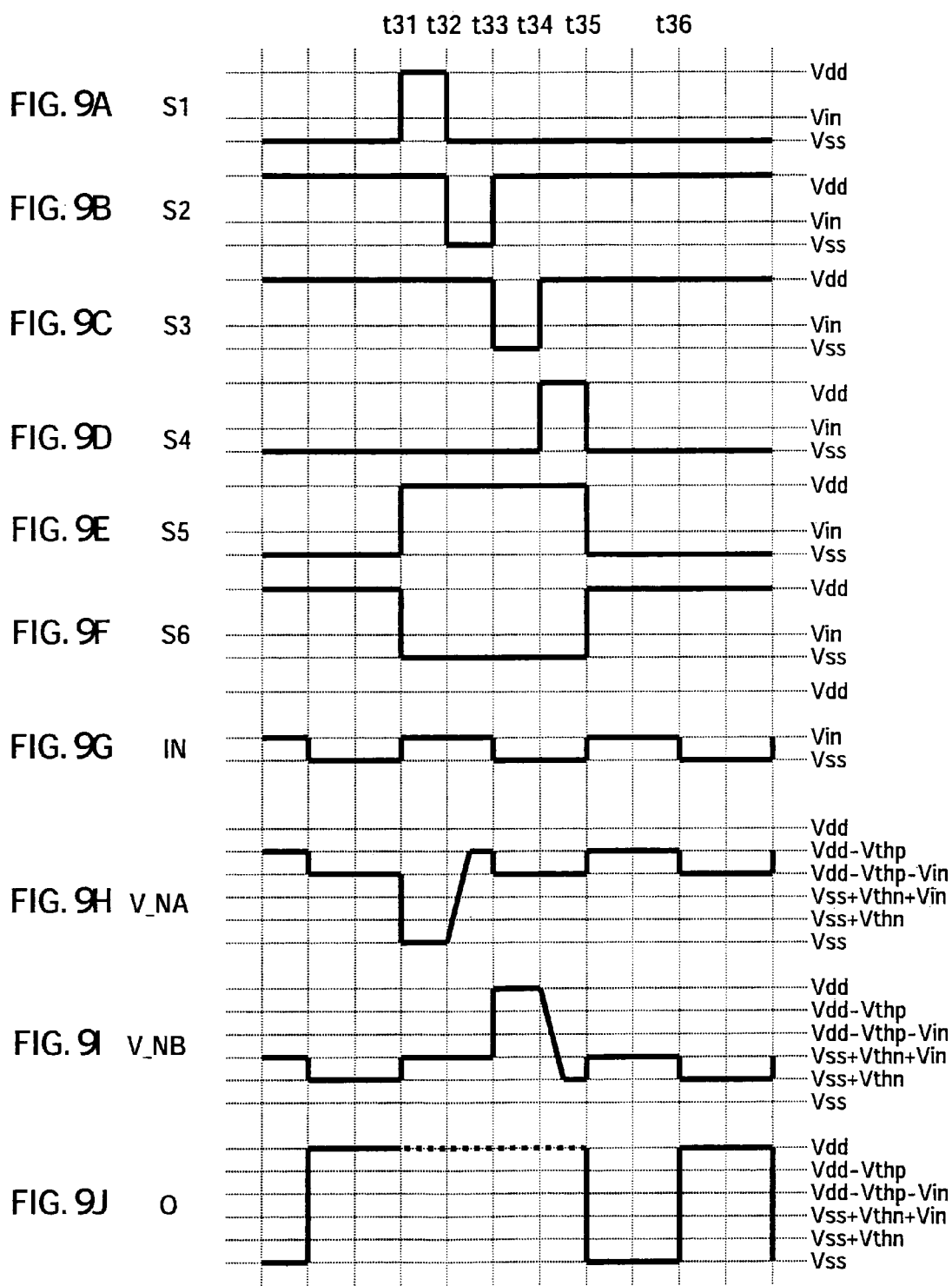
FIG. 9 is a diagram showing an example of signal waveforms of portions in the level shift circuit shown in FIG. 8.

FIG. 9 is a diagram showing an example of signal waveforms of portions in the level shift circuit shown in FIG. 8. Signal waveforms of FIGS. 9A to 9D and FIGS. 9H to 9J correspond to the signal waveforms of FIGS. 3A to 3D and 3G to 3I. FIG. 9E shows the voltage waveform of the control signal S5. FIG. 9F shows the voltage waveform of the control signal S6. FIG. 9G shows the voltage waveform of the input signal IN.

In the initial state before the voltages of the nodes NA and NB are set, the control circuit 10C sets the control signals S1 and S4 at the voltage "VSS" and sets the control signals S2 and S3 at the voltage "VDD". In this case, the transistors Qp2, Qp3, Qn2, and Qn3 are set at OFF. On the other hand, in this initial state, the input signal IN is in the state freely changing between the high level (Vin) and the low level (VSS).

In the first period (t31 to t32) during which the input signal IN becomes the high level (Vin), the control circuit 10C sets the control signal S1 at the voltage "VDD". Due to this, the n-type MOS transistor Qn3 turns on, the node NA is set at the voltage "VSS", and the p-type MOS transistor Qp1 turns on.

In the second period (t32 to t33) after the node NA is set at the voltage "VSS", the control circuit 10C returns the control signal S1 to the voltage "VSS" and boosts down the control signal S2 to the voltage "VSS". Due to this, the p-type MOS transistor Qp2 turns on, and the drain of the p-type MOS transistor Qp1 and the node NA are connected. At this time, the p-type MOS transistor Qp1 is in the ON state, therefore the voltage V_NA of the node NA rises toward the voltage "VDD". At the time when the voltage V_NA reaches "VDD−Vthp", the p-type MOS transistor Qp1 turns off by itself, and the voltage V_NA of the node NA is set at "VDD−Vthp".

After the p-type MOS transistor Qp1 turns off, in the third period (t33 to t34) during which the input signal IN becomes the low level (VSS), the control circuit 10C returns the control signal S2 to the voltage "VDD" and boosts down the control signal S3 to the voltage "VSS". Due to this, the p-type MOS transistor Qp3 turns on, the node NB is set at the voltage "VDD", and the n-type MOS transistor Qn1 turns on.

In the fourth period (t4 to t5) after the node NB is set at the voltage "VDD", the control circuit 10C returns the control signal S3 to the voltage "VDD" and raises the control signal S4 to the voltage "VDD". Due to this, the n-type MOS transistor Qn2 turns on, and the node NB and the drain of the n-type MOS transistor Qn1 are connected. At this time, the n-type MOS transistor Qn1 is in the ON state, so the voltage V_NB of the node NB falls toward the voltage "VSS". At the time when the voltage V_NB reaches "VSS+Vthn", the n-type MOS transistor Qn1 turns off by itself, and the voltage V_NB of the node NB is set at "VSS+Vthn".

Throughout the first period to fourth period (t31 to t35) explained above, the control circuit 10B sets the control signal S5 at the voltage "VDD" and sets the control signal S6 at the voltage "VSS". Due to this, the p-type MOS transistor Qp5 and the n-type MOS transistor Qn5 turn off, therefore even when the state where the p-type MOS transistor Qp1 and the n-type MOS transistor Qn1 simultaneously turn off is exhibited in this period, no penetration current flows.

The operation after the voltage V_NA of the node NA is set at "VDD−Vthp", and the voltage V_NB of the node NB is set at "VSS+Vthn" is the same as that of the level shift circuit shown in FIG. 2.

As explained above, in the level shift circuit according to the present embodiment as well, the same operation as that of the level shift circuit shown in FIG. 2 is realized, therefore effects the same as those by this can be exhibited. Namely, the voltage of the node NA is set at "VDD−Vthp", and the voltage of the node NB is set at "VSS+Vthn", therefore a stable level shift operation can be carried out without influence due to variation of threshold voltages of transistors (Qp1, Qn1). Further, voltages of the nodes NA and NB are set at voltages at switching points of ON/OFF of the p-type MOS transistor Qp1 and the n-type MOS transistor Qn1, therefore a level shift operation can be performed even for a signal having a smaller amplitude than that of the threshold voltage of the transistor.

Further, according to the level shift circuit according to the present embodiment, by turning off the p-type MOS transistor Qp5 and the n-type MOS transistor Qn5 in the period (t31 to t35) for setting the voltages of the nodes NA and NB, the generation of the penetration current can be reliably prevented.

Further, according to the level shift circuit according to the present embodiment, the voltage of the node NA (first period and second period) is set when the input signal IN is at the high level (Vin), and the voltage of the node NB (third period and fourth period) is set when the input signal IN is at the low level (VSS). Due to this, it is not necessary to simultaneously set two input signals (IN1, IN2) at different voltages as in the level shift circuit according to the second to fourth embodiments, therefore the circuit configuration can be simplified.

Sixth Embodiment

Next, an explanation will be given of a sixth embodiment of the present invention.

The level shift circuit according to the sixth embodiment has a similar configuration as that of for example the level shift circuit shown in FIG. 8. The difference of the two resides in the method of control of the p-type MOS transistor Qp5 and the n-type MOS transistor Qn6.

Figure 10:
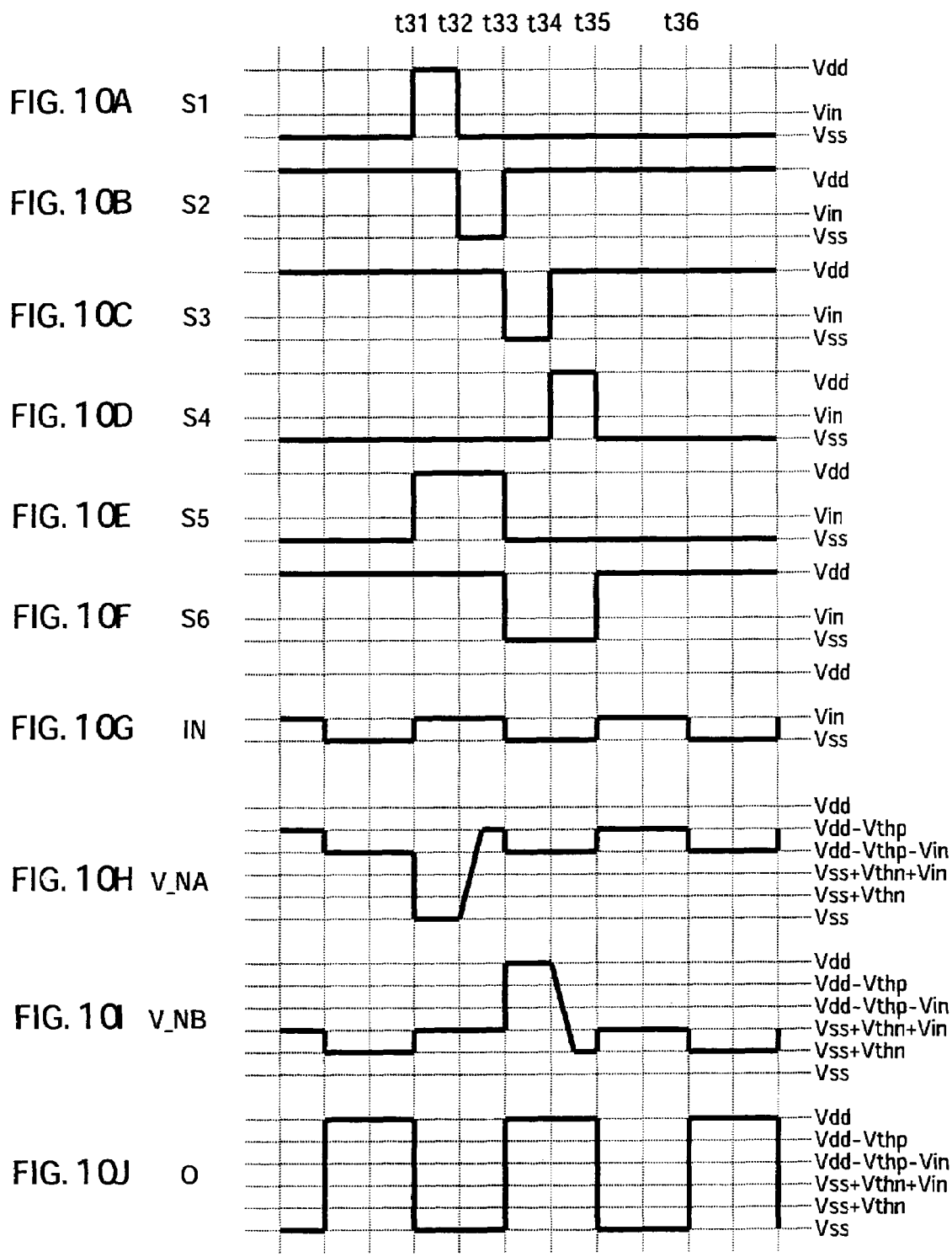
FIG. 10 is a diagram showing an example of signal waveforms of portions in a level shift circuit according to a sixth embodiment.

FIG. 10 is a diagram showing an example of signal waveforms of portions in the level shift circuit according to the sixth embodiment. Signal waveforms of FIGS. 10(A to 10J correspond to signal waveforms of FIGS. 9A to 9J.

In the level shift circuit according to the present embodiment, as shown in FIG. 10E, in the first period and second period (t31 to t33) during which the input signal IN becomes the high level (Vin), the control signals S5 and S6 are set at the voltage "VDD". Due to this, the p-type MOS transistor Qp5 turns off, and the n-type MOS transistor Qn5 turns on, therefore the output terminal of the level shift signal O is connected to the power supply line VSS via the n-type MOS transistor Qn1.

Here, as shown in FIG. 10I, when assuming that the voltage V_NB of the node NB rises up to about "VSS+Vthn+Vin" in the first period and second period (t31 to t33), the n-type MOS transistor Qn1 turns on in this period, therefore the level shift signal O becomes the voltage "VSS".

Further, in the level shift circuit according to the present embodiment, as shown in FIG. 10F, in the third period and fourth period (t33 to t35) during which the input signal IN becomes the low level (VSS), the control signals S5 and S6 are set at the voltage "VSS". Due to this, the p-type MOS transistor Qp5 turns on, and the n-type MOS transistor Qn5 turns off, therefore the output terminal of the level shift signal O is connected via the p-type MOS transistor Qp1 to the power supply line VDD.

Here, as shown in FIG. 10H, in this third period and fourth period (t33 to t35), when assuming that the voltage V_NB of the node NA falls to about "VDD−Vthp−Vin", the p-type MOS transistor Qp1 turns on in this period, therefore the level shift signal O becomes the voltage "VDD".

In this way, in the level shift circuit according to the present embodiment, by setting the voltage of the node NA and turning off the p-type MOS transistor Qp5 and turning on the n-type MOS transistor Qn5 in the period during which the input signal IN becomes the high level (Vin), it is possible to set the voltage of the node NA and output the level shift signal O of the voltage "VSS" in response to the input signal IN parallel with this. In the same way, by setting the voltage of the node NB and turning on the p-type MOS transistor Qp5 and turning off the n-type MOS transistor Qn5 in the period during which the input signal IN becomes the low level (VSS), it is possible to set the voltage of the node NB and output the level shift signal O of the voltage "VDD" in response to the input signal IN parallel with this. That is, according to the level shift circuit according to the present embodiment, the level shift signal O can be output parallel to the setting of the voltages of the nodes NA and NB.

Seventh Embodiment

Next, an explanation will be given of a seventh embodiment of the present invention.

The level shift circuit according to the seventh embodiment is different from the level shift circuits according to the above embodiments (second to sixth embodiments) in the method of control of the p-type MOS transistor Qp2 and the n-type MOS transistor Qn2. Namely, in the level shift circuit according to the seventh embodiment, in the period (first period) during which the voltage "VSS" is supplied to the node NA, the p-type MOS transistor Qp2 turns on. Further, in the period (third period) during which the voltage "VDD" is supplied to the node NB, the n-type MOS transistor Qn2 turns on. Due to this, the drain voltage of the p-type MOS transistor Qp1 is initialized to "VSS" in the first period and, at the same time, the drain voltage of the n-type MOS transistor Qn1 is initialized to "VDD" in the third period.

Here, as an example, assume that the configuration of the level shift circuit according to the present embodiment is the same as that of the level shift circuit shown in FIG. 8. Further, assume that the method of control of each transistor is the same as that of the level shift circuit according to the sixth embodiment except the p-type MOS transistor Qp2 and the n-type MOS transistor Qn2.

Figure 11:
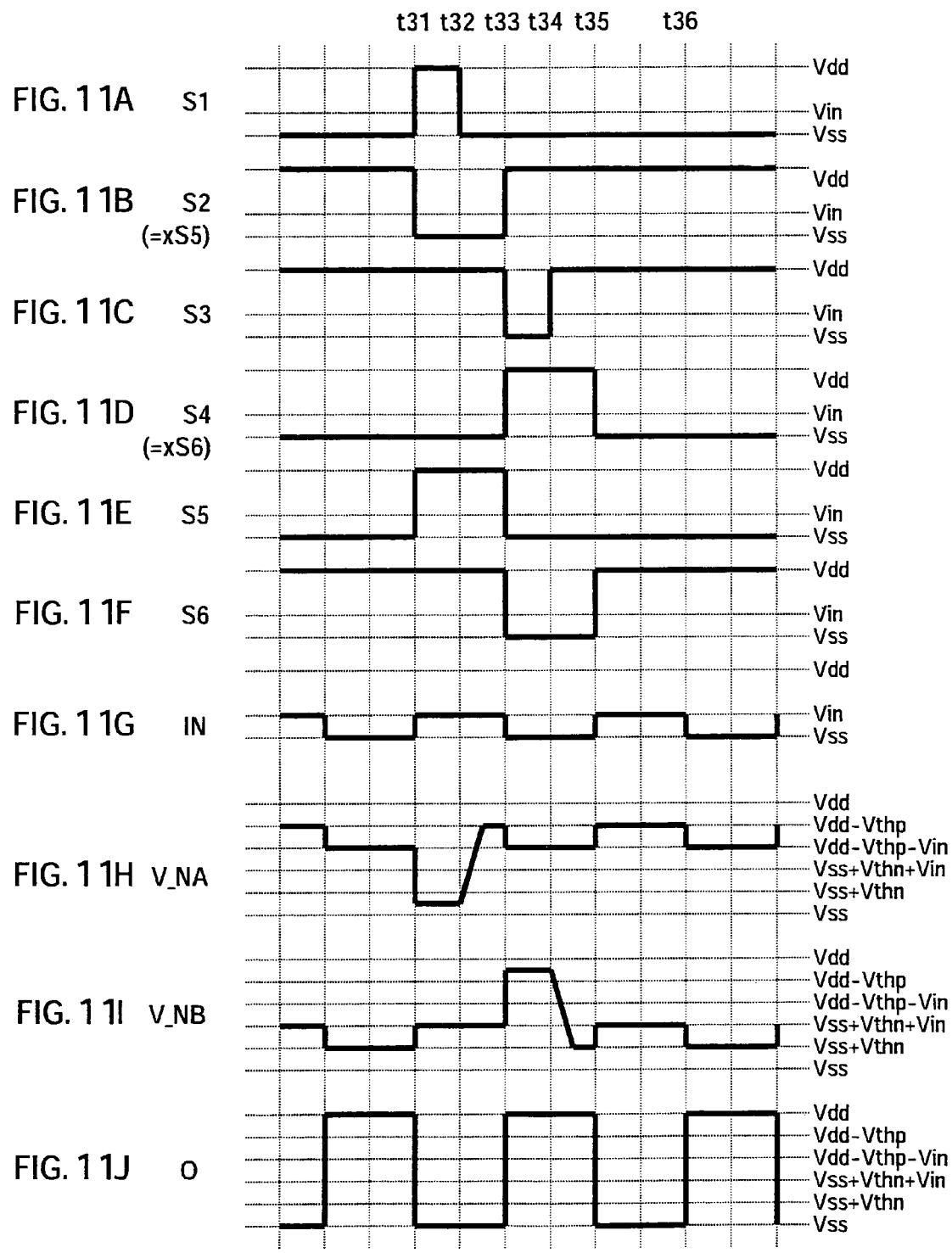
FIG. 11 is a diagram showing an example of signal waveforms of portions in a level shift circuit according to a seventh embodiment.

FIG. 11 is a diagram showing an example of signal waveforms of portions in the level shift circuit according to the seventh embodiment. Signal waveforms of FIGS. 11A to 11J correspond to signal waveforms of FIGS. 9A to 9J.

In the level shift circuit according to the present embodiment, as shown in FIG. 11B, in the first period (t31 to t32) during which the p-type MOS transistor Qp1 turns on, by setting the control signal S2 at the low level (VSS), the p-type MOS transistor Qp2 turns on. When the p-type MOS transistor Qp2 turns on, the drain voltage of the p-type MOS transistor Qp1 is initialized to "VSS".

The p-type MOS transistor Qp5 is OFF in the first period (t31 to t32), therefore when the p-type MOS transistor Qp2 turns off at this time, the drain of the p-type MOS transistor Qp1 becomes the floating state. Contrary to this, in the level shift circuit according to the present embodiment, the p-type MOS transistor Qp2 turns on in the first period, therefore the drain voltage of the p-type MOS transistor Qp1 can be stabilized.

When the node NA is set at "VSS" in the first period (t31 to t32), the p-type MOS transistor Qp1 turns off next in the second period (t32 to t33). At this time, the p-type MOS transistor Qp2 is ON as it is, therefore the voltage of the node NA rises from "VSS" up to "VSS+Vthn".

Next, in the third period (t33 to t34) during which the n-type MOS transistor Qn1 turns on, by setting the control signal S4 at the high level (VDD), the n-type MOS transistor Qn2 turns on. When the n-type MOS transistor Qn2 turns on, the drain voltage of the n-type MOS transistor Qn1 is initialized to "VDD". The n-type MOS transistor Qn5 is OFF in the third period (t33 to t34), therefore, when the n-type MOS transistor Qn2 turns off at this time, the drain of the n-type MOS transistor Qn1 becomes the floating state. Contrary to this, in the level shift circuit according to the present embodiment, the n-type MOS transistor Qn2 turns on in the third period, therefore the drain voltage of the n-type MOS transistor Qn1 can be stabilized.

When the node NB is set at "VDD" in the third period (t33 to t34), the n-type MOS transistor Qn1 turns off next in the fourth period (t34 to t35). At this time, the n-type MOS transistor Qn2 is ON as it is, therefore the voltage of the node NB falls from "VDD" to "VDD−Vthn".

In this way, in the level shift circuit according to the present embodiment, by turning on the p-type MOS transistor Qp2 in the first period and the second period for setting the voltage of the node NA, the drain voltage of the p-type MOS transistor Qp1 can be stabilized to "VSS". In the same way, by turning on the n-type MOS transistor Qn2 in the third period and the fourth period for setting the voltage of the node NB, the drain voltage of the n-type MOS transistor Qn1 can be stabilized to "VDD".

Further, according to the level shift circuit according to the present embodiment, by the logical inversion of the control signal S5 (FIG. 11E) of the p-type MOS transistor Qp5, the control signal S2 of the p-type MOS transistor Qp2 (FIG. 11B) can be generated and, at the same time, by the logical inversion of the control signal S6 of the n-type MOS transistor Qn5 (FIG. 11F), the control signal S4 of the n-type MOS transistor Qn2 (FIG. 11D) can be generated. For this reason, the configuration of the control circuit can be simplified. If the p-type MOS transistor Qp2 is replaced by an n-type MOS transistor and the n-type MOS transistor Qn2 is replaced by a p-type MOS transistor Q, the control signals S2 and S5 can be made common and the control signals S4 and S6 can be made common, therefore the control circuit can be further simplified.

Eighth Embodiment

Next, an explanation will be given of an eighth embodiment of the present invention.

In the level shift circuit according to the present embodiment, a circuit obtained by replacing the p-type MOS transistor Qp2 by an n-type MOS transistor and replacing the n-type MOS transistor Qn2 by a p-type MOS transistor in the level shift circuits according to above embodiments (second to sixth embodiments) and driving these transistors by a bootstrap method is provided.

Figure 12:
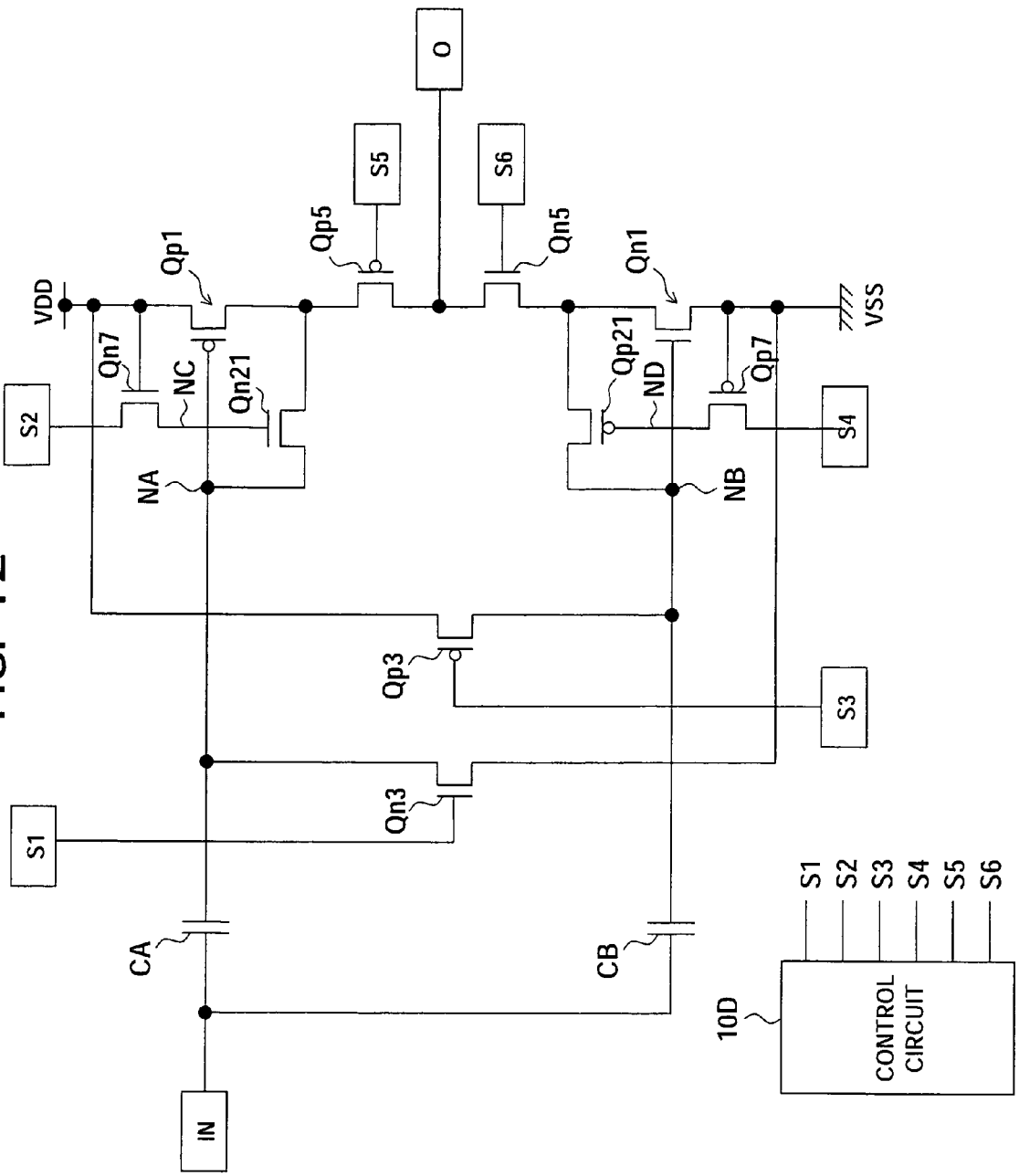
FIG. 12 is a diagram showing an example of the configuration of a level shift circuit according to an eighth embodiment.

FIG. 12 is a diagram showing an example of the configuration of the level shift circuit according to the present embodiment. In the level shift circuit according to the present embodiment, as shown in FIG. 12, the p-type MOS transistor Qp2 in the level shift circuit shown in FIG. 8 is replaced by an n-type MOS transistor Qn21, the n-type MOS transistor Qn2 is replaced by a p-type MOS transistor Qp21, and further an n-type MOS transistor Qn7 and a p-type MOS transistor Qp7 are provided as a bootstrap type drive circuit. The n-type MOS transistor Qn21 is an embodiment of the first switch element of the present invention. The n-type MOS transistor Qn7 is an embodiment of the second switch element of the present invention. The p-type MOS transistor Qp21 is an embodiment of the third switch element of the present invention. The p-type MOS transistor Qp7 is an embodiment of the fourth switch element of the present invention.

The n-type MOS transistor Qn7 is connected at its gate to the power supply line VDD, connected at its source to the gate of the n-type MOS transistor Qn21, and has the drain receiving as input the control signal S2. The p-type MOS transistor Qp7 is connected at its gate to the power supply line VDD, connected at its source to the gate of the p-type MOS transistor Qp21, and has the drain receiving as input the control signal S4.

The timing relationships of the control signals (S1 to S6) in the level shift circuit shown in FIG. 12 are the same as those of the level shift circuit according to the sixth embodiment. Note that the logical values of both control signals S1 and S2 are inverted (see FIG. 10B and FIG. 13B and FIG. 10D and FIG. 13D)

Figure 13:
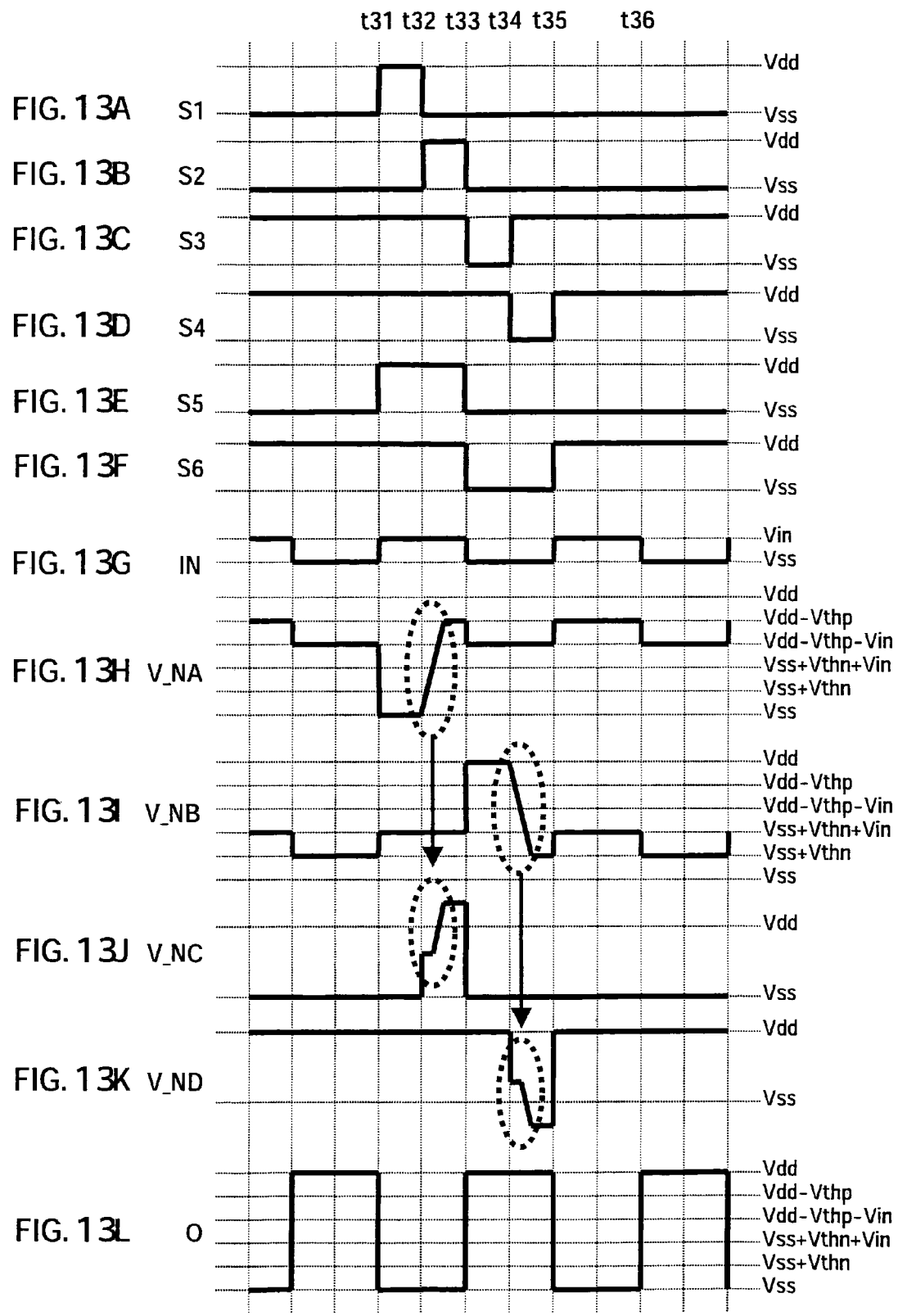
FIG. 13 is a diagram showing an example of signal waveforms of portions in the level shift circuit according to the eighth embodiment.

FIG. 13 is a diagram showing an example of signal waveforms of portions in the level shift circuit according to the eighth embodiment. Signal waveforms of FIGS. 13A to 13I and 13L correspond to signal waveforms of FIGS. 10A to 10I and 10J. The signal waveform of FIG. 13J shows a voltage "V_NC" of a node NC to which the gate of the n-type MOS transistor Qn21 and the source of the n-type MOS transistor Qn7 are connected. The signal waveform of FIG. 13K shows a voltage "V_ND" of a node ND to which the gate of the p-type MOS transistor Qp21 and the source of the p-type MOS transistor Qp7 are connected.

Note that, in the following explanation, "Vthn(Qn7)" and "Vthn(Qn21)" indicate threshold voltages of n-type MOS transistors Qn7 and Qn21. "Vthp(Qp7)" and "Vthp(Qp21)" indicate threshold voltages of p-type MOS transistors Qp7 and Qp21. "Vthp(Qp1)" and "Vthn(Qn1)" indicate threshold voltages of the p-type MOS transistors Qp1 and the n-type MOS transistor Qn1.

In the first period (t31 to t32), the control signal S1 is set at the high level (VDD), the control signal S2 is set at the low level (VSS), and the n-type MOS transistors Qn3 and Qn7 turn on. When the n-type MOS transistor Qn3 turns on, the voltage V_NA of the node NA (FIG. 13H) is set at the voltage "VSS", so the p-type MOS transistor Qp1 turns on. Further, when the n-type MOS transistor Qn3 turns on, the control signal S2 of the low level (VSS) is input to the gate of the n-type MOS transistor Qn21, therefore the n-type MOS transistor Qn21 turns off.

Next, in the second period (t32 to t33), the control signal S1 is set at the low level (VSS), and the control signal S2 is set at the high level (VDD), and the n-type MOS transistor Qn3 turns off. When the control signal S2 is set at the high level (VDD), the voltage "VDD" is supplied to the node NC via the n-type MOS transistor Qn7, therefore the voltage V_NC of the node NC is set "VDD−Vthn (Qn7)". Due to this, the n-type MOS transistor Qn21 turns on. When the n-type MOS transistor Qn21 turns on, the voltage "VDD" is supplied to the node NA via the p-type MOS transistor Qp1 and the n-type MOS transistor Qn21, therefore the voltage V_NA of the node NA rises along with the elapse of time (FIG. 13H).

When the voltage V_NA of the node NA reaches "VDD−Vthn (Qn7)−Vthn (Qn21)", the voltage V_NC of the node NC reaches "VDD−Vthn (Qn7)", and the n-type MOS transistor Qn7 switches from ON to OFF. When the voltage of the node NA further rises, due to the charge stored in the parasitic capacitance element between the gate and drain of the n-type MOS transistor Qn21, the voltage V_NC of the node NC is boosted up to the positive side, therefore the voltage V_NC rises together with the voltage V_NA (FIG. 13J). When the voltage V_NA of the node NA reaches "VDD−Vthp (Qp1)", the p-type MOS transistor Qp1 switches from ON to OFF, and the voltage rise of the node NA stops. Due to this, the voltage of the node NA is set at "VDD−Vthp (Qp1)".

In the third period (t33 to t34) next, the control signal S3 is set at the low level (VSS), the control signal S4 is set at the high level (VDD), and the p-type MOS transistors Qp3 and Qp7 turn on. When the p-type MOS transistor Qp3 turns on, the voltage V_NB (FIG. 13I) of the node NB is set at the voltage "VDD", therefore the n-type MOS transistor Qn1 turns on. Further, when the p-type MOS transistor Qp7 turns on, the control signal S4 of the high level (VDD) is input to the gate of the p-type MOS transistor Qp21, therefore the p-type MOS transistor Qp21 turns off.

In the fourth period (t34 to t35) next, the control signal S3 is set at the high level (VDD), the control signal S4 is set at the low level (VSS), and the p-type MOS transistor Qp3 turns off. When the control signal S4 is set at the low level (VSS), the voltage "VSS" is supplied to the node ND via the p-type MOS transistor Qp7, therefore the voltage V_ND of the node ND is set at "VDD+Vthp (Qp7)". Due to this, the p-type MOS transistor Qp21 turns on. When the p-type MOS transistor Qp21 turns on, the voltage "VSS" is supplied to the node NB via the n-type MOS transistor Qn1 and the p-type MOS transistor Qp21, therefore the voltage V_NB of the node NB falls along with the elapse of time (FIG. 13I).

When the voltage V_NB of the node NB reaches "VSS+Vthp (Qp7)+Vthp (Qp21)", the voltage V_ND of the node ND reaches "VDD−Vthp (Qp7)", and the p-type MOS transistor Qp7 switches from ON to OFF. When the voltage of the node NB further falls from here, due to the charge stored in the parasitic capacitance element between the gate and drain of the p-type MOS transistor Qp21, the voltage V_NC of the node ND is boosted down, therefore the voltage V_ND falls together with the voltage V_NB (FIG. 13J). When the voltage V_NB of the node NB reaches "VSS+Vthn (Qn1)", the n-type MOS transistor Qn1 switches from ON to OFF, and the fall of voltage of the node NB stops. Due to this, the voltage of the node NB is set at "VDD+Vthn (Qn1)".

As explained above, according to the level shift circuit according to the present embodiment, use can be made of a bootstrap type switch formed by the n-type MOS transistors Qn21 and Qn7 as the switch for connecting the drain and gate of the p-type MOS transistor Qp1, therefore, even in the case where the threshold value Vthp (Qp1) of the p-type MOS transistor Qp is relatively small, the voltage of the node NA can be reliably raised up to "VDD−Vthp (Qp1)". Further, use is made of the bootstrap type switch formed by the p-type MOS transistors Qp21 and Qp7 for the switch for connecting the drain and gate of the n-type MOS transistor Qn1, therefore even when the threshold value Vthn (Qn1) of the n-type MOS transistor Qn is relatively small, the voltage of the node NB can be reliably lowered to "VSS+Vthn (Qn1)".

Note that, in the above embodiment, the bootstrap operation is realized by utilizing the parasitic capacitance element between the gate and drain (or source) of the n-type MOS transistor Qn21 and the p-type MOS transistor Qp21, but where only a parasitic capacitance element is insufficient, a static capacitance value necessary for the bootstrap operation may be supplemented as well by connecting a capacitor between the gate and drain (or source).

Ninth Embodiment

Next, an explanation will be given of a ninth embodiment of the present invention.

In the level shift circuit according to the present embodiment, a circuit inputting a common signal to the capacitors CA and CB is provided in the level shift circuit according to the above embodiments (second to sixth embodiments).

Figure 14:
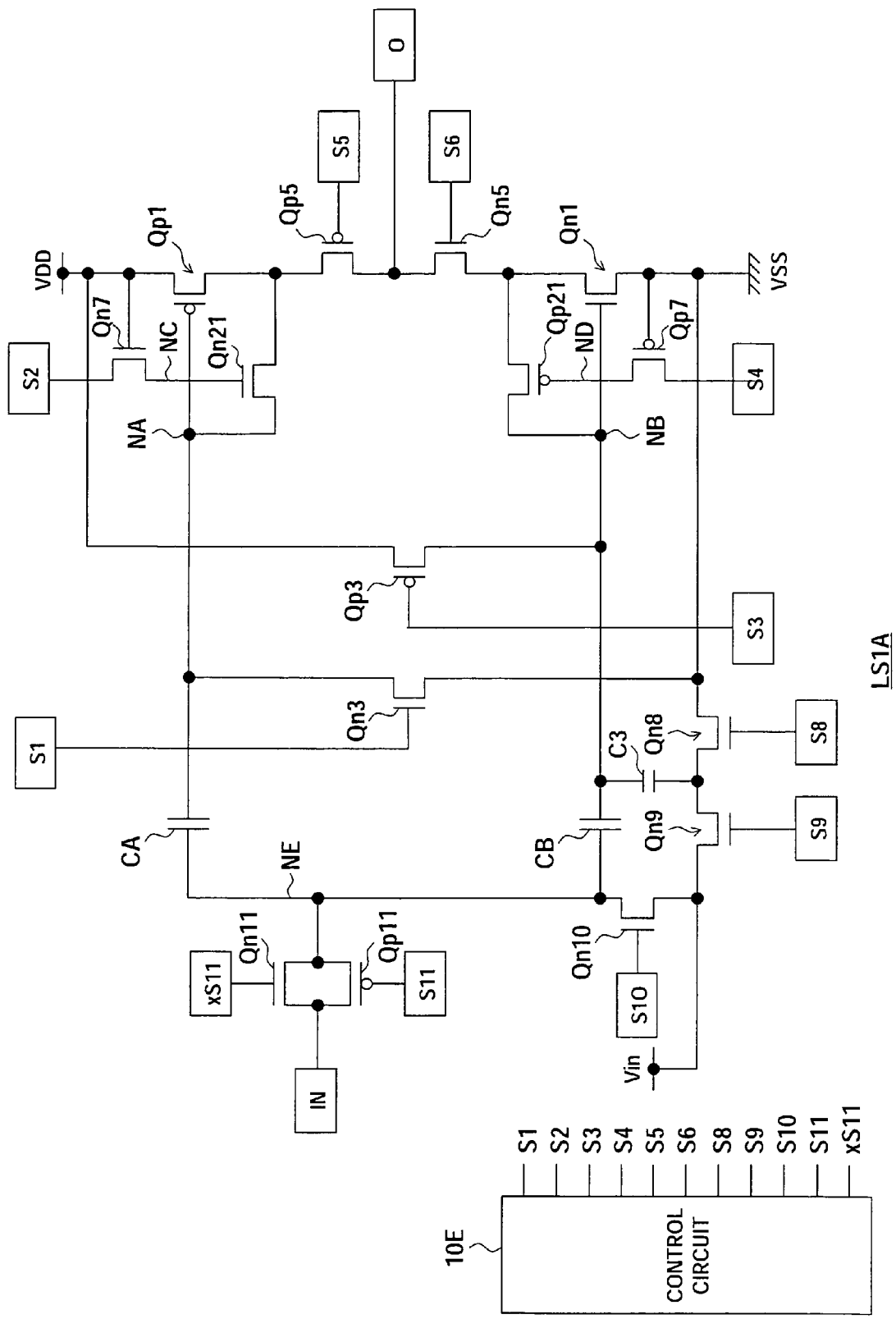
FIG. 14 is a diagram showing a first example of the configuration of a level shift circuit according to a ninth embodiment.

FIG. 14 is a diagram showing a first example of the configuration of the level shift circuit according to the present embodiment. A level shift circuit LS1A shown in FIG. 14 is obtained by replacing the control circuit 10C of the level shift circuit shown in FIG. 12 by a control circuit 10E and further providing n-type MOS transistors Qn8 to Qn11, a p-type MOS transistor Qp11, and a capacitor C3. The rest of the configuration is the same as that of the level shift circuit shown in FIG. 12.

The circuit configured by the p-type MOS transistor Qp11 and the n-type MOS transistor Qn11 is an embodiment of the first input circuit of the present invention. The n-type MOS transistor Qn10 is an embodiment of the second input circuit of the present invention. The capacitor C3 is an embodiment of the third capacitor of the present invention. The circuit configured by the n-type MOS transistors Qn8 and Qn9 is an embodiment of the third voltage supply circuit of the present invention.

One terminal (terminal on side not connected to the node NA) of the capacitor CA and one terminal (terminal on side not connected to the node NB) of the capacitor CB are commonly connected at the node NE.

The n-type MOS transistor Qn8 is connected at its source to the power supply line VSS, connected at its drain to the source of the n-type MOS transistor Qn9, and has a gate receiving as input the control signal S8. The n-type MOS transistor Qn9 receives as input the voltage "Vin" at its drain and receives as input the control signal S9 at its gate. The n-type MOS transistor Qn10 is connected at its source to the node NE, receives as input the voltage "Vin" in its drain, and receives as input the control signal S10 at its gate.

The capacitor C3 is connected at one terminal to the node NB and connected at the other terminal to the drain of the n-type MOS transistor Qn8 and the source of the n-type MOS transistor Qn9.

The p-type MOS transistor Qp11 and the n-type MOS transistor Qn11 are connected in parallel and configure a transfer gate. The input signal IN is input to one terminal of this transfer gate, and the other terminal is connected to the node NE. The control signal S11 is input to the gate of the p-type MOS transistor Qp11, and a control signal xS11 as the logic inverted signal thereof is input to the gate of the n-type MOS transistor Qn11.

The control circuit 10E generates control signals S1 to S11 and xS11 having the following timings. Namely, in the first period (times t41 to t42 of FIG. 15), the control signal S1 is set at the voltage "VDD", and the control signal S3 is set at the voltage "VSS", and in the other periods, the control signal S1 is set at the voltage "VSS", and the control signal S3 is set at the voltage "VDD". In the first period, the operation of initializing the node NA to "VDD" and the operation of initializing the voltage of the node NB to "VSS" are executed.

The control circuit 10E sets the control signal S2 at the voltage "VDD" and sets the control signal S4 at the voltage "VSS" in the second period (times t42 to t43 in FIG. 15) continuing after the first period and sets the control signal S2 at the voltage "VSS" and sets the control signal S4 at the voltage "VDD" in the other periods. In the second period, the operation of raising the voltage of the node NA up to the threshold value of the p-type MOS transistor Qp1 and the operation of lowering the voltage of the node NB to the threshold value of the n-type MOS transistor Qn1 are executed.

The period (times t43 to t44 in FIG. 15) continuing after the second period will be called the sixth period in the following description. The control circuit 10E sets the control signal S9 at the voltage "VDD" in this sixth period and sets the control signal S9 at the voltage "VSS" in the other periods. In the sixth period, the voltage of the node NB is set at "VSS+Vthn (Qn1)+Vin", and the n-type MOS transistor Qn1 turns on.

Further, the control circuit 10E sets the control signal S5 at the voltage "VDD", sets the control signal S6 at the voltage "VSS", and sets the control signal S8 at the voltage "VDD" in the first period and second period (t41 to t43) and sets the control signal S5 at the voltage "VSS", sets the control signal S6 at the voltage "VDD", and sets the control signal S8 at the voltage "VSS" in the other periods. In the first period and the second period, the p-type MOS transistor Qp5 and the n-type MOS transistor Qn5 turn off, and the output terminal O becomes the floating state. Further, the threshold value "Vthn (Qn1)" of the n-type MOS transistor Qn1 is charged in the capacitor C3.

Further, the control circuit 10E sets the control signal S10 at the voltage "VDD", sets the control signal S11 at the voltage "VDD", and sets the control signal xS11 at the voltage "VSS" in the first, second, and sixth periods (t41 to t44) and sets the control signal S10 at the voltage "VSS", sets the control signal S11 at the voltage "VSS", and sets the control signal xS11 at the voltage "VDD" in the other periods. In the first, second, and sixth periods, the transfer gate (Qp11, Qn11) turns off, and the voltage "Vin" is input to the node NE.

An explanation will be given of the operation of the level shift circuit LS1A shown in FIG. 14 having the above configuration with reference to FIG. 15.

Figure 15:
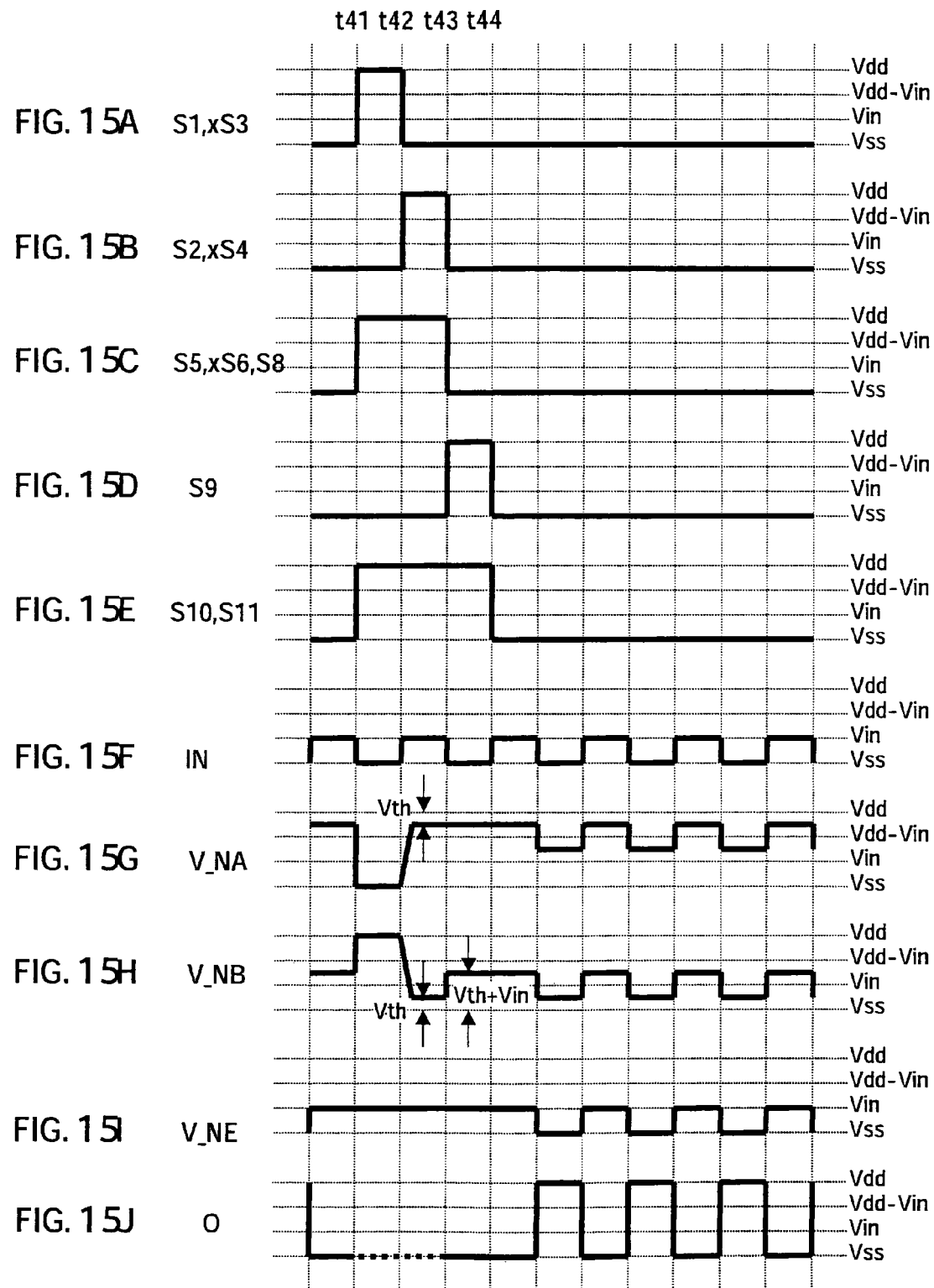
FIG. 15 is a diagram showing an example of signal waveforms of portions in the level shift circuit shown in FIG. 14.

FIG. 15 is a diagram showing an example of signal waveforms of portions in the level shift circuit LS1A shown in FIG. 14. FIG. 15A shows the voltage waveform of the control signal S1. The voltage waveform of the control signal S3 corresponds to the voltage waveform of this control signal S1 inverted in logic. FIG. 15B shows the voltage waveform of the control signal S2. The voltage waveform of the control signal S4 corresponds to the voltage waveform of this control signal S2 inverted in logic. FIG. 15C shows voltage waveforms of control signals S5 and S8. The voltage waveform of the control signal S6 corresponds to the voltage waveforms of these control signals S5 and S8 inverted in logic. FIG. 15D shows the voltage waveform of the control signal S9. FIG. 15E shows voltage waveforms of the control signals S10 and S11. FIG. 15F shows the voltage waveform of the input signal IN. FIG. 15G shows the waveform of the voltage V_NA of the node NA. FIG. 15H shows the waveform of the voltage V_NB of the node NB. FIG. 15I shows the waveform of the voltage V_NE of the node NE. FIG. 15J shows the voltage waveform of the output signal O.

In the first period (t41 to t42), the control circuit 10E sets the control signal S1 at the voltage "VDD", sets the control signal S2 at the voltage "VSS", sets the control signal S3 at the voltage "VSS", and sets the control signal S4 at the voltage "VDD". Due to this, the n-type MOS transistor Qn3 turns on, the n-type MOS transistor Qn21 turns off, the p-type MOS transistor Qp3 turns on, and the p-type MOS transistor Qp21 turns off, therefore the node NA is initialized to the voltage "VSS", and the node NB is initialized to the voltage "VDD".

Then, in the second period (t42 to t43), the control circuit 10E sets the control signal S1 at the voltage "VSS", sets the control signal S2 at the voltage "VDD", sets the control signal S3 at the voltage "VDD", and sets the control signal S4 at the voltage "VSS". Due to this, the n-type MOS transistor Qn3 turns off, the n-type MOS transistor Qn21 turns on, the p-type MOS transistor Qp3 turns off, and the p-type MOS transistor Qp21 turns on, therefore the voltage V_NA of the node NA is set at "VDD−Vthp (Qp1)", and the voltage V_NB of the node NB is set at "VSS+Vthn (Qn1)".

In the first period and second period (t41 to t43), the control circuit 10E sets the control signal S5 at the voltage "VDD" and sets the control signal S6 at the voltage "VSS". Due to this, both of the p-type MOS transistor Qp5 and the n-type MOS transistor Qn5 turn off, and a penetration current of the p-type MOS transistor Qp1 and the n-type MOS transistor Qn1 is prevented. Further, in this first period and second period, the control circuit 10E sets the control signal S8 at the voltage "VDD". Due to this, the n-type MOS transistor Qn8 turns on, and the voltage "Vthn (Qn1)" is charged in the capacitor C3.

Next, in the sixth period (t43 to t44), the control circuit 10E sets the control signals S1, S2, and S5 at the voltage "VSS" and sets the control signals S3, S4, and S6 at the voltage "VDD". Due to this, all of the n-type MOS transistors Qn3 and Qn21 and the p-type MOS transistors Qp3 and Qp21 turn off. Further, in the sixth period, the control circuit 10E sets the control signal S8 at the voltage "VSS" and sets the control signal S9 at the voltage "VDD". Due to this, the n-type MOS transistor Qn8 turns off, the n-type MOS transistor Qn9 turns on, and the voltage of one terminal (terminal on side not connected to the node NB) of the capacitor C3 rises from "VSS" to "VSS+Vin". Here, when the capacitance value of the capacitor C3 is sufficiently large in comparison with the capacitor CB (for example 3 times or more), the voltage V_NB of the node NB rises by exactly the difference (Vin) between "VSS" and "VSS+Vin". Namely, the voltage of the node N_NB shifts to the positive side from "VSS+Vthn (Qn1)" to "VSS+Vthn (Qn1)+Vin". Due to this, the n-type MOS transistor Qn1 switches from OFF to ON.

In the first, second, and sixth periods (t41 to t44) explained above, the control circuit 10E sets the control signal S10 at the voltage "VDD". Due to this, the n-type MOS transistor Qn10 turns on in the first, second, and sixth periods, and the voltage "Vin" is input to the node NE.

After the sixth period (t43 to t44), the control circuit 10E sets control signals S9, S10, and S11 at the voltage "VSS" and sets the control signal xS11 at the voltage "VDD". Due to this, the n-type MOS transistor Qn10 turns off, the transfer gate (Qp11, Qn11) turns on, and the input signal IN is input to the node NE. The input signal IN is the signal alternately repeating the voltage "Vin" and the voltage "VSS".

When the input signal IN is the voltage "Vin", the voltages of the nodes NA and NB exhibit the same state as that in the sixth period, therefore, the p-type MOS transistor Qp1 turns off, and the n-type MOS transistor Qn1 turns on. Due to this, the output signal O becomes the voltage "VSS". On the other hand, when the input signal IN is "VSS", the voltages of the nodes NA and NB shift to the negative side by exactly the voltage "Vin". Namely, the voltage of the node NA shifts from "VDD−Vthp (Qp1)" to "VDD−Vthp (Qp1)−Vin", and the voltage of the node NB shifts from "VSS+Vthn (Qn1)+Vin" to "VSS+Vthn (Qn1)". For this reason, the p-type MOS transistor Qp1 turns on, the n-type MOS transistor Qn1 turns off, and the output signal O becomes the voltage "VDD".

As explained above, according to the level shift circuit LS1A shown in FIG. 14, in the output period (for example after time t44 of FIG. 15) of the level shift output signal O, the input signal IN is input to the node NE, and in the period (t41 to t44) for setting the voltages of the nodes NA and NB, the predetermined voltage included within the voltage range from "VSS" to "Vin" corresponding to the amplitude of the input signal IN is input to the node NE. Due to this, without inputting the input signal IN to the node NE, voltages of the nodes NA and NB can be set. Namely, voltages of the nodes NA and NB can be set irrespective of the timing of the input signal IN. In FIG. 15, the first period (t41 to t42), the second period (t42 to t43), and the sixth period (t43 to t44) are matched with the timing of the input signal IN, but in the level shift circuit according to the present embodiment, it is possible to set this period to any duration not depending upon the timing of the input signal IN. In this way, when it becomes possible to initialize voltages of the nodes NA and NB irrespective of the timing of the input signal IN, it becomes possible to directly use a global signal (for example system clock signal) in the circuit system as the input signal IN, therefore it becomes unnecessary to generate a special clock signal, and the circuit configuration can be simplified.

Next, an explanation will be given of a second example of the configuration of the level shift circuit according to the present embodiment with reference to FIG. 16.

Figure 16:
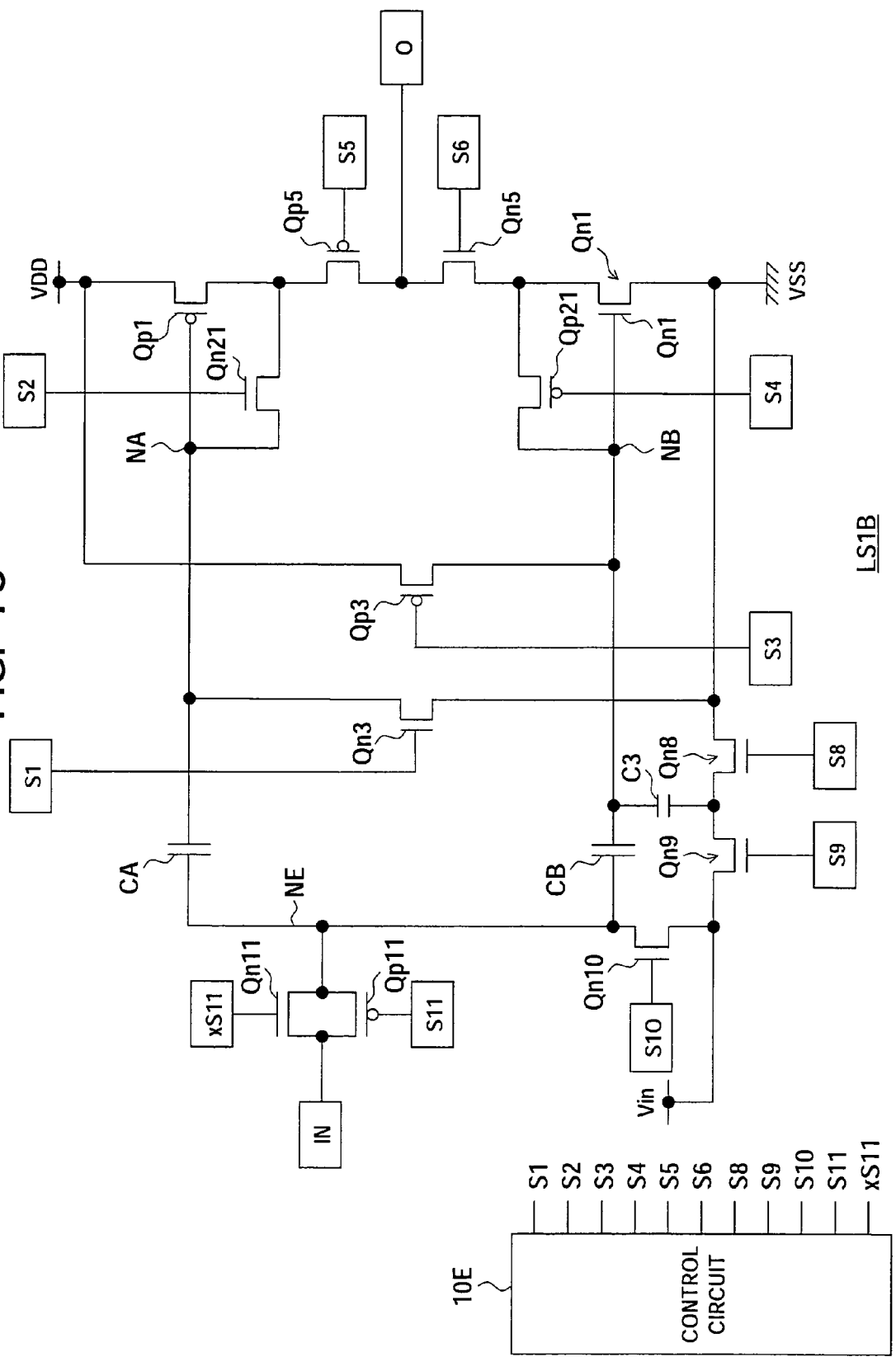
FIG. 16 is a diagram showing a second example of the configuration of the level shift circuit according to the ninth embodiment.

A level shift circuit LS1B of the second example of the configuration shown in FIG. 16 is obtained by deleting the p-type MOS transistor Qp7 and the n-type MOS transistor Qn7 in the level shift circuit shown in FIG. 14, directly inputting the control signal S2 to the gate of the n-type MOS transistor Qn21 and, at the same time, directly inputting the control signal S4 to the gate of the p-type MOS transistor Qp21.

When the threshold value Vthp (Qp1) of the p-type MOS transistor Qp1 is relatively large, and the threshold values Vthn (Qn7) and Vthn (Qn21) of the n-type MOS transistors Qn7 and Qn21 are relatively small, even in the state where the voltage of the node NA rises up to "VDD-Vthp (Qp1)", it is possible to drive the n-type MOS transistor Qn21 to ON by the gate voltage of "VDD". Further, where the threshold value Vthn (Qn1) of the n-type MOS transistor Qn1 is relatively large, and the threshold values Vthp (Qp7) and Vthp (Qp21) of the p-type MOS transistors Qp7 and Qp21 are relatively small, even in the state where the voltage of the node NB is lowered to "VSS+Vthn (Qn1)", it is possible to drive the p-type MOS transistor Qp2 to ON by the gate voltage of "VSS". In the second example of the configuration, by omitting the transistors (Qn7, Qp7) for the bootstrap operation as shown in FIG. 16, the circuit configuration can be simplified.

Next, an explanation will be given of a third example of the configuration of the level shift circuit according to the present embodiment with reference to FIG. 17.

Figure 17:
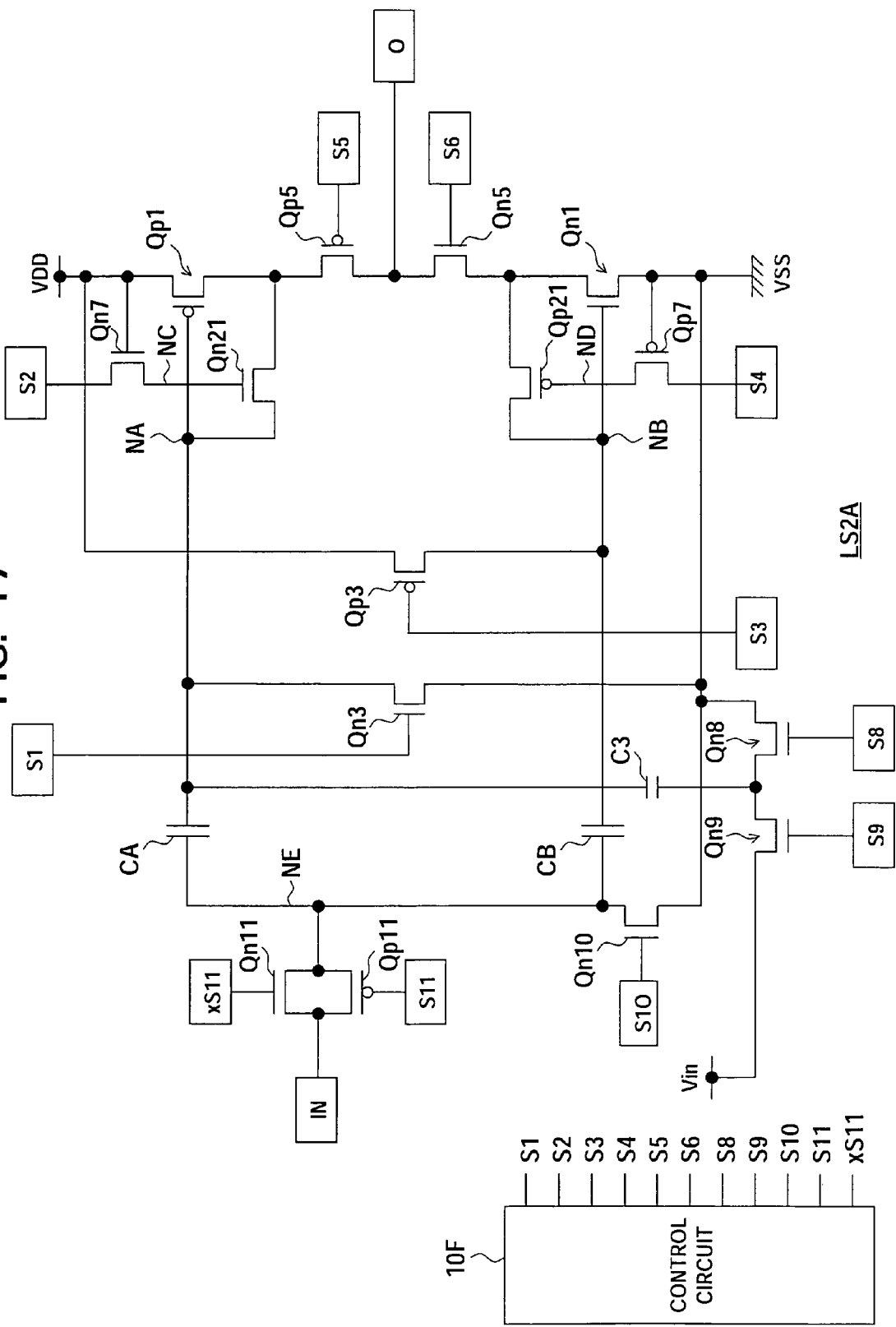
FIG. 17 is a diagram showing a third example of the configuration of the level shift circuit according to the ninth embodiment.

A level shift circuit LS2A of the third example of the configuration shown in FIG. 17 is obtained by changing the connection configuration of the capacitor C3 and the n-type MOS transistor Qn10 in the level shift circuit LS1A shown in FIG. 14 and further replacing the control circuit 10E by a control circuit 10F. The rest of the configuration is the same as that of the level shift circuit LS1A shown in FIG. 14.

The capacitor C3 is connected at one terminal to the node NA and connected at the other terminal to the drain of the n-type MOS transistor Qn8 and the source of the n-type MOS transistor Qn9.

The n-type MOS transistor Qn10 is connected at its drain to the node NE, connected at its source to the power supply line VSS, and receives as input the control signal S10 at its gate.

The control circuit 10F switches the timings of control signals S8 and S9 in the control circuit 10E. Namely, the control circuit 10F outputs the signal which was output as the control signal S8 in the control circuit 10E as the control signal S9 and outputs the signal which was output as the control signal S9 in the control circuit 10E as the control signal S8. The timings of the other control signals in the control circuit 10F are the same as those of the control circuit 10E.

Figure 18:
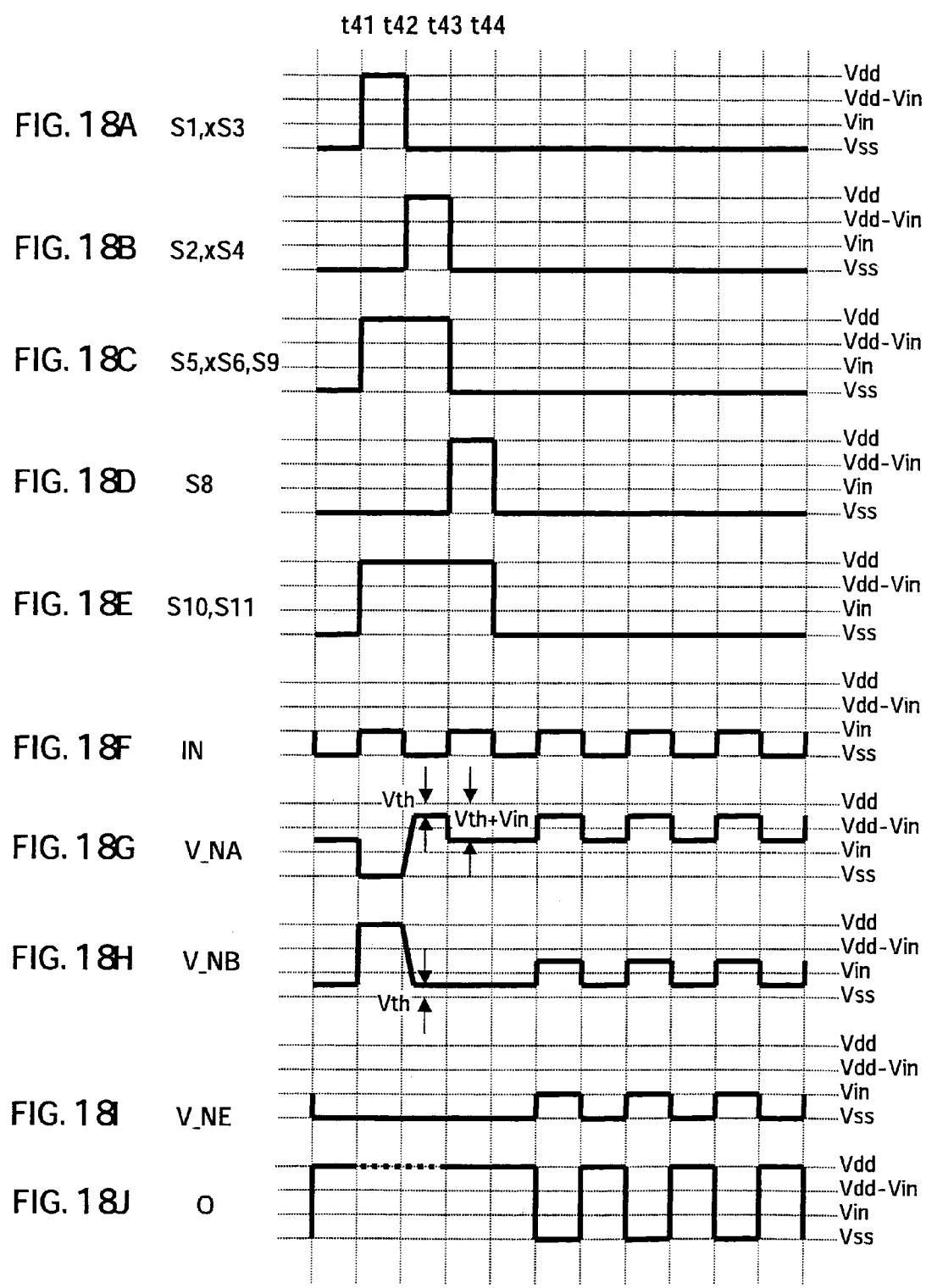
FIG. 18 is a diagram showing an example of signal waveforms of portions in the level shift circuit shown in FIG. 17.

FIG. 18 is a diagram showing an example of signal waveforms of portions in the level shift circuit LS2A shown in FIG. 17. Signal waveforms of FIGS. 18A to 18J correspond to signal waveforms of FIGS. 15A to 15J. In the level shift circuit LS2A shown in FIG. 17, in the first period and the second period (t41 to t43), the control circuit 10E sets the control signal S9 at the voltage "VDD" and sets the control signal S8 at "VSS". Due to this, the n-type MOS transistor Qn9 turns on, the n-type MOS transistor Qn8 turns off, and the voltage "VDD-Vthp (Qp1)" is charged in the capacitor C3.

Next, in the sixth period (t43 to t44), the control circuit 10E sets the control signal S9 at the voltage "VSS" and sets the control signal S8 at the voltage "VDD". Due to this, the n-type MOS transistor Qn9 turns off, the n-type MOS transistor Qn8 turns on, and the voltage of one terminal (terminal on side not connected to the node NA) of the capacitor C3 falls from "VSS+Vin" to "VSS". Here, where the capacitance value of the capacitor C3 is sufficiently large in comparison with the capacitor C (for example 3 times or more), the voltage V_NA of the node NA is lowered by exactly the difference (Vin) between these "VSS+Vin" and "VSS". Namely, the voltage of the node N_NA shifts to the negative side from "VDD-Vthp (Qp1)" to "VDD-Vthp (Qp1)-Vin". Due to this, the p-type MOS transistor Qp1 switches from OFF to ON.

In the first, second, and sixth periods (t41 to t44) explained above, the control circuit 10F sets the control signal S10 at the voltage "VDD". Due to this, in the first, second, and sixth periods, the n-type MOS transistor Qn10 turns on, and the voltage "VSS" is input to the node NE.

After the sixth period (t43 to t44), the control circuit 10E sets the control signals S9, S10, and S11 at the voltage "VSS" and sets the control signal xS11 at the voltage "VDD". Due to this, the n-type MOS transistor Qn10 turns off, the transfer gate (Qp11, Qn11) turns on, and the input signal IN is input to the node NE. The input signal IN is the signal alternately repeating the voltage "Vin" and the voltage "VSS".

When the input signal IN has the voltage "Vin", the voltages of the nodes NA and NB exhibit the same state as that in the sixth period, therefore the p-type MOS transistor Qp1 turns on, and the n-type MOS transistor Qn1 turns off. Due to this, the output signal O becomes the voltage "VDD". On the other hand, when the input signal IN is "VDD", the voltages of the nodes NA and NB shift to the positive side by exactly the voltage "Vin". Namely, the voltage of the node NA shifts from "VDD-Vthp (Qp1)-Vin" to "VDD-Vthp (Qp1)", and the voltage of the node NB shifts from "VSS+Vthn (Qn1)" to "VSS+Vthn (Qn1)+Vin". For this reason, the n-type MOS transistor Qn1 turns on, the p-type MOS transistor Qp1 turns off, and the output signal O becomes the voltage "VSS".

Next, an explanation will be given of a fourth example of the configuration of the level shift circuit according to the present embodiment with reference to FIG. 19.

Figure 19:
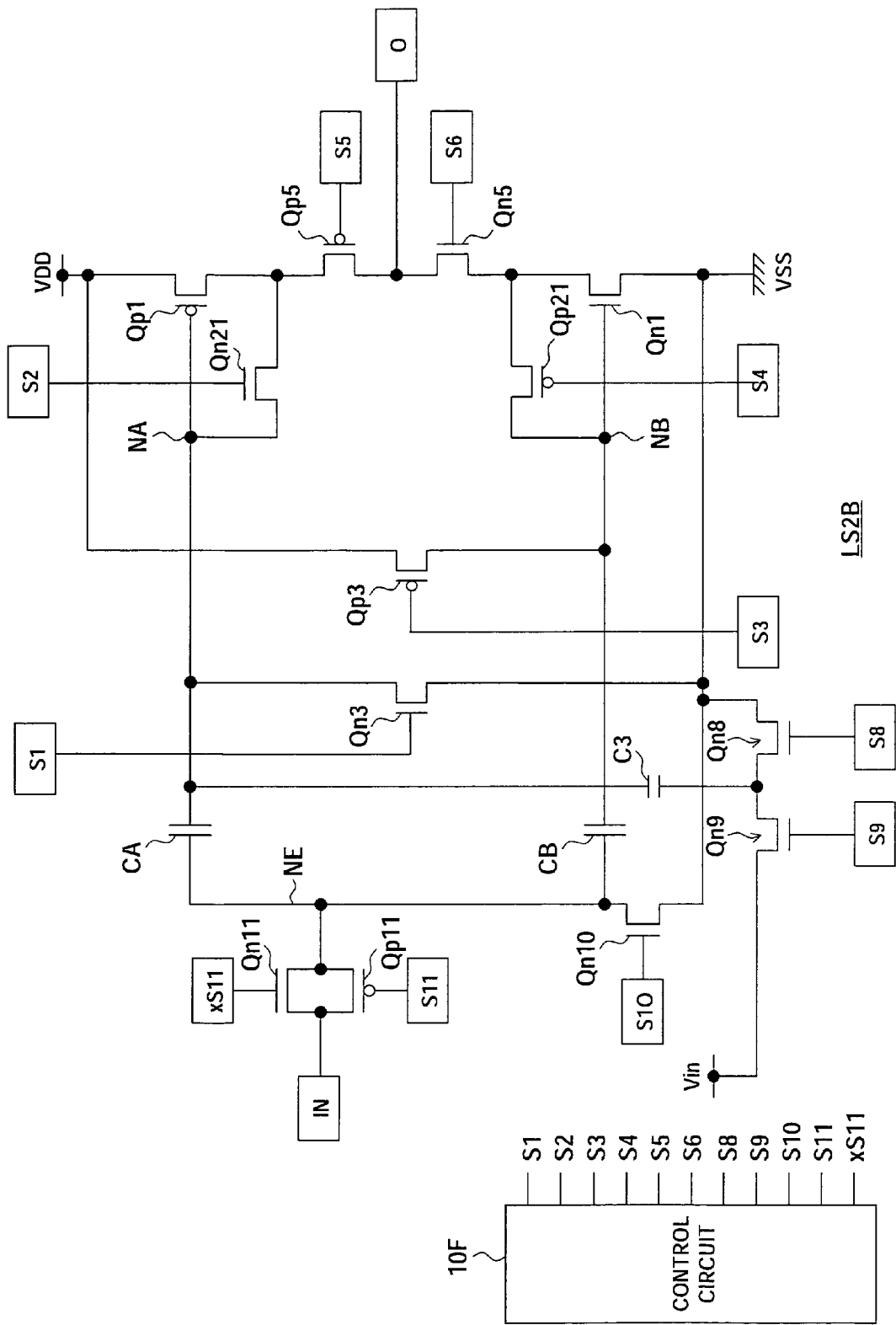
FIG. 19 is a diagram showing a fourth example of the configuration of the level shift circuit according to the ninth embodiment.

A level shift circuit LS2B of the fourth example of the configuration shown in FIG. 19 is obtained by deleting the p-type MOS transistor Qp7 and the n-type MOS transistor Qn7 in the level shift circuit LS2A shown in FIG. 17 and directly inputting the control signal S2 to the gate of the n-type MOS transistor Qn21 and, at the same time, directly inputting the control signal S4 to the gate of the p-type MOS transistor Qp21.

In the same way as the level shift circuit LS1B of the second example of the configuration shown in FIG. 16, when threshold values of the p-type MOS transistor Qp1 and the n-type MOS transistor Qn1 are relatively large, and threshold values of the n-type MOS transistors Qn7 and Qn21, and the p-type MOS transistors Qp7 and Qp21 are relatively small, even if the bootstrap operation is not carried out, it is possible to drive the n-type MOS transistor Qn21 and the p-type MOS transistor Qp21 to ON. In the fourth example of the configuration, as shown in FIG. 19, by omitting the transistors (Qn7, Qp7) for the bootstrap operation, the circuit configuration can be simplified.

10th Embodiment

Next, an explanation will be given of a 10th embodiment of the present invention.

The 10th embodiment relates to a shift register configured by using the level shift circuit of the embodiment explained above.

Figure 20:
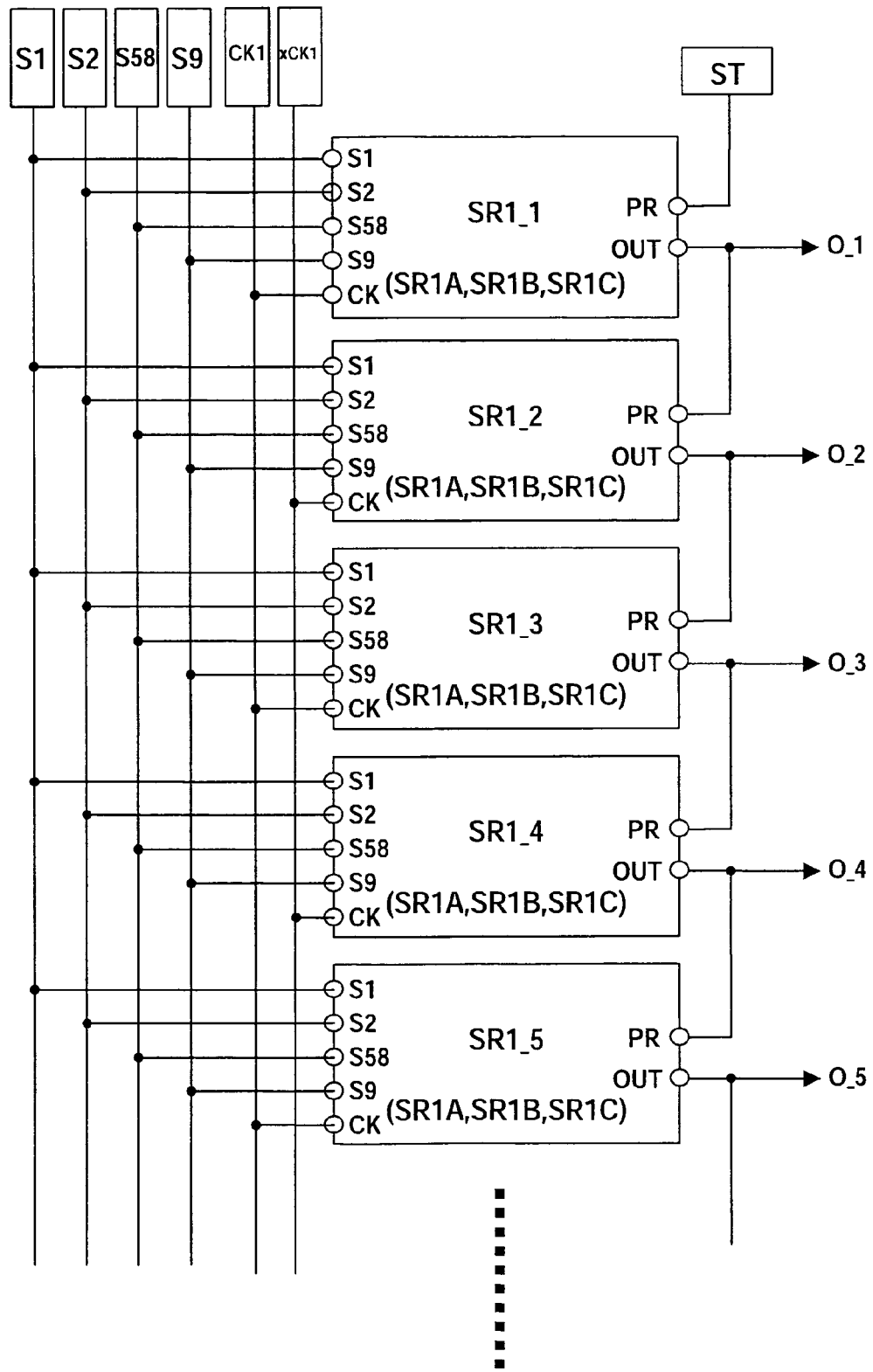
FIG. 20 is a diagram showing an example of the configuration of a shift register according to a 10th embodiment.

FIG. 20 is a diagram showing an example of the configuration of the shift register according to a 10th embodiment. The shift register shown in FIG. 20 has a plurality of cascade-connected shift stages SR1_1, SR1_2, SR1_3, . . . .

Shift stages (SR1_1, SR1_2, SR1_3, . . . ) are provided with input terminals for control signals S1, S2, S58, and S9 and input terminals for the clock signal CK and, at the same time, are provided with output terminals for the output signal OUT shift in level and input terminals for the input signal PR from former stages.

The input terminals for control signals S1, S2, S58, and S9 of shift stages (SR1_1, SR1_2, SR1_3, . . . ) receive the control signals S1, S2, S58, and S9 as common input.

The terminals for the clock signal CK in the shift stages in odd number stages (SR1_1, SR1_3, SR1_5, . . . ) receive the clock signal CK1 as common input. The clock signal CK1 is a signal alternately repeating the voltage "Vin" and the voltage "VSS". The terminals for the clock signal CK at shift stages in even number stages (SR1_2, SR1_4, SR1_6, . . . ) receive the clock signal xCK1 formed by inverting the logic of the clock signal CK1 as common input.

Explaining this in other words, the two cascade-connected shift stages SR1_i and SR1_(i+1) receive clock signals having phases inverted from each other as input. Note, "i" indicates a natural number.

The input terminal for the input signal PR in the shift stage SR1_(i+1) receives the output signal OUT of the shift stage SR1_i as input. Further, the input terminal for the input signal PR in the initial stage (SR1_1) receives a start signal ST as input.

The output signal OUT of the shift stage SR1_i is output as an i-th stage output signal O_i of the shift register.

An explanation will be given of some examples of configuration of the shift stage in the shift register shown in FIG. 20.

Figure 21:
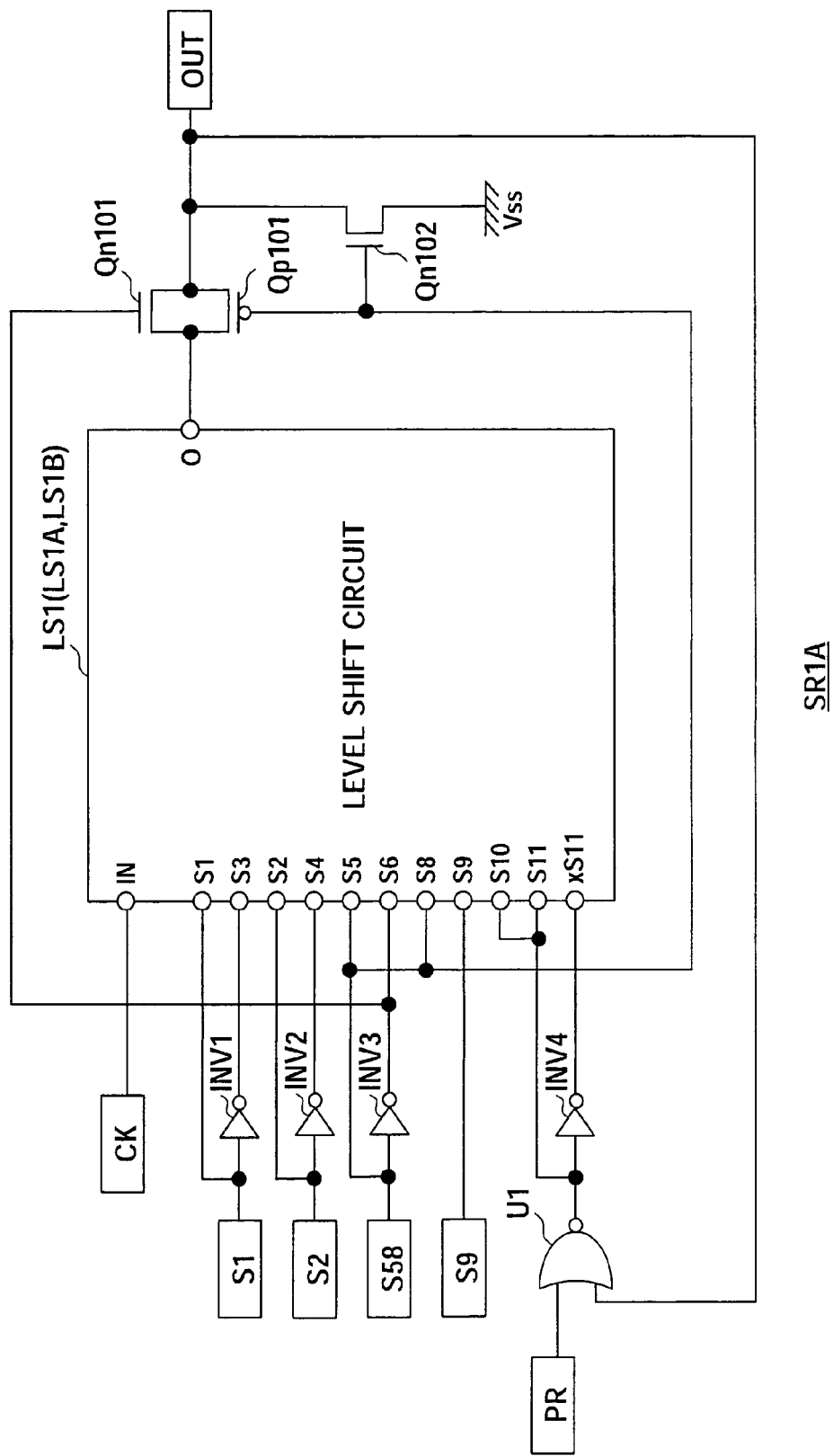
FIG. 21 is a diagram showing a first example of the configuration of a shift stage in the shift register shown in FIG. 20.

FIG. 21 is a diagram showing a first example of the configuration of the shift stage in the shift register shown in FIG. 20. A shift stage SR1A shown in FIG. 21 has a level shift circuit LS1, inverter circuits INV1 to INV4, a NOR circuit U1, a p-type MOS transistor Qp101, and n-type MOS transistors Qn101 and Qn102.

The NOR circuit U1 is an embodiment of the detection circuit of the present invention. The circuit configured by a p-type MOS transistor Qp101 and n-type MOS transistors Qn101 and Qn102 is an embodiment of the output circuit of the present invention.

The level shift circuit LS1 shifts the level of the pulse signal included in 1 cycle of the clock signal CK and outputs it when the signal output from the NOR circuit U1 is at the low level (VSS). The level shift circuit LS1 has the same configuration as that of for example the level shift circuit LS1A shown in FIG. 14 or the level shift circuit LS1B shown in FIG. 16. Note that control signals are supplied from the outside, therefore the control circuit 10E is omitted.

The NOR circuit U1 computes an inverted OR logic of the input signal PR from the former stage of the shift stage SR1A and the output signal OUT of the shift stage SR1A and outputs the same as the control signals S10 and 11. The output signal of the NOR circuit U1 becomes the low level (VSS) in the period during which the pulse of the high level (VDD) is input as the input signal PR from the former stage and the period during which the pulse of the high level (VDD) is output to the next stage as the output signal OUT.

The n-type MOS transistor Qn101 and the p-type MOS transistor Qp101 are connected in parallel and configure the transfer gate. This transfer gate is connected between the terminal for the output signal O of the level shift circuit LS1 and the terminal for the output signal OUT of the shift stage SR1A. The control signal S5 is input to the gate of the p-type MOS transistor Qp101, and the control signal S6 is input to the gate of the n-type MOS transistor Qn101.

The n-type MOS transistor Qn102 is connected between the terminal of the output signal OUT of the shift stage SR1A and the power supply line VSS. The control signal S5 is input to the gate of the n-type MOS transistor Qn102.

The inverter INV1 inverts the logic of the control signal S1 input to the shift stage SR1A and generates the control signal S3. The inverter INV2 inverts the logic of the control signal S2 input to the shift stage SR1A and generates the control signal S4. The inverter INV3 inverts the logic of the control signal S58 input to the shift stage SR1A and generates the control signal S6. The inverter INV4 inverts the logic of the control signal S11 output from the NOR circuit U1 and generates the control signal xS11.

The clock signal CK (CK1 or xCK1) input to the shift stage SR1A is input as the input signal IN to the level shift circuit LS1. The control signal S58 input to the shift stage SR1A is input as the control signals S5 and S8 to the level shift circuit LS1. The control signal S9 input to the shift stage SR1A is input to the level shift circuit LS1 as the control signal S9 as it is.

In the shift stage SR1A shown in FIG. 21, when the control signal S58 is at the high level (VDD), the transfer gate configured by the n-type MOS transistor Qn101 and the p-type MOS transistor Qp101 turns off, and the n-type MOS transistor Qn102 turns on. Namely, in the period during which the voltages of the nodes NA and NB have not finished being set and the output signal O of the level shift circuit LS1 is in the unstable state, the constant voltage VSS is output to the next stage. On the other hand, when the control signal S58 is at the low level (VSS), the transfer gate (Qp101, Qn101) turns on, and the n-type MOS transistor Qn102 turns off. Namely, in the period during which the voltages of the nodes NA and NB have finished being set and the output signal O of the level shift circuit LS1 is set to the high level or low level, the output signal O of the level shift circuit LS1 is output to the next stage.

Next, an explanation will be given of a second example of the configuration of a shift stage.

Figure 22:
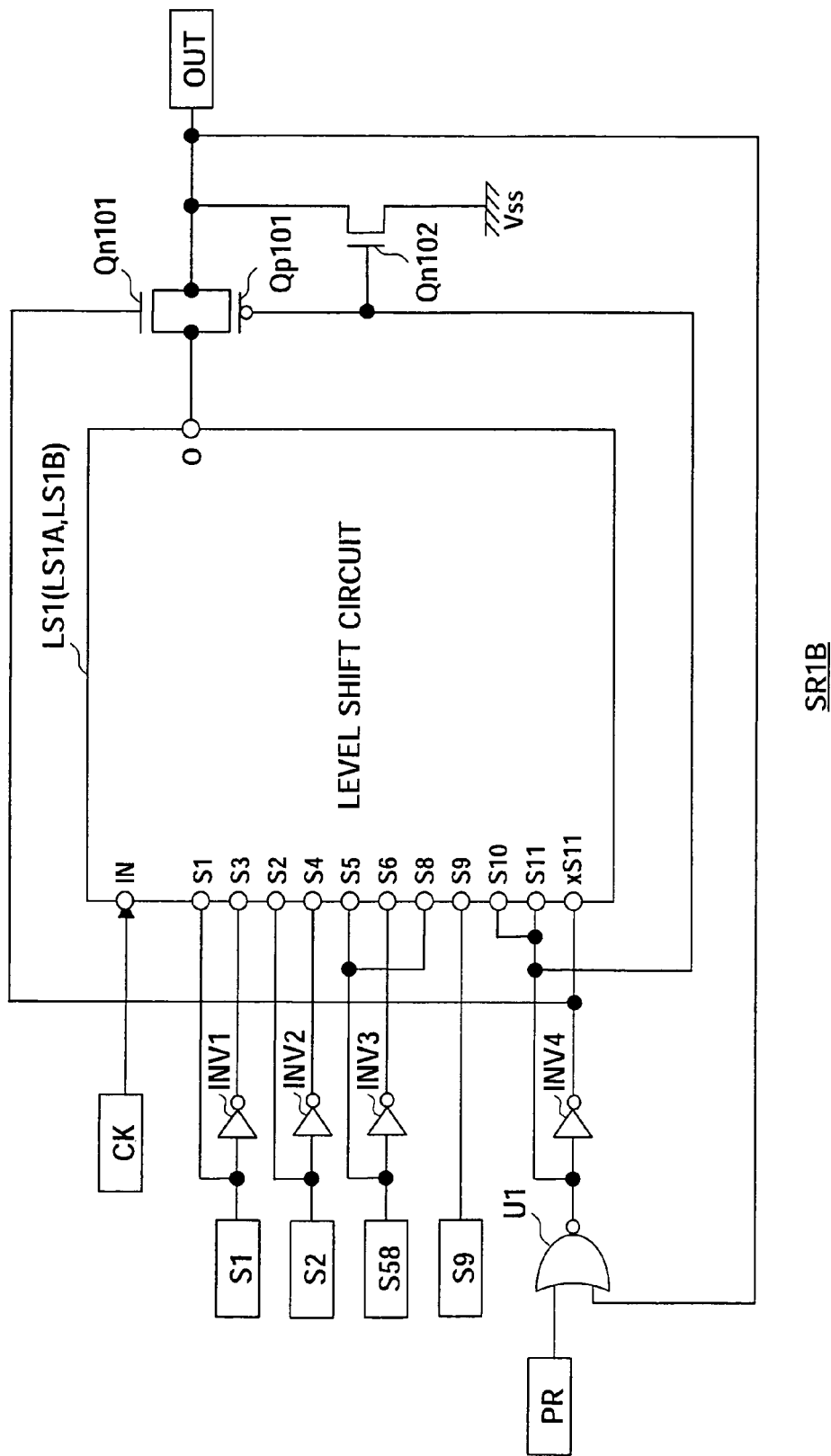
FIG. 22 is a diagram showing a second example of the configuration of a shift stage in the shift register shown in FIG. 20.

FIG. 22 is a diagram showing the second example of the configuration of a shift stage in the shift register shown in FIG. 20. The shift stage SR1B shown in FIG. 22 has the same configuration as that of the shift stage SR1A shown in FIG. 21. The difference between the two resides in the control signals input to the gates of the p-type MOS transistor Qp101 and the n-type MOS transistor Qn101. Namely, at the shift stage SR1B, the control signal S11 is input to the gates of the p-type MOS transistor Qp101 and the n-type MOS transistor Qn102, and the control signal xS11 is input to the gate of the n-type MOS transistor Qn101.

According to the shift stage SR1B, when the control signal S11 is at the high level (VDD) and the control signal xS11 is at the low level (VSS), the transfer gate configured by the n-type MOS transistor Qn101 and the p-type MOS transistor Qp101 turns off, and the n-type MOS transistor Qn102 turns on. Namely, in the period during which the level shift operation is not carried out in the level shift circuit LS1, a constant voltage VSS is output to the next stage. On the other hand, when the control signal S11 is at the low level (VSS), and the control signal xS11 is at the high level (VDD), the transfer gate (Qp101, Qn101) turns on, and the n-type MOS transistor Qn102 turns off. Namely, in the period during which the level shift operation is carried out in the level shift circuit LS1, the output signal O of the level shift circuit LS1 is output to the next stage.

Next, an explanation will be given of a third example of the configuration of the shift stage.

Figure 23:
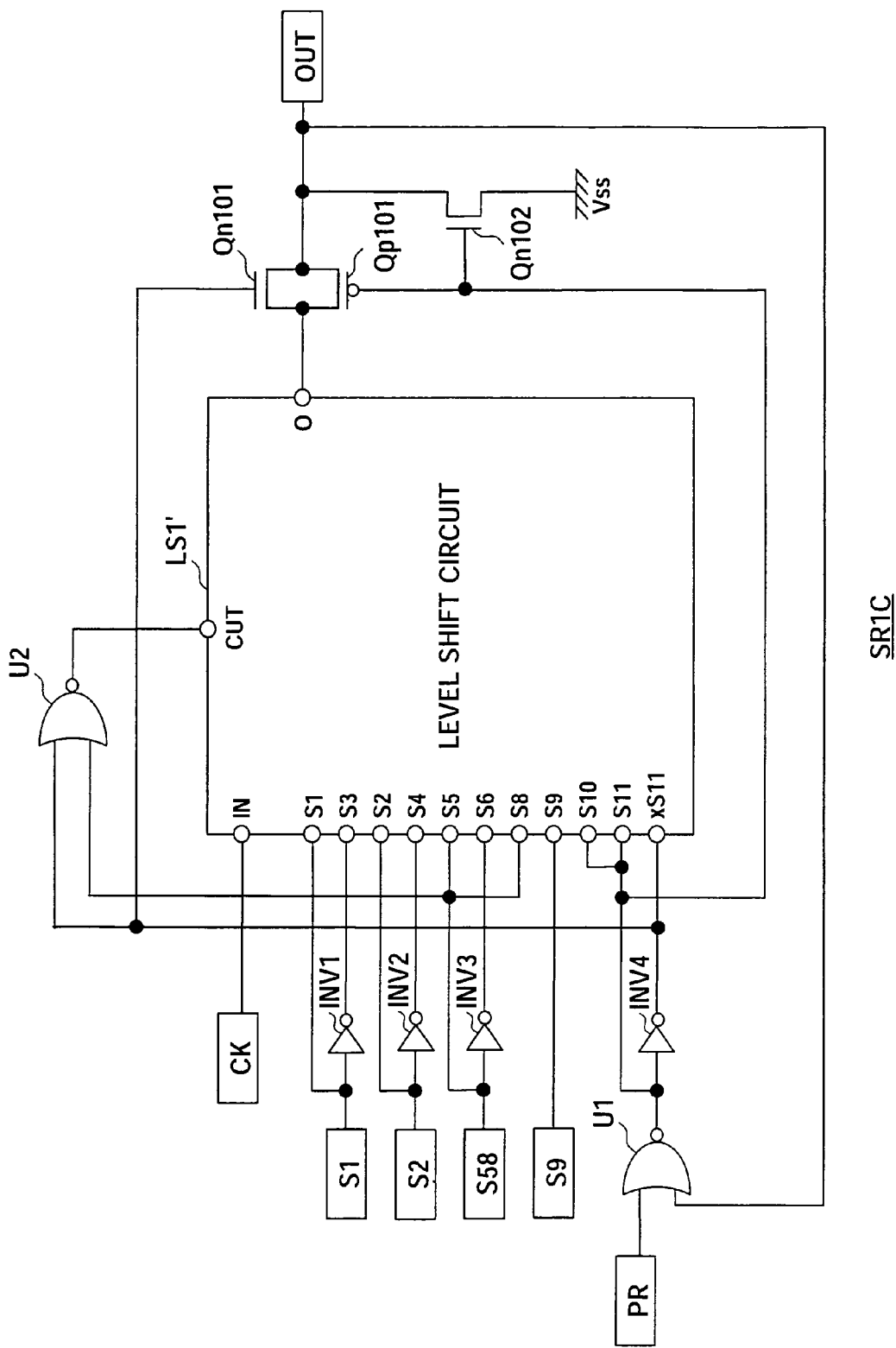
FIG. 23 is a diagram showing a third example of the configuration of a shift stage in the shift register shown in FIG. 20.

FIG. 23 is a diagram showing the third example of the configuration of the shift stage in the shift register shown in FIG. 20. A shift stage SR1C shown in FIG. 23 is obtained by replacing the level shift circuit LS1 (LS1A or LS1B) in the shift stage SR1B shown in FIG. 22 by LS1' (LS1C or LS1D) explained next and further adding an OR circuit U2. The rest of the configuration is the same as that of the shift stage SR1B.

Figure 24:
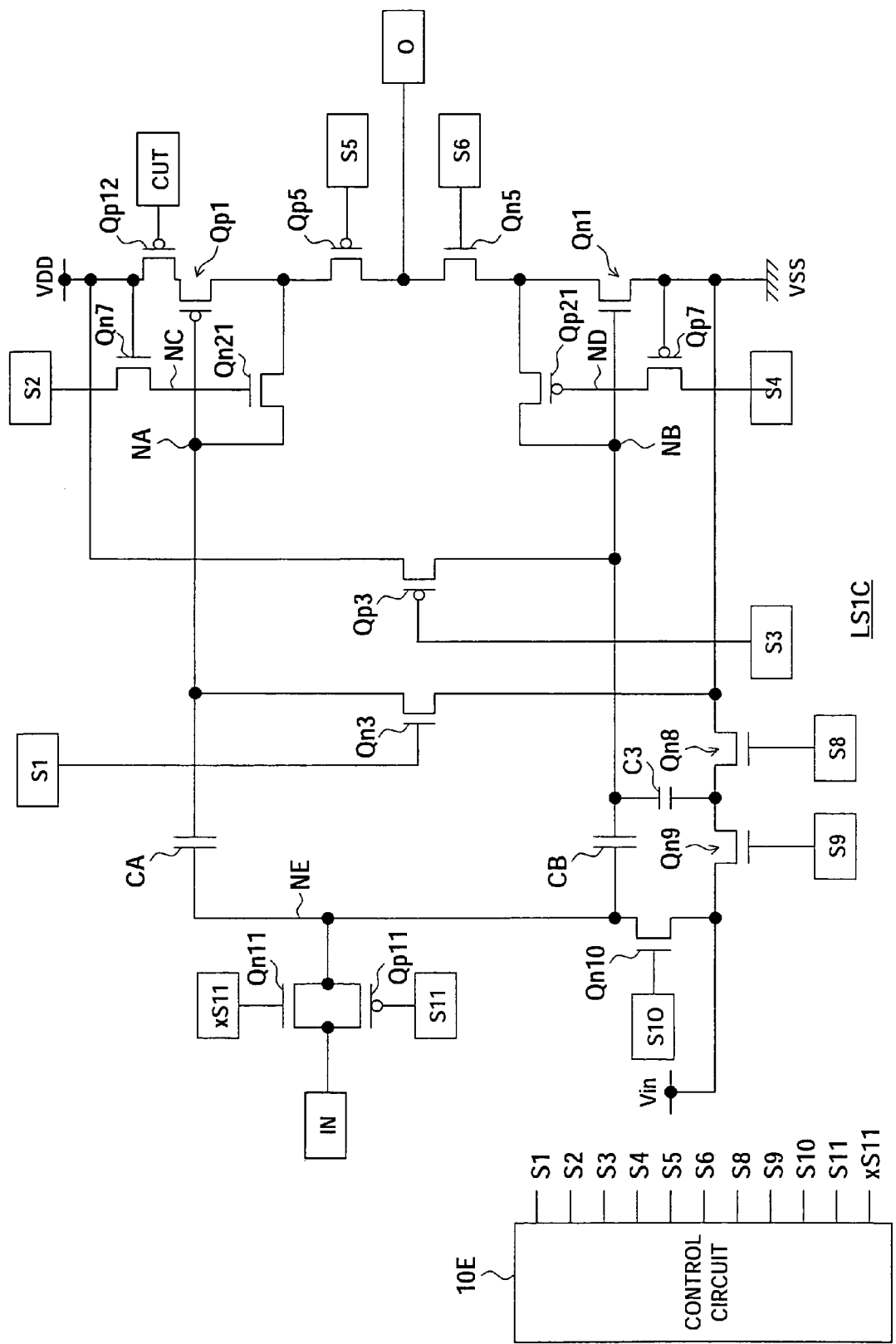
FIG. 24 is a diagram showing a first example of the configuration of the level shift circuit used in the shift stage shown in FIG. 23.

FIG. 24 is a diagram showing the first example of the configuration of the level shift circuit LS1'. The level shift circuit LS1C shown in FIG. 24 is obtained by adding the p-type MOS transistor Qp12 to the level shift circuit LS1A shown in FIG. 14. The rest of the components are the same as those of the level shift circuit LS1A. The p-type MOS transistor Qp12 is inserted in a route connecting the source of the p-type MOS transistor Qp1 and the power supply line VDD and receives as input a control signal CUT at its gate.

Figure 25:
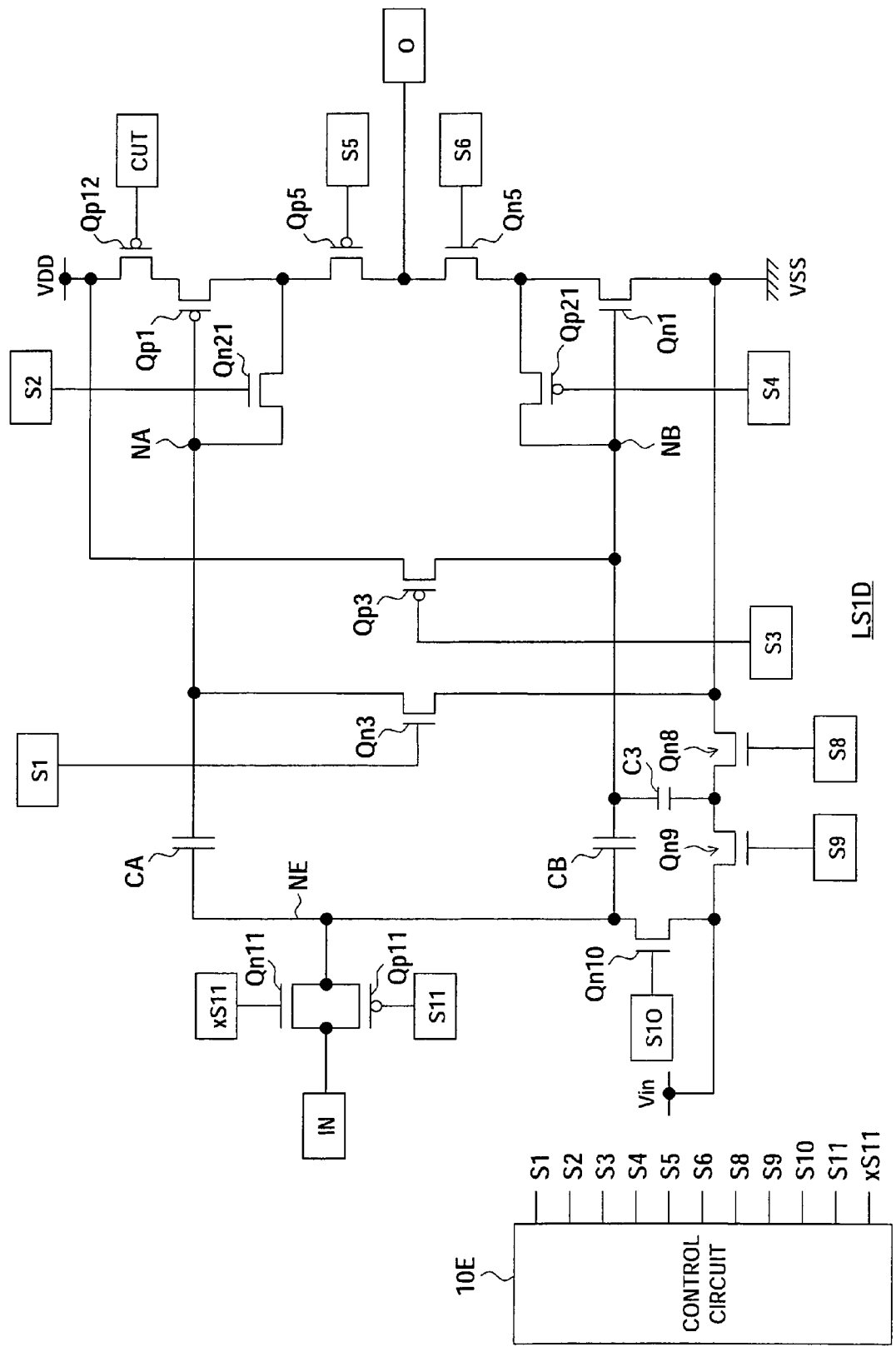
FIG. 25 is a diagram showing a second example of the configuration of the level shift circuit used in the shift stage shown in FIG. 23.

FIG. 25 is a diagram showing a second example of the configuration of the level shift circuit LS1'. The level shift circuit LS1D shown in FIG. 25 is obtained by adding the p-type MOS transistor Qp12 to the level shift circuit LS1B shown in FIG. 16. The rest of the components are the same as those of the level shift circuit LS1B. The p-type MOS transistor Qp12 is inserted in the route connecting the source of the p-type MOS transistor Qp1 and the power supply line VDD in the same way as the level shift circuit LS1C and receives as input the control signal CUT at its gate.

In the shift stage SR1C shown in FIG. 23, the NOR circuit U2 computes the inverted OR logic of the control signal S5 and the control signal xS11 and supplies the result of computation as the control signal CUT to the level shift circuit LS1'.

When the control signal S5 is at the high level (VDD) or the control signal xS11 is at the high level (VDD), the control signal CUT output from the NOR circuit U2 becomes the low level (VSS), and the p-type MOS transistor Qp12 turns on. Namely, in the period during which the voltages of the nodes NA and NB are being set and the period during which the level shift operation is carried out in the level shift circuit LS1', the source of the p-type MOS transistor Qp1 is connected to the power supply line VDD. On the other hand, when the control signal S5 is at the low level (VSS) and the control signal xS11 is at the low level (VSS), the control signal CUT output from the NOR circuit U2 becomes the high level (VDD), and the p-type MOS transistor Qp12 turns off. Namely, in the period during which the voltages of the nodes NA and NB are not being set and the level shift operation is not carried out in the level shift circuit LS1', the source of the p-type MOS transistor Qp1 is disconnected from the power supply line VDD. Accordingly, when it is not necessary to pass current in the p-type MOS transistor Qp1, by disconnecting the source of the p-type MOS transistor Qp1 from the power supply line VDD, the useless leakage current flowing in the p-type MOS transistor Qp1 is suppressed.

Next, an explanation will be given of the operation of the shift register according to the present embodiment having the above configuration with reference to FIG. 26.

Figure 26:
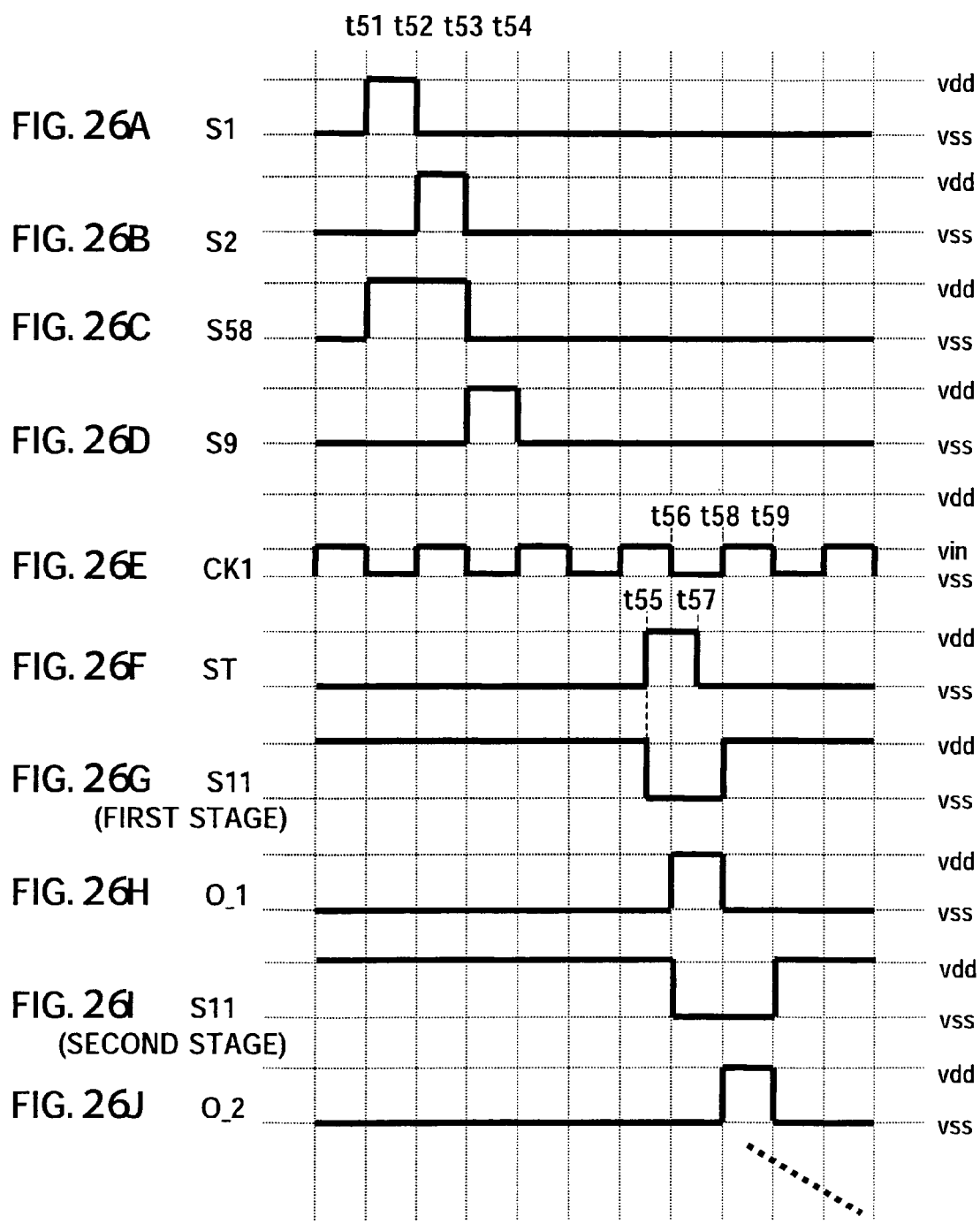
FIG. 26 is a diagram showing an example of signal waveforms of portions in the shift register shown in FIG. 20.

FIG. 26 is a diagram showing an example of signal waveforms of portions in the shift register according to the present embodiment. FIG. 26A shows the voltage waveform of the control signal S1. FIG. 26B shows the voltage waveform of the control signal S2. FIG. 26C shows the voltage waveform of the control signal S58. FIG. 26D shows the voltage waveform of the control signal S9. FIG. 26E shows the voltage waveform of the clock signal CK1. FIG. 26F shows the voltage waveform of the start signal ST. FIG. 26G shows the voltage waveform of the control signal S11 generated inside the shift stage SR1_1 in the first stage. FIG. 26H shows the output signal O_1 of the shift stage SR1_1 in the first stage. FIG. 26I shows the voltage waveform of the control signal S11 generated inside the shift stage SR1_2 in the second stage. FIG. 26J shows the output signal O_2 of the shift stage SR1_2 in the second stage.

In the period of the times t51 to t54 shown in FIG. 26, by the same operation as that at the times t41 to t44 shown in FIG. 15, the level shift circuit LS1 (LS1') included in each shift stage (SR1_1, SR1_2, . . . ) is initialized. Namely, in the first period (t51 to t52), the node NA is set at the voltage "VSS", and the node NB is set at the voltage "VDD". In the second period (t52 to t53), the node NA is set at the voltage "VDD−Vthp (Qp1)", and the node NB is set at the voltage "VSS+Vthn (Qn1)". In the sixth period (t53 to t54), the node NB is set at the voltage "VSS+Vthn (Qn1)+Vin".

In the initial state before the shift operation is carried out, assume that all of the input signals PR and output signals OUT of the shift stages (SR1_1, SR1_2, . . . ) have become the low level (VSS). In this case, the input signal PR and the output signal OUT of the shift stage become the low level (VSS), therefore all of control signals S10 and S11 generated at the NOR circuits U1 inside the shift stages become the high level (VDD). When the control signals S10 and S11 become the high level, the voltage "Vin" is supplied to the node NE of the level shift circuit. When the node NE becomes the voltage "Vin", as shown in FIG. 15, the output signal O becomes the low level (VSS) except during the first and second periods (t561 to t53) for setting the voltages of the nodes NA and NB. In the first and second periods (t51 to t53) for setting the voltages of the nodes NA and NB, by turning off the transfer gate s(Qn101, Qp101) connected to the output of the level shift circuit and turning on the n-type MOS transistor Qn102, the output signal OUT of the shift stage becomes the low level (VSS). Accordingly, in the initial state before the shift operation is carried out, input/output signals of shift stages are held at the low level (VSS).

When the initialization of the level shift circuit at times t51 to t54 ends, the pulse of the high level (VDD) is input to the shift stage SR1_1 in the first stage of the shift register as the start signal ST. This pulse is generated so as to become the high level (VDD) at the time of the fall (t56) from the high level (VDD) to the low level (VSS) of the clock signal CK1 and has a shorter pulse width than that in the period of 1 cycle of the clock signal CK1 (t55 to t57) as shown in for example FIG. 26F.

When the start signal ST becomes the high level (VDD), the control signal S11 of the low level (VSS) is generated in the NOR circuit U1 included in the shift stage SR1_1 in the first stage (FIG. 26G). When the control signal S11 becomes the low level (VSS), the clock signal CK1 is input to the node NE of the level shift circuit LS1 (LS1') included in the shift stage SR1_1 of the first stage. When the clock signal CK1 falls from the high level (Vin) to the low level (VSS) at the time t56, the output signal OUT (="O_1") of the level shift circuit LS1 (LS1') rises from the low level (VSS) to the high level (VDD) (FIG. 26H).

When the output signal O_1 of the shift stage SR1_1 in the first stage becomes the high level (VDD), the control signal S11 of the low level (VSS) is generated in the NOR circuit U1 included in the shift stage SR1_2 of the second stage (FIG. 26I). When the control signal S11 becomes the low level (VSS), the clock signal xCK1 is input to the node NE of the level shift circuit LS1 (LS1') included in the shift stage SR1_2 of the second stage. The clock signal xCK1 becomes the high level (Vin) after the time t56, therefore the output signal OUT (="O_2") of the level shift circuit LS1 (LS1') becomes the low level (VSS) (FIG. 26J).

Even when the pulse of the high level (VDD) of the start signal ST ends at the time t57, the output signal OUT of the high level (VDD) is input to the NOR circuit U1 in the shift stage SR1_1 of the first stage, therefore the output signal (control signal S11) of the NOR circuit U1 is subsequently held at the low level (VSS) (FIG. 26G). Due to this, the level shift operation is continued in the shift stage SR1_1 of the first stage, and the output signal O_1 is held at the high level (FIG. 26H).

When the clock signal CK1 rises from the low level (VSS) to the high level (Vin) at the time t58, the output signal OUT of the level shift circuit LS1 (LS1') in the shift stage SR1_1 of the first stage falls from the high level (VDD) to the low level (VSS). When the output signal OUT becomes the low level (VSS), all of input signals of the NOR circuit U1 become the low level (VSS), therefore the control signal S11 output from the NOR circuit U1 becomes the high level (VDD). When the control signal S11 becomes the high level (VDD), the level shift operation in the level shift circuit LS1 (LS1') is suspended, and after this, even when the clock signal CK1 falls from the high level (Vin) to the low level (VSS), the output signal O_1 of the shift stage SR1_1 in the first stage is held at the low level (VSS) as it is.

On the other hand, when the clock signal xCK1 falls from the high level (Vin) to the low level (VSS) at the time t58, the output signal O_2 of the shift stage SR1_2 receiving as input this clock signal xCK1 rises from the low level (VSS) to the high level (VDD) (FIG. 26J). By the output signal O_2 becoming the high level (VDD), the output signal (control signal S11) of the NOR circuit U1 included in the shift stage SR1_2 of the second stage is subsequently held at the low level (VSS), and the level shift operation is continued. Hereinafter, by the same operation, pulse signals of the high level are successively propagated to shift stages in the latter stages in synchronization with the clock signals CK1 and xCK1.

As explained above, according to the present embodiment, the shift register can be configured by using the level shift circuits explained in the previous embodiments. Accordingly, the function as the shift register can be realized while performing the stable level shift operation without influence due to variation of threshold voltages of the transistors.

Further, according to the present embodiment, the leakage current in the level shift circuit configuring each stage can be made very small, therefore the power consumption can be greatly reduced.

Particularly, when the shift stage SR1C configured by the level shift circuit LS1' shown in FIG. 24 or FIG. 25 is used, for the period during which it is not necessary to pass a current in the p-type MOS transistor Qp1 (the period during which the input signal PR and the output signal OUT of the level shift circuit LS1' become the low level with no pulse and the control signal S5 is at the low level for which the voltages of the nodes NA and NB are not set), the p-type MOS transistor Qp12 turns off, and the p-type MOS transistor Qp1 and the power supply line VDD are disconnected. Due to this, even in the case where the voltages of the nodes NA and NB become unstable due to sudden noise, fluctuation of the power supply voltage, or the like, the leakage current flowing in the p-type MOS transistor Qp1 can be effectively blocked by the p-type MOS transistor Qp12.

Further, according to the present embodiment, the level shift circuit configuring each shift stage can perform the level shift operation even with a signal having a smaller amplitude than the threshold value of the transistor, therefore the circuit can operate with a clock signal having a small amplitude.

Note that, in the above embodiments, the inverter circuits INV1 to INV3 generating the control signals S3, S4, and S6 are provided in the individual shift stages, but these inverter circuits may be shared by a plurality of shift stages as well. Due to this, the circuit elements can be reduced.

Further, four control signals (S1, S2, S58, S9) are required for initializing the level shift circuits in the above embodiments, but some of these control signals can be generated based on other control signals.

Figure 27:
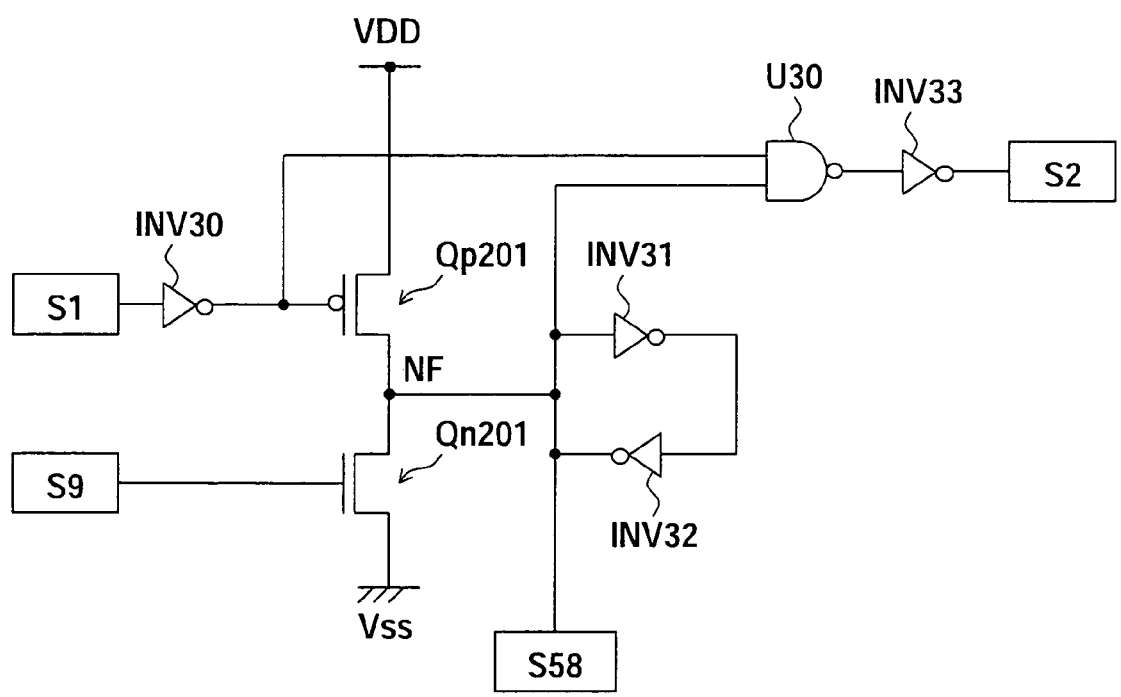
FIG. 27 is a diagram showing an example of a circuit for generating a control signal supplied to the shift register.

FIG. 27 is a diagram showing an example of a circuit for generating the control signals S2 and S58 based on control signals S1 and S9. The circuit shown in FIG. 27 has inverter circuits INV30 to INV33, a NAND circuit U30, a p-type MOS transistor Qp201, and an n-type MOS transistor Qn201.

The inverter circuit INV30 inverts the logic of the control signal S1.

The p-type MOS transistor Qp201 is connected at its source to the power supply line VDD, connected at its drain to a node NF, and connected at its gate to the output of the inverter circuit 30. The n-type MOS transistor Qn201 is connected at its source to the power supply line VSS, connected at its drain to the node NF, and receives as input the control signal S9 at its gate.

Inputs and outputs of the inverter circuits INV31 and INV32 are connected to each other in the form of a ring. First ends of the inverter circuits INV31 and INV32 connected in this ring state (output of the inverter circuit INV32 in the example of FIG. 27) are connected to the node NF. The control signal S58 is generated at this node NF.

The NAND circuit U30 computes an inverted AND logic of the output signal (control signal xS1) of the inverter circuit INV30 and the signal of the node NF (control signal 58). The inverter circuit INV38 inverts the logic of the output signal of the NOR circuit 30 and outputs the result as the control signal S2.

Figure 28:
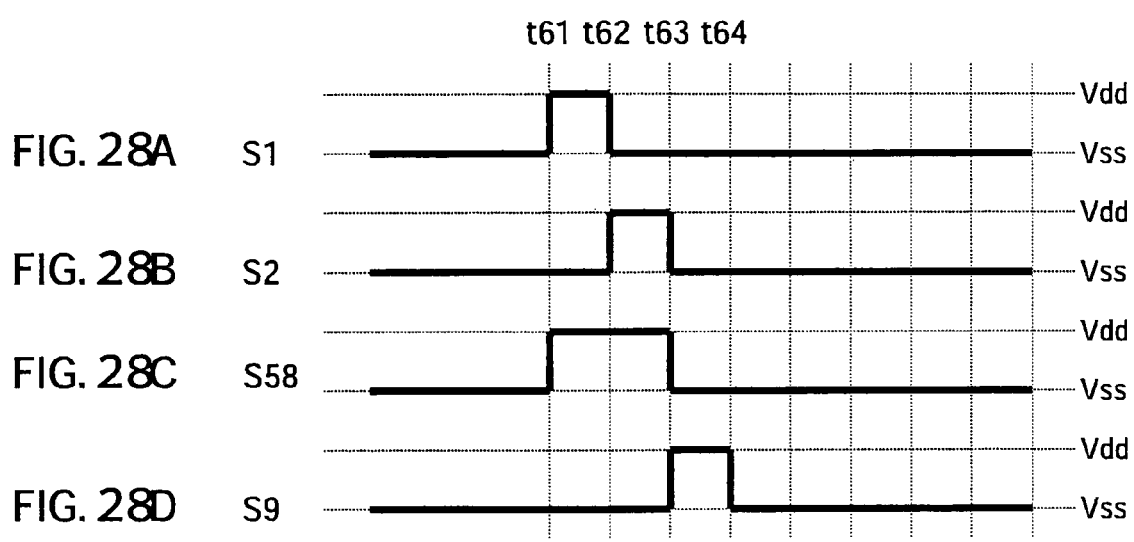
FIG. 28 is a diagram showing an example of signal waveforms of portions in the circuit shown in FIG. 27.

FIG. 28 is a diagram showing an example of signal waveforms of portions of the circuit shown in FIG. 27. When the control signal S1 becomes the high level and the control signal S9 becomes the low level at the time t61, a p-type MOS transistor Qp201 turns on and the n-type MOS transistor Qn201 turns off, therefore the control signal S58 becomes the high level (FIG. 28C). Further, at this time, the output signal of the inverter circuit INV30 is at the low level, therefore the control signal S2 becomes the low level. When the control signal S1 becomes the low level at a time t62, the p-type MOS transistor Qp201 turns off. At this time, the voltage of the node NF is held by the inverter circuits INV31 and INV32 connected at the form of a ring, therefore is held at the high level. Further, both of the two input signals of the NAND circuit U30 become the high level, therefore the control signal S2 becomes the high level. When the control signal S9 becomes the low level at a time t63, the n-type MOS transistor Qn201 turns on, so the control signal S58 becomes the low level. Further, at this time, the control signal S58 of the low level is input to the NAND circuit U30, therefore also the control signal S2 becomes the low level.

In this way, according to the circuit shown in FIG. 27, by generating the control signals S2 and S58 based on the control signals S1 and S9, the number of signals supplied from the outside for controlling the shift register can be decreased.

11th Embodiment

Next, an explanation will be given of an 11th embodiment of the present invention.

Figure 29:
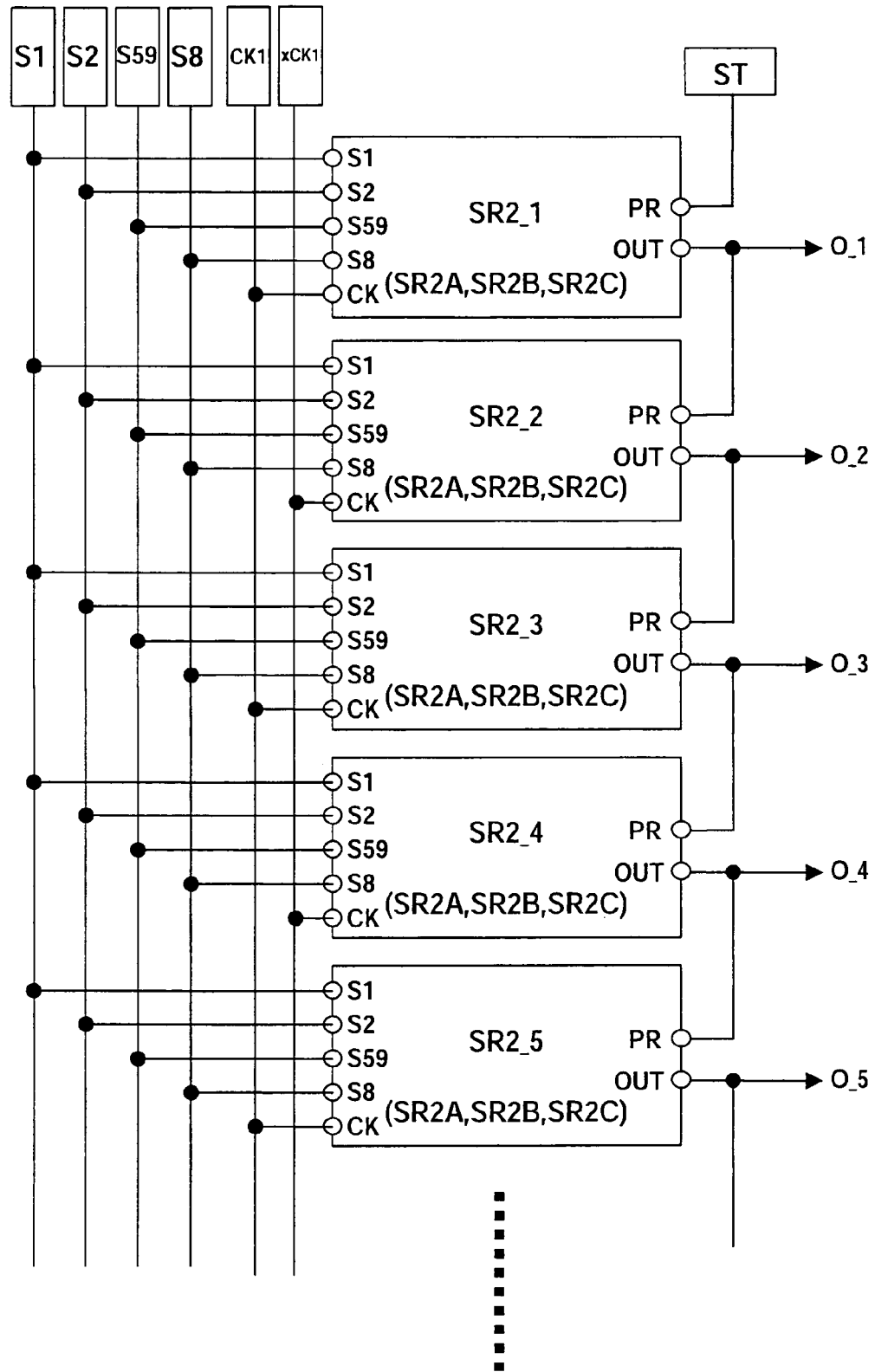
FIG. 29 is a diagram showing an example of the configuration of a shift register according to an 11th embodiment.

FIG. 29 is a diagram showing an example of the configuration of a shift register according to the 11th embodiment. The shift register shown in FIG. 29 has a plurality of cascade-connected shift stages SR2_1, SR2_2, SR2_3, . . . .

The shift stages (SR2_1, SR2_2, SR2_3, . . . ) are provided with input terminals for control signals S1, 62, S59, and S8 and input terminals for the clock signal CK and, at the same time, provided with output terminals for the level shift output signals OUT and input terminals for the input signals PR from the former stages.

The input terminals for the control signals S1, S2, S59, and S8 in the shift stages (SR2_1, SR2_2, SR2_3, . . . ) receive the control signals S1, S2, S59, and S8 as common input.

The terminals for the clock signal CK in the odd number shift stages (SR2_1, SR2_3, SR2_5, . . . ) receive the clock signal CK1 as common input. The terminals for the clock signal CK in the even number shift stages (SR2_2, SR2_4, SR2_6, . . . ) receive the clock signal xCK1 as common input.

When saying this in the other words, clock signals having phases inverted from each other are input to two cascade-connected shift stages SR2_i and SR2_(i+1).

The input terminal for the input signal PR in the shift stage SR2_(i+1) receives the output signal OUT of the shift stage SR2_i as input. Further, the input terminal for the input signal PR in the initial stage (SR2_1) receives the start signal ST as input.

The output signal OUT of the shift stage SR2_i becomes the output signal O_i of the i-th stage of the shift register.

An explanation will be given of some examples of configuration of the shift stage in the shift register shown in FIG. 29.

Figure 30:
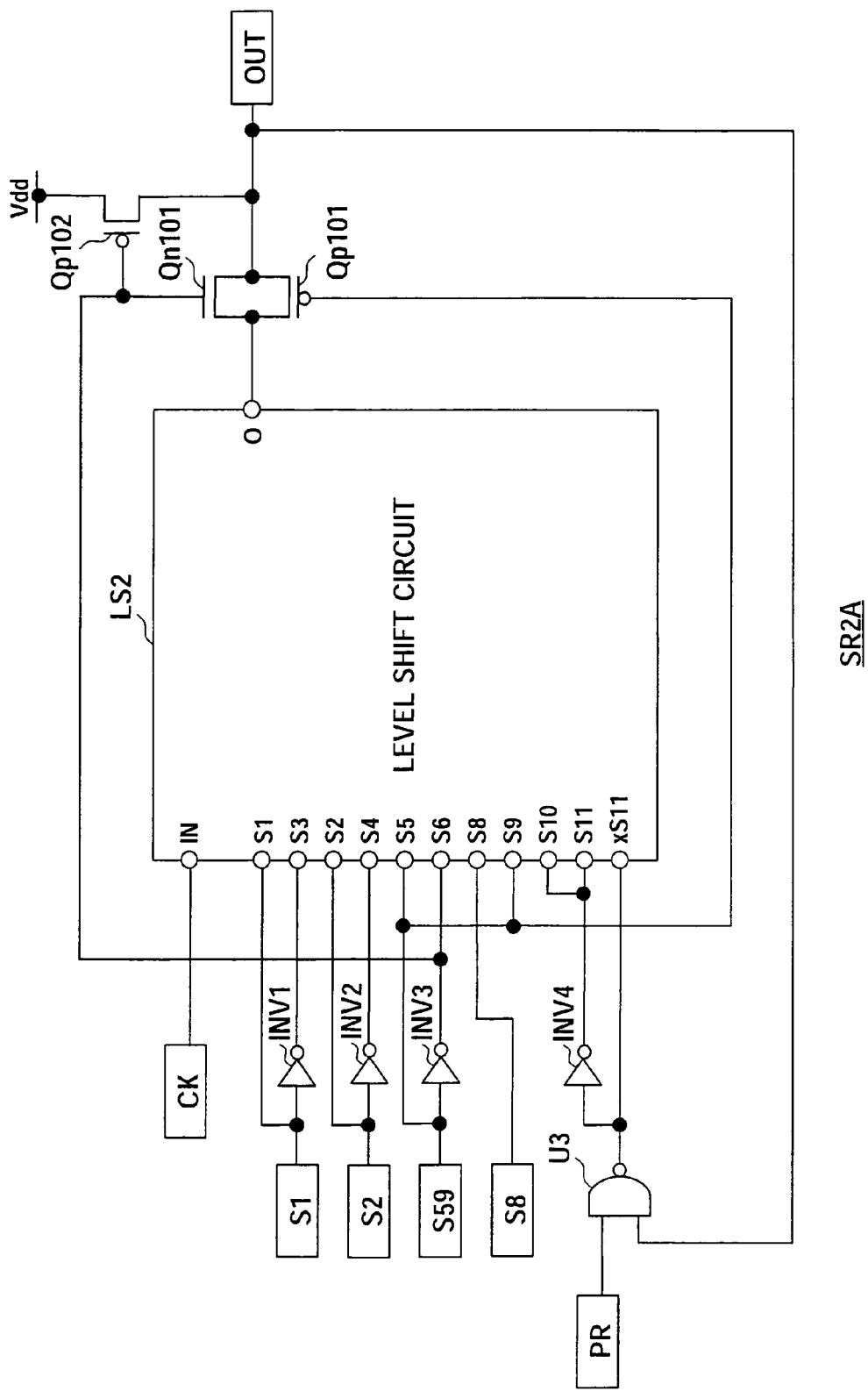
FIG. 30 is a diagram showing a first example of the configuration of a shift stage in the shift register shown in FIG. 29.

FIG. 30 is a diagram showing a first example of the configuration of the shift stage in the shift register shown in FIG. 29. A shift stage SR2A shown in FIG. 30 has a level shift circuit LS2, inverter circuits INV1 to INV4, a NAND circuit U3, p-type MOS transistors Qp101 and Qp102, and an n-type MOS transistor Qn101.

The NAND circuit U3 is an embodiment of the detection circuit of the present invention. The circuit configured by the p-type MOS transistors Qp101 and Qp102 and the n-type MOS transistor Qn101 is an embodiment of the output circuit of the present invention.

The level shift circuit LS2 shifts the level of the pulse signal included in one cycle of the clock signal CK and outputs the result when the signal output from the NAND circuit U3 is at the high level (Vin). The level shift circuit LS2 has the same configuration as that of for example the level shift circuit LS2A shown in FIG. 17 or the level shift circuit LS2B shown in FIG. 19. Note that the control signals are supplied from the outside, therefore the control circuit 10F is omitted.

The NAND circuit U3 computes the inverted OR logic of the input signal PR from the former stage with respect to the shift stage SR2A and the output signal OUT of the shift stage SR2A and outputs it as the control signal xS11. The output signal of the NAND circuit U3 becomes the high level (VDD) in the period during which the pulse of the low level (VSS) is input from the former stage as the input signal PR and the period during which the pulse of the low level (VSS) is output to the next stage as the output signal OUT.

The n-type MOS transistor Qn101 and the p-type MOS transistor Qp101 are connected in parallel and configure the transfer gate. This transfer gate is connected between the terminal for the output signal O of the level shift circuit LS2 and the terminal for the output signal OUT of the shift stage SR2A. The gate of the p-type MOS transistor Qp101 receives the control signal S5 as input, and the gate of the n-type MOS transistor Qn101 receives the control signal S6 as input.

The p-type MOS transistor Qp102 is connected between the terminal of the output signal OUT of the shift stage SR2A and the power supply line VDD. The gate of the p-type MOS transistor Qp102 receives the control signal S6 as input.

The inverter circuit INV1 inverts the logic of the control signal S1 input to the shift stage SR2A and generates the control signal S3. The inverter circuit INV2 inverts the logic of the control signal S2 input to the shift stage SR2A and generates the control signal S4. The inverter circuit INV3 inverts the logic of the control signal S59 input to the shift stage SR2A and generates the control signal S6. The inverter circuit INV4 inverts the logic of the control signal xS11 output from the NAND circuit U3 and generates the control signals S10 and S11.

The clock signal CK (CK1 or xCK1) input to the shift stage SR2A is input to the level shift circuit LS2 as the input signal IN. The control signal S59 input to the shift stage SR2A is input as the control signals S5 and S9 to the level shift circuit LS2. The control signal S8 input to the shift stage SR2A is input to the level shift circuit LS2 as the control signal S8 as it is.

In the shift stage SR2A shown in FIG. 30, when the control signal S59 is at the high level (VDD), the transfer gate configured by the n-type MOS transistor Qn101 and the p-type MOS transistor Qp101 turns off, and the p-type MOS transistor Qp102 turns on. Namely, in the period during which the voltages of the nodes NA and NB have not finished being set and the output signal O of the level shift circuit LS2 is in the unstable state, the constant voltage VSS is output to the next stage. On the other hand, when the control signal S59 is at the low level (VSS), the transfer gate (Qp101, Qn101) turns on, and the p-type MOS transistor Qp102 turns off. Namely, in the period during which the voltages of the nodes NA and NB have finished being set and the output signal O of the level shift circuit LS2 is set to the high level or low level, the output signal O of the level shift circuit LS1 is output to the next stage.

An explanation will be given of a second example of the configuration of the shift stage.

Figure 31:
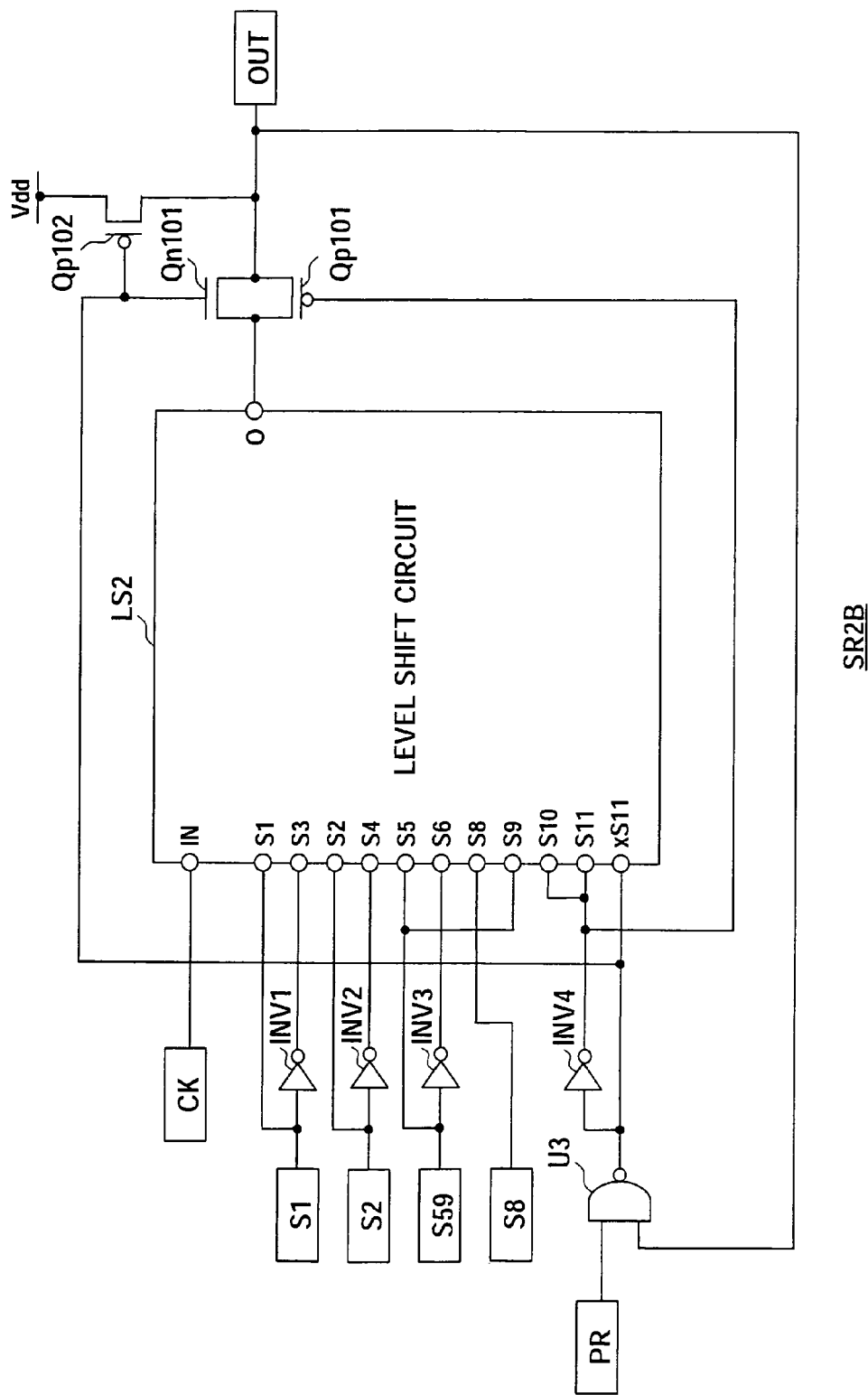
FIG. 31 is a diagram showing a second example of the configuration of a shift stage in the shift register shown in FIG. 29.

FIG. 31 is a diagram showing a second example of the configuration of the shift stage in the shift register shown in FIG. 29. A shift stage SR2B shown in FIG. 31 has a similar configuration as that of the shift stage SR2A shown in FIG. 30. The difference of the two resides in the control signals input to the gates of the p-type MOS transistors Qp101 and Qp102 and the n-type MOS transistor Qn101. Namely, in the shift stage SR2B, the control signal xS11 is input to the gates of the n-type MOS transistor Qn101 and the p-type MOS transistor Qp102, and the control signal S11 is input to the gate of the p-type MOS transistor Qp101.

According to the shift stage SR2B, when the control signal S11 is at the high level (VDD) and the control signal xS11 is at the low level (VSS), the transfer gate configured by the n-type MOS transistor Qn101 and the p-type MOS transistor Qp101 turns off, and the p-type MOS transistor Qp102 turns on. Namely, in the period during which the level shift operation is not carried out in the level shift circuit LS2, the constant voltage VSS is output to the next stage. On the other hand, when the control signal S11 is at the low level (VSS) and the control signal xS11 is at the high level (VDD), the transfer gate (Qp101, Qn101) turns on, and the p-type MOS transistor Qp102 turns off. Namely, in the period during which the level shift operation is carried out in the level shift circuit LS2, the output signal O of the level shift circuit LS2 is output to the next stage.

Next, an explanation will be given of a third example of the configuration of the shift stage.

Figure 32:
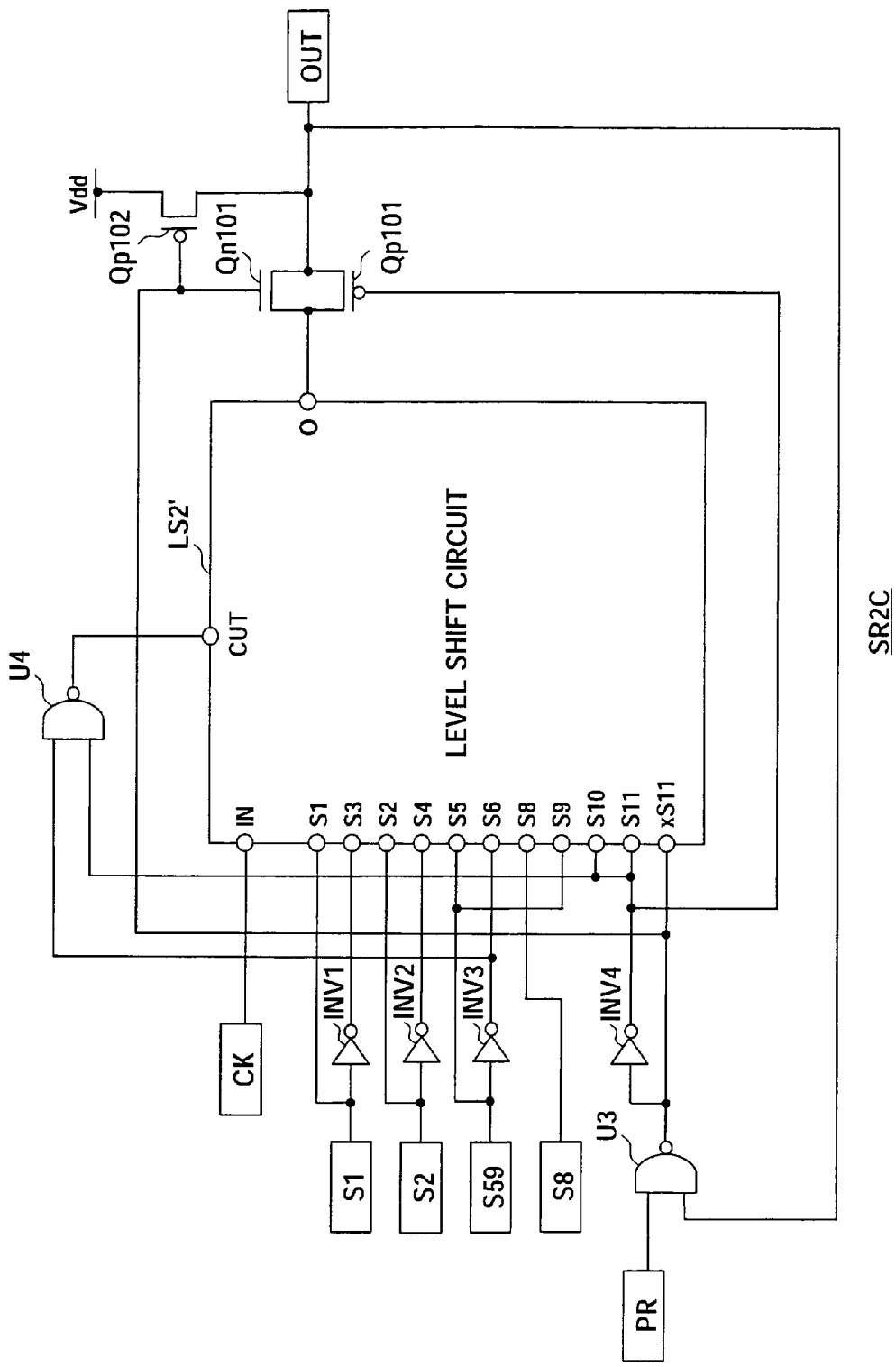
FIG. 32 is a diagram showing a third example of the configuration of a shift stage in the shift register shown in FIG. 29.

FIG. 32 is a diagram showing a third example of the configuration of the shift stage in the shift register shown in FIG. 29. The shift stage SR2C shown in FIG. 32 is obtained by replacing the level shift circuit LS2 (LS2A or LS2B) in the shift stage SR2B shown in FIG. 31 by LS2' (LS2C or LS2D) explained next and further adding a NAND circuit U4. The rest of the configuration is the same as that of the shift stage SR2B.

Figure 33:
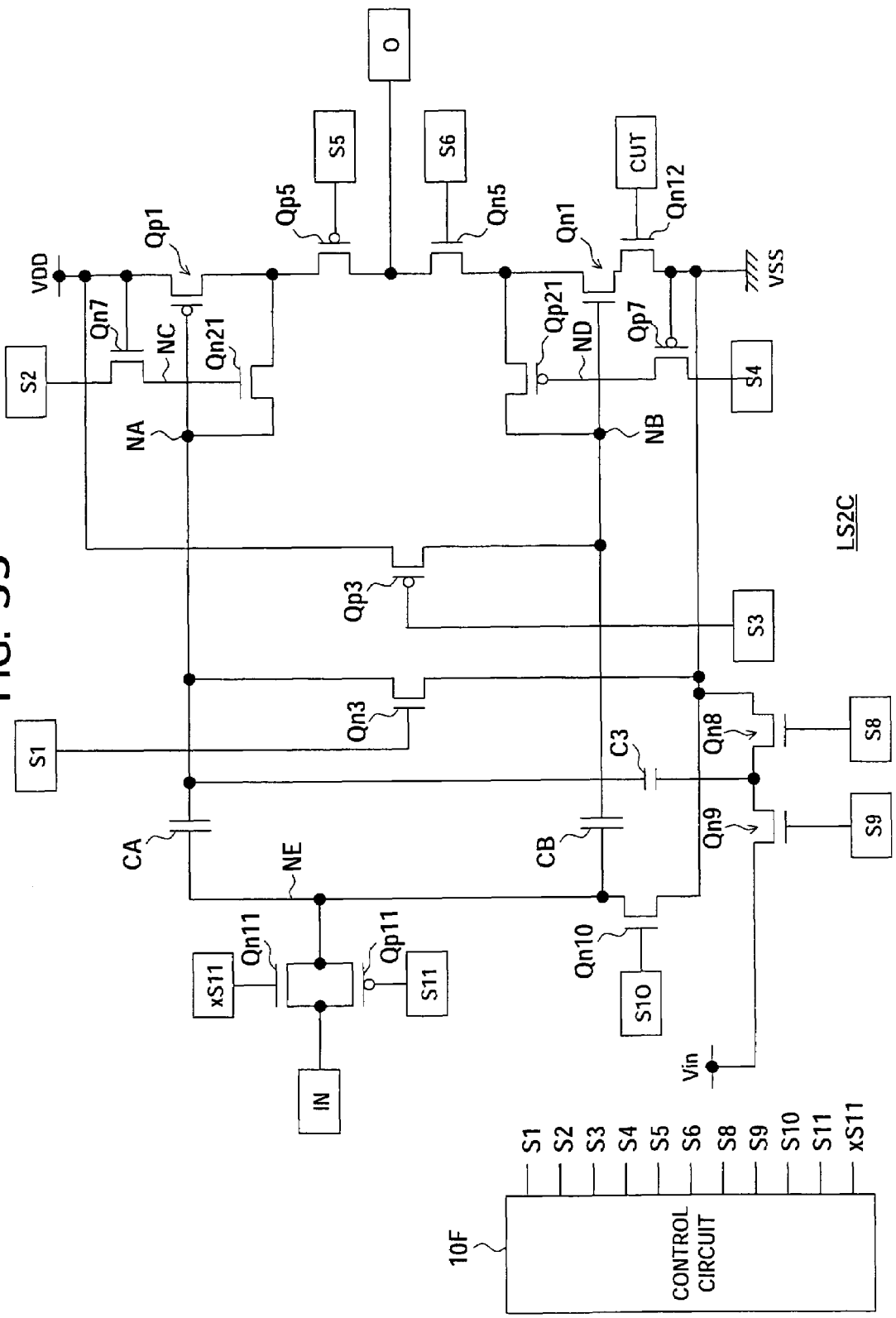
FIG. 33 is a diagram showing a first example of the configuration of a level shift circuit used in the shift stage shown in FIG. 32.

FIG. 33 is a diagram showing a first example of the configuration of the level shift circuit LS2'. The level shift circuit LS2C shown in FIG. 33 is obtained by adding the n-type MOS transistor Qn12 to the level shift circuit LS2A shown in FIG. 17. The rest of the components are the same as those of the level shift circuit LS2A. The n-type MOS transistor Qn12 is inserted in a route connecting the source of the n-type MOS transistor Qn1 and the power supply line VSS, and the control signal CUT is input to its gate.

Figure 34:
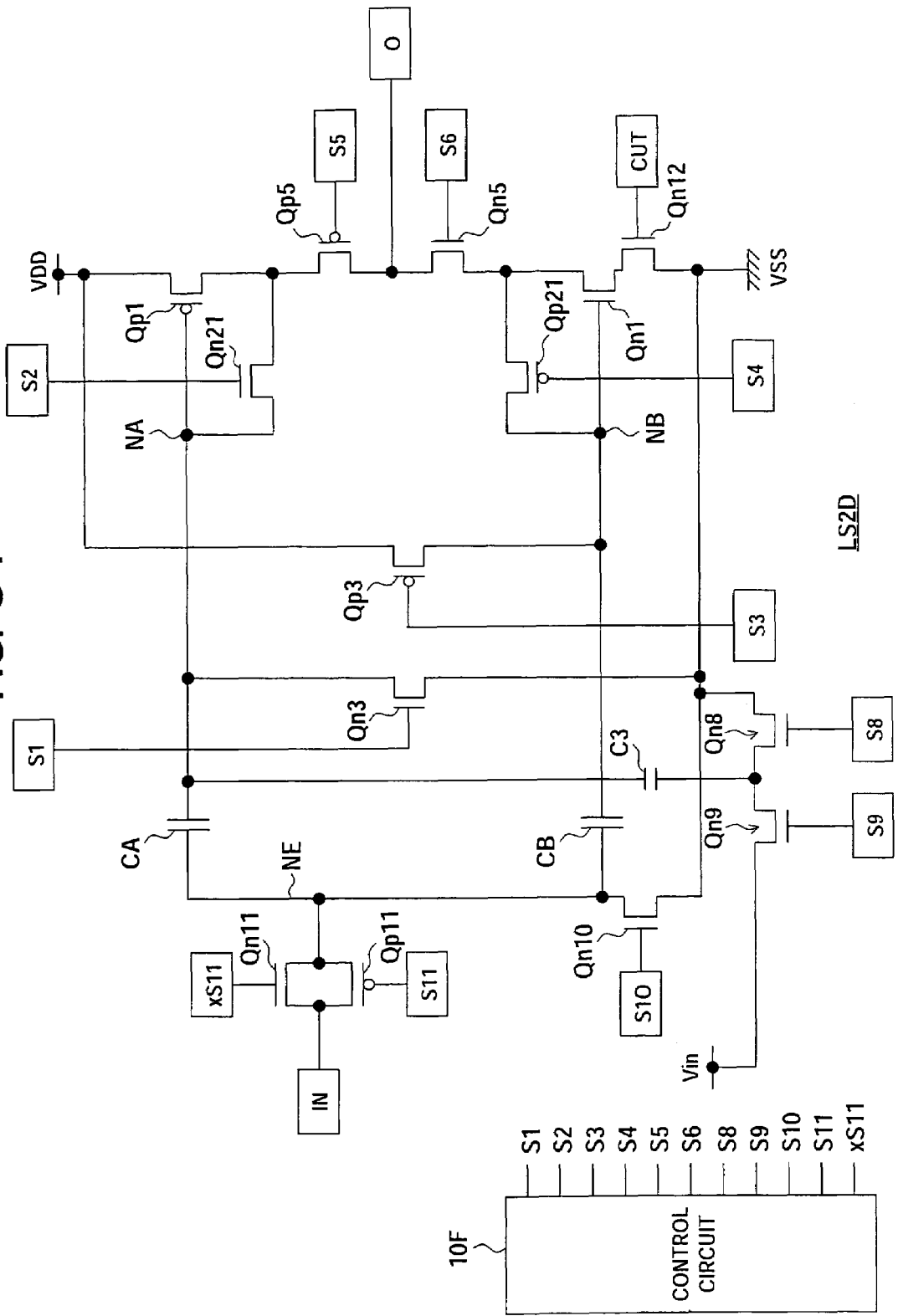
FIG. 34 is a diagram showing a second example of the configuration of a level shift circuit used in the shift stage shown in FIG. 32.

FIG. 34 is a diagram showing a second example of the configuration of the level shift circuit LS2'. The level shift circuit LS2D shown in FIG. 34 is obtained by adding the n-type MOS transistor Qn12 to the level shift circuit LS2B shown in FIG. 19. The rest of the components are the same as those of the level shift circuit LS2B. The n-type MOS transistor Qn12 is inserted in a route connecting the source of the n-type MOS transistor Qn1 and the power supply line VSS and receives as input the control signal CUT at its gate in the same way as the level shift circuit LS2C.

The NAND circuit U4 computes the inverted AND logic of the control signal S6 and the control signal S11 and supplies the result of computation as the control signal CUT to the level shift circuit LS2'.

When the control signal S6 is at the low level (VSS) or when the control signal S11 is at the low level (VSS), the control signal CUT output from the NAND circuit U4 becomes the high level (VDD), and the n-type MOS transistor Qn12 turns on. Namely, in the period during which the voltages of the nodes NA and NB are being set and the period during which the level shift operation is carried out in the level shift circuit LS2', the source of the n-type MOS transistor Qn1 is connected to the power supply line VSS. On the other hand, when the control signal S6 is at the high level (VDD) and the control signal S11 is at the high level (VDD), the control signal CUT output from the NAND circuit U4 becomes the low level (VSS), and the n-type MOS transistor Qn12 turns off. Namely, in the period during which the voltages of the nodes NA and NB are not being set and the level shift operation is not carried out in the level shift circuit LS2', the source of the n-type MOS transistor Qn1 is disconnected from the power supply line VSS. Accordingly, when it is not necessary to pass the current in the n-type MOS transistor Qn1, by disconnecting the source of the n-type MOS transistor Qn1 from the power supply line VSS, useless leakage current flowing in the n-type MOS transistor Qn1 is suppressed.

Next, an explanation will be given of the operation of the shift register according to the present embodiment having the above configuration with reference to FIG. 35.

Figure 35:
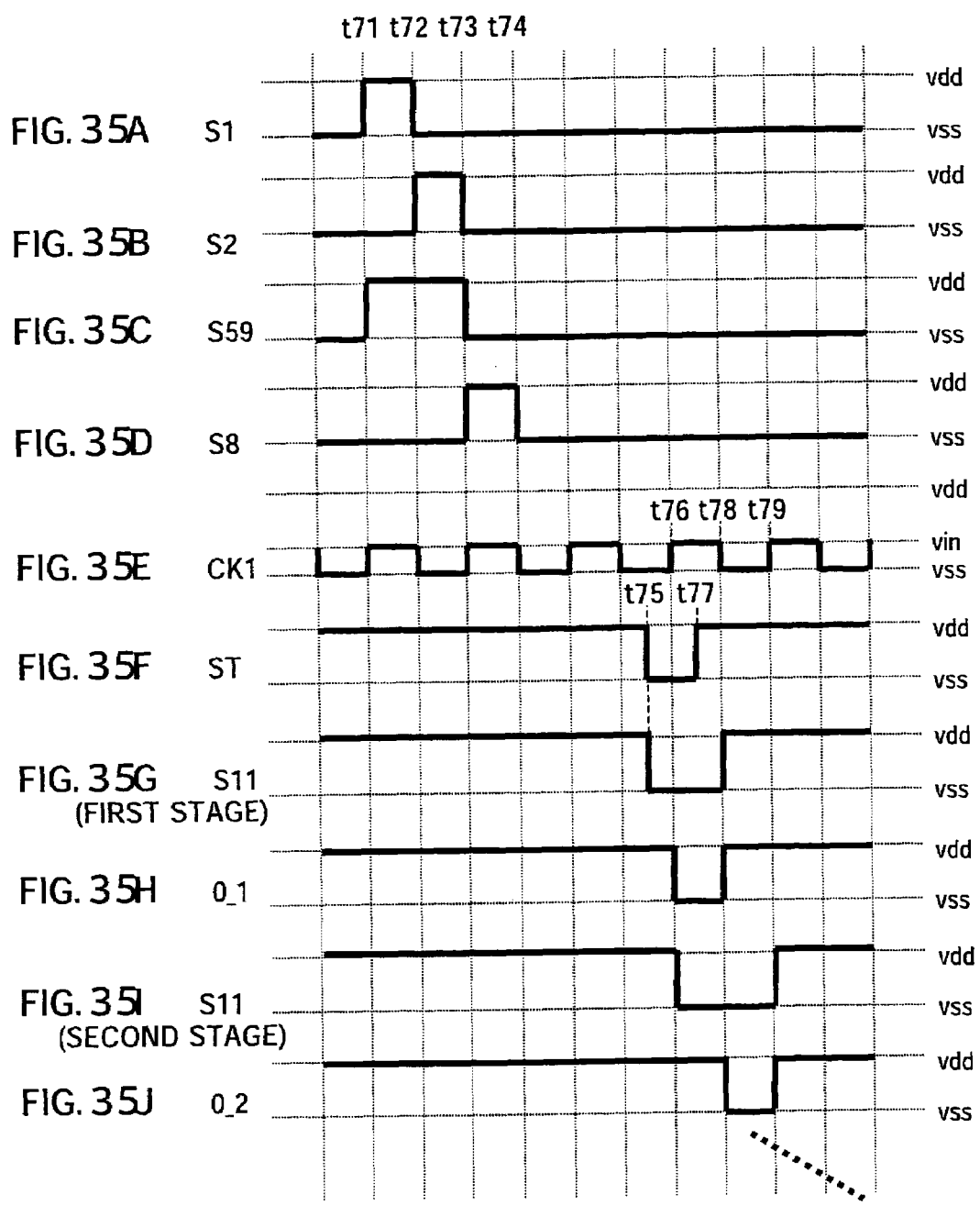
FIG. 35 is a diagram showing an example of signal waveforms of portions in the shift register shown in FIG. 29.

FIG. 35 is a diagram showing an example of signal waveforms of portions in the shift register according to the present embodiment. FIG. 35A shows the voltage waveform of the control signal S1. FIG. 35B shows the voltage waveform of the control signal S2. FIG. 35C shows the voltage waveform of the control signal S59. FIG. 35D shows the voltage waveform of the control signal S8. FIG. 35E shows the voltage waveform of the clock signal CK1. FIG. 35F shows the voltage waveform of the start signal ST. FIG. 35G shows the voltage waveform of the control signal S11 generated inside the shift stage SR2_1 in the first stage. FIG. 35H shows the output signal O_1 of the shift stage SR2_1 in the first stage. FIG. 35I shows the voltage waveform of the control signal S11 generated inside the shift stage SR2_2 in the second stage. FIG. 35J shows the output signal O_2 of the shift stage SR2_2 in the second stage.

In the period of the times t71 to t74 shown in FIG. 35, by the same operation as that at the times t41 to t44 shown in FIG. 18, the level shift circuit LS2 (LS2') included in each shift stage (SR2_1, SR2_2, . . . ) is initialized. Namely, in the first period (t71 to t72), the node NA is set at the voltage "VSS", and the node NB is set at the voltage "VDD". In the second period (t72 to t73), the node NA is set at the voltage "VDD−Vthp (Qp1)", and the node NB is set at the voltage "VSS+Vthn (Qn1)". In the sixth period (t73 to t74), the node NA is set at the voltage "VDD−Vthn (Qp1)−Vin".

In the initial state before the shift operation is carried out, assume that all of the input signals PR and output signals OUT of the shift stages (SR2_1, SR2_2, . . . ) have become the high level (VDD). In this case, the input signals PR and the output signals OUT of the shift stages become the high level (VDD), therefore all of the control signals S10 and S11 generated inside the shift stages become the high level (VDD). When the control signals S10 and S11 become the high level, the voltage "VSS" is supplied to the node NE of the level shift circuit. When the node NE becomes the voltage "VSS", as shown in FIG. 18, except the first and second periods (t71 to t73) for setting the voltages of the nodes NA and NB, the output signal O becomes the high level (VDD). In the first and second periods (t71 to t73) for setting the voltages of the nodes NA and NB, by turning off the transfer gate (Qn101, Qp101) connected to the output of the level shift circuit and turning on the p-type MOS transistor Qp102, the output signal OUT of the shift stage becomes the high level (VDD). Accordingly, in the initial state before the shift operation is carried out, the input/output signals of the shift stages are held at the high level (VDD).

When the initialization of the level shift circuit at times t71 to t74 ends, a pulse of the low level (VSS) is input to the shift stage SR2_1 in the first stage of the shift register as the start signal ST. This pulse is generated so as to become the low level (VSS) at the time of the rise (t76) of the clock signal CK1 from the low level (VSS) to the high level (VDD) as shown in for example FIG. 35F and has a pulse width becoming shorter than that in the period of one cycle of the clock signal CK1 (t75 to t77).

When the start signal ST becomes the low level (VSS), the control signal xS11 of the high level (VDD) is generated in the NAND circuit U3 included in the shift stage SR2_1 of the first stage, and the control signal S11 becomes the low level (FIG. 35G). When the control signal S11 becomes the low level (VSS), the clock signal CK1 is input to the node NE of the level shift circuit LS2 (LS2') included in the shift stage SR2_1 of the first stage. When the clock signal CK1 rises from the low level (VSS) to the high level (VDD) at the time t76, the output signal OUT (="O_1") of the level shift circuit LS2 (LS2') falls from the high level (VDD) to the low level (VSS) (FIG. 35H).

When the output signal O_1 of the shift stage SR2_1 in the first stage becomes the low level (VSS), the control signal xS11 of the high level (VDD) is generated in the shift stage SR2_2 of the second stage, and the control signal S11 becomes the low level (VSS) (FIG. 35I). When the control signal S11 becomes the low level (VSS), the clock signal xCK1 is input to the node NE of the level shift circuit LS2 (LS2') included in the shift stage SR2_2 of the second stage. The clock signal xCK1 becomes the low level (VSS) after the time t76, therefore the output signal OUT (="O_2") of the level shift circuit LS2 (LS2') becomes the high level (VDD) (FIG. 35J).

Even when the pulse of the low level (VSS) of the start signal ST ends at the time t77, the output signal OUT of the low level (VSS) is input to the NAND circuit U3 in the first shift stage SR2_1, therefore the output signal (control signal xS11) of the NAND circuit U3 is subsequently held at the high level (VDD), and the control signal S11 is held at the low level (FIG. 35G). Due to this, in the first shift stage SR2_1, the level shift operation is continued, and the output signal O_1 is held at the low level (FIG. 35H).

When the clock signal CK1 falls from the high level (Vin) to the low level (VSS) at the time t78, the output signal OUT of the level shift circuit LS2 (LS2') in the first shift stage SR2_1 rises from the low level (VSS) to the high level (VDD). When the output signal OUT becomes the high level (VDD), all of the input signals of the NAND circuit U3 become the high level (VDD), therefore the control signal xS11 output from the NAND circuit U3 becomes the low level (VSS), and the control signal S11 becomes the high level (VDD). Due to this, the level shift operation in the level shift circuit LS2 (LS2') is suspended. Thereafter, even if the clock signal CK1 rises from the low level (VSS) to the high level (VDD), the output signal O_1 of the shift stage SR2_1 in the first stage is held at the high level (VDD) as it is.

On the other hand, when the clock signal xCK1 rises from the low level (VSS) to the high level (VDD) at the time t78, the output signal O_2 of the shift stage SR2_2 receiving as input this clock signal xCK1 falls from the high level (VDD) to the low level (VSS) (FIG. 35J). By the output signal O_2 becoming the low level (VSS), the output signal (control signal xS11) of the NAND circuit U3 included in the second shift stage SR2_2 is subsequently held at the high level (VDD), and the control signal S11 is held at the low level (VSS) (FIG. 35I). For this reason, the level shift operation is continued in the second shift stage SR2_2. Hereinafter, pulses of the low level are successively propagated to latter shift stages in synchronization with the clock signals CK1 and xCK1.

As explained above, according to the present embodiment, the shift register can be configured by using the level shift circuit explained in the previous embodiments, therefore, in the same way as the 10th embodiment, the function as the shift register can be realized while performing a stable level shift operation without influence due to variation of the threshold voltages of the transistors.

Further, according to the present embodiment, the leakage current in the level shift circuit configuring each shift stage can be made very small, therefore the power consumption can be greatly reduced. Particularly, when use is made of the shift stage SR2C configured by the level shift circuit LS2' shown in FIG. 33 and FIG. 34, in the period during which it is not necessary to pass current in the n-type MOS transistor Qn1 (the period during which the input signal PR and the output signal OUT of the level shift circuit LS2' become the high level with no pulse and the control signal S6 is at the high level during for which the voltages of the nodes NA and NB are not set), the n-type MOS transistor Qn12 turns off, and the n-type MOS transistor Qn1 and the power supply line VDD are disconnected. Due to this, even in the case where voltages of the nodes NA and NB become unstable due to sudden noise, fluctuation of the power supply voltage, or the like, the leakage current flowing in the n-type MOS transistor Qn1 can be effectively blocked by the n-type MOS transistor Qn12.

Further, according to the present embodiment, the level shift circuit configuring each shift stage can perform a level shift operation even with a signal having a smaller amplitude than the threshold value of the transistor, therefore, in the same way as the 10th embodiment, the circuit can operate with a clock signal having a small amplitude.

Note that, in the above embodiments, inverter circuits INV1 to INV3 for generating control signals S3, S4, and S6 are provided in the individual shift stages, but these inverter circuits may be shared by a plurality of shift stages as well in the same way as the 10th embodiment. Due to this, the circuit elements can be reduced.

Further, in the above embodiments, four control signals (S1, S2, S59, S8) are required for initializing the level shift circuit, but some of these control signals can be generated based on other control signals according to a circuit having the same configuration as that of the circuit shown in for example FIG. 27. Due to this, the number of signals supplied from the outside for controlling the shift register can be decreased.

12th Embodiment

Next, an explanation will be given of a 12th embodiment of the present invention.

Figure 36:
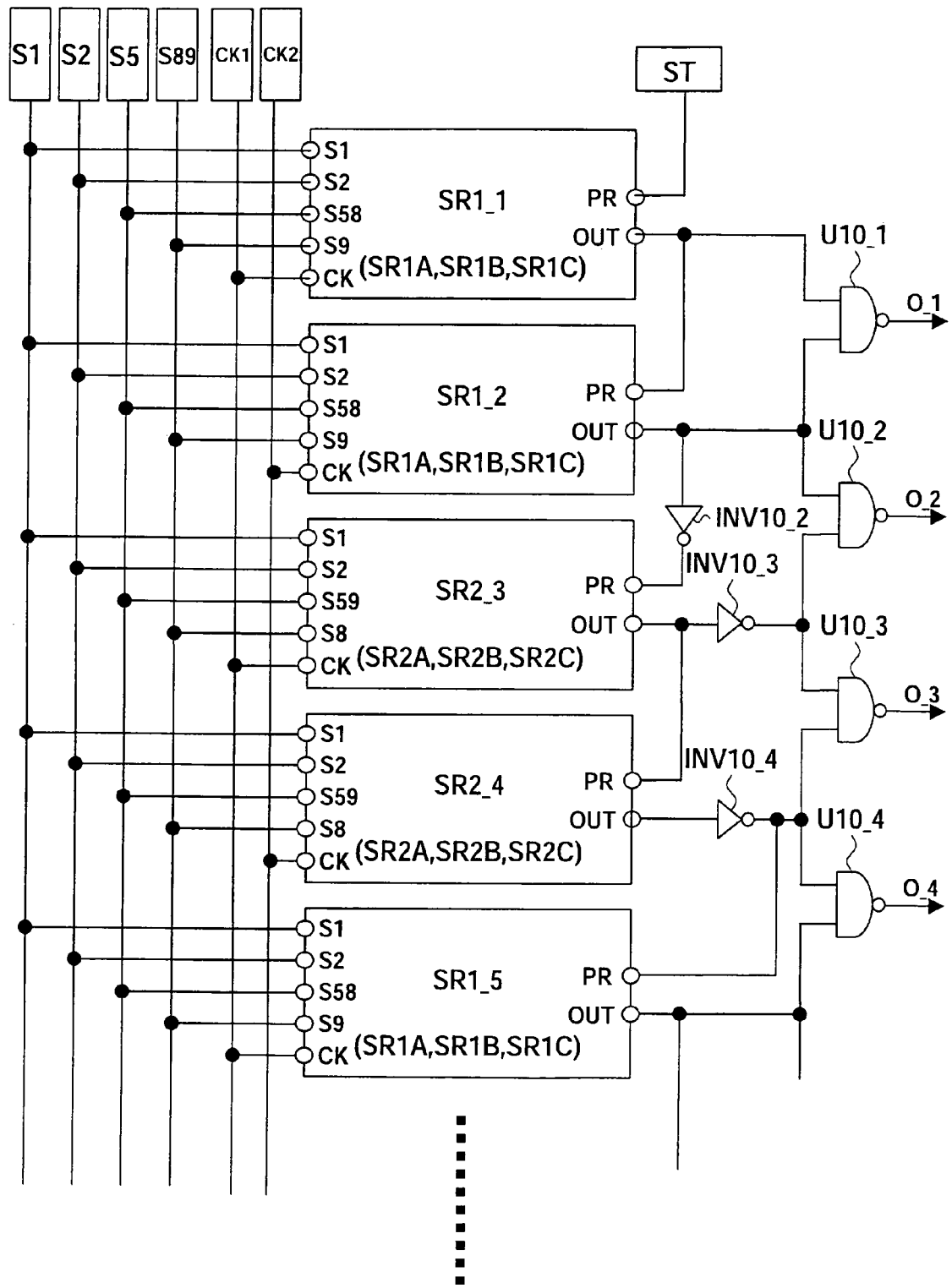
FIG. 36 is a diagram showing an example of the configuration of a shift register according to a 12th embodiment.

FIG. 36 is a diagram showing an example of the configuration of a shift stage according to the 12th embodiment of the present invention. The shift stage shown in FIG. 36 has a plurality of cascade-connected shift stages SR1_1, SR1_2, SR2_3, SR2_4, SR1_5, . . . , inverter circuits INV10_2, INV10_3, INV10_4, . . . , and NAND circuits U10_1, U10_2, U10_3, . . . .

Below, "k" is defined as an integer of 0 or more. A (4k+1)-th shift stage SR1_(4k+1) has the same configuration as that of for example the shift stage SR1A shown in FIG. 21, the shift stage SR1B shown in FIG. 22, or the shift stage SR1C shown in FIG. 23.

A (4k+2)-th shift stage SR1_(4k+2) has the same configuration as that of for example the shift stage SR1A shown in FIG. 21, the shift stage SR1B shown in FIG. 22, or the shift stage SR1C shown in FIG. 23.

A (4k+3)-th shift stage SR2_(4k+3) has the same configuration as that of for example the shift stage SR2A shown in FIG. 30, the shift stage SR2B shown in FIG. 31, or the shift stage SR2C shown in FIG. 32.

A (4k+4)-th shift stage SR2_(4k+4) has the same configuration as that of for example the shift stage SR2A shown in FIG. 30, the shift stage SR2B shown in FIG. 31, or the shift stage SR2C shown in FIG. 32.

The input terminals for the control signals S1, S2, S58, and S9 in the shift stage SR1_(4k+1) and the shift stage SR1_(4k+2) receive the control signals S1, S2, S5, and S89 as common input. In these shift stages, the control signal S5 is handled as the control signals S5 and S8, and the control signal S89 is handled as the control signal S9.

The input terminals for the control signals S1, S2, S59, and S8 in the shift stage SR2_(4k+3) and the shift stage SR2_(4k+4) receive the control signals S1, S2, S5, and S89 as common input. In these shift stages, the control signal S5 is handled as the control signals S5 and S9, and the control signal S89 is handled as the control signal S8.

The terminals for the clock signal CK in the odd number shift stages (SR1_1, SR2_3, SR1_5, SR2_7; . . . ) receive the clock signal CK1 as common input. The terminals for the clock signal CK in the even number shift stages (SR1_2, SR2_4, SR1_6, SR2_8, . . . ) receive the clock signal CK2 having the same cycle but shifted in phase with respect to the clock signal CK1 as common input.

The inverter circuit INV10_(4k+2) inverts the logic of the output signal OUT of the shift stage SR1_(4k+2) and generates the input signal PR of the next shift stage SR2_(4k+3).

The inverter circuit INV10_(4k+4) inverts the logic of the output signal OUT of the shift stage SR2_(4k+4) and generates the input signal PR of the next shift stage SR1_(4(k+1)+1).

The inverter circuit INV10_(4k+3) inverts the logic of the output signal OUT of the shift stage SR2_(4k+3).

The NAND circuit U10_(4k+1) computes the inverted AND logic of output signals OUT the shift stage SR1_(4k+1) and the shift stage SR1_(4k+2) and outputs the result of computation as the output signal O_(4k+1). Namely, when pulse signals of the high level (VDD) are output from both of the shift stage SR1_(4k+1) and the shift stage SR1_(4k+2), the NAND circuit U10_(4k+1) outputs the pulse signal of the low level (VSS).

The NAND circuit U10_(4k+2) computes the inverted AND logic between the output signal OUT of the shift stage SR1_(4k+2) and the signal obtained by the inversion of logic of the output signal OUT of the shift stage SR2_(4k+3) at the inverter circuit INV10_(4k+3) and outputs the result of computation as the output signal O_(4k+2). Namely, when the pulse signal of the high level (VDD) is output from the shift stage SR1_(4k+2) and the pulse signal of the low level (VSS) is output from the shift stage SR2_(4k+3), the NAND circuit U10_(4k+2) outputs the pulse signal of the low level (VSS).

The NAND circuit U10_(4k+3) computes the inverted AND logic between the signal obtained by the inversion of the logic of the output signal OUT of the shift stage SR2_(4k+3) at the inverter INV10_(4k+3) and the signal obtained by the inversion of the logic of the output signal OUT of the shift stage SR2_(4k+4) at the inverter circuit INV10_(4k+4) and outputs the result of computation as the output signal O_(4k+3). Namely, when the pulse signal of the low level (VSS) is output from the shift stage SR2_(4k+3) and the pulse signal of the low level (VSS) is output from the shift stage SR2_(4k+4), the NAND circuit U10_(4k+3) outputs the pulse signal of the low level (VSS).

The NAND circuit U10_(4k+4) computes the inverted AND logic between the signal obtained by the inversion of the logic of the output signal OUT of the shift stage SR2_(4k+4) at the inverter INV10_(4k+4) and the output signal OUT of the shift stage SR1_(4k+1)+1) and outputs the result of computation as the output signal O_(4k+4). Namely, when the pulse signal of the low level (VSS) is output from the shift stage SR2_(4k+4) and the pulse signal of the high level (VDD) is output from the shift stage SR1_(4(k+1)+1), the NAND circuit U10_(4k+4) outputs a pulse signal of the low level (VSS).

The connection configuration described above can be explained alternatively as follows.

First, one of the two cascade-connected shift stages SR1_i and SR1_(i+1) receives as input the clock signal CK1, and the other receives as input the clock signal CK2. For example, the second shift stage SR1_2 receives as input the clock signal CK2, and the third shift stage SR2_3 (first shift stage SR1_1) cascade-connected to this receives as input the clock signal CK1.

Further, in two shift stages separated by one shift stage, one shift stage (SR1A, SR1B, SR1C) includes the NOR circuit U1, and the other shift stage (SR2a, SR2B, SR2C) includes the NAND circuit U3. In the period during which the clock signal CK1 (CK2) of the low level (VSS) is shifted in level in the level shift circuit LS1 (LS1') and the output signal O of the high level (VDD) is output, the NOR circuit U1 outputs the signal (control signal S11) of the low level (VSS). The period during which the NOR circuit U1 outputs the signal of the low level (VSS) indicates the period during which the pulse of the high level (VDD) is input as the input signal PR from the former stage or the period during which the pulse of the high level (VDD) is output to the next stage as the output signal OUT. In this period, the transfer gate (Qn11, Qp11) inside the level shift circuit LS1 (LS1') turns on, therefore the level shift operation of the shift stage (SR1A, SR1B, SR1C) including the NOR circuit U1 becomes valid. On the other hand, in the period during which the clock signal CK1 (CK2) of the high level (VDD) is shifted in level in the level shift circuit LS2 (LS2') and the output signal O of the low level (VSS) is output, the NAND circuit U3 outputs the signal (control signal xS11) of the high level (VDD). The period during which the NAND circuit U3 outputs the signal of the high level (VDD) indicates the period during which the pulse of the low level (VSS) is input from the former stage as the input signal PR or the period during which the pulse of the low level (VSS) is output to the next stage as the output signal OUT. In this period, the transfer gate (Qn11, Qp11) inside the level shift circuit LS2 (LS2') turns on, therefore the level shift operation of the shift stage (SR2A, SR2B, SR2C) including the NAND circuit U3 becomes valid.

Further, both of the shift stage SR1_(4k+1) receiving as input the clock signal CK1 and the shift stage SR1_(4k+2) in the latter stage thereof are shift registers (SR1A, SR1B, SR1C) having the NOR circuits U1 inside these. For this reason, both of these two shift stages generate pulse signals of the high level (VDD) by the level shift in the level shift circuit LS1 (LS1') by exactly the amount of one cycle of the clock signal (CK1 or CK2) of the low level (VSS). In the same way, both of the shift stage SR2_(4k+3) receiving as input the clock signal CK2 and the shift stage SR2_(4k+4) in the latter stage thereof are shift registers (SR2A, SR2B, SR2C) having NAND circuits U3 inside these. For this reason, both of these two shift stages generate pulse signals of the low level (VSS) by the level shift in the level shift circuit LS2 (LS2') by exactly the amount of one cycle of the clock signal (CK1 or CK2) of the high level (Vin).

In addition, the phase relationship between the clock signal CK1 and the clock signal CK2 become as follows. Namely, when the clock signal CK2 is at the high level (Vin), the clock signal CK1 changes from the high level (Vin) to the low level (VSS).

Next, an explanation will be given of the operation of the shift register according to the present embodiment having the above configuration with reference to FIG. 37.

Figure 37:
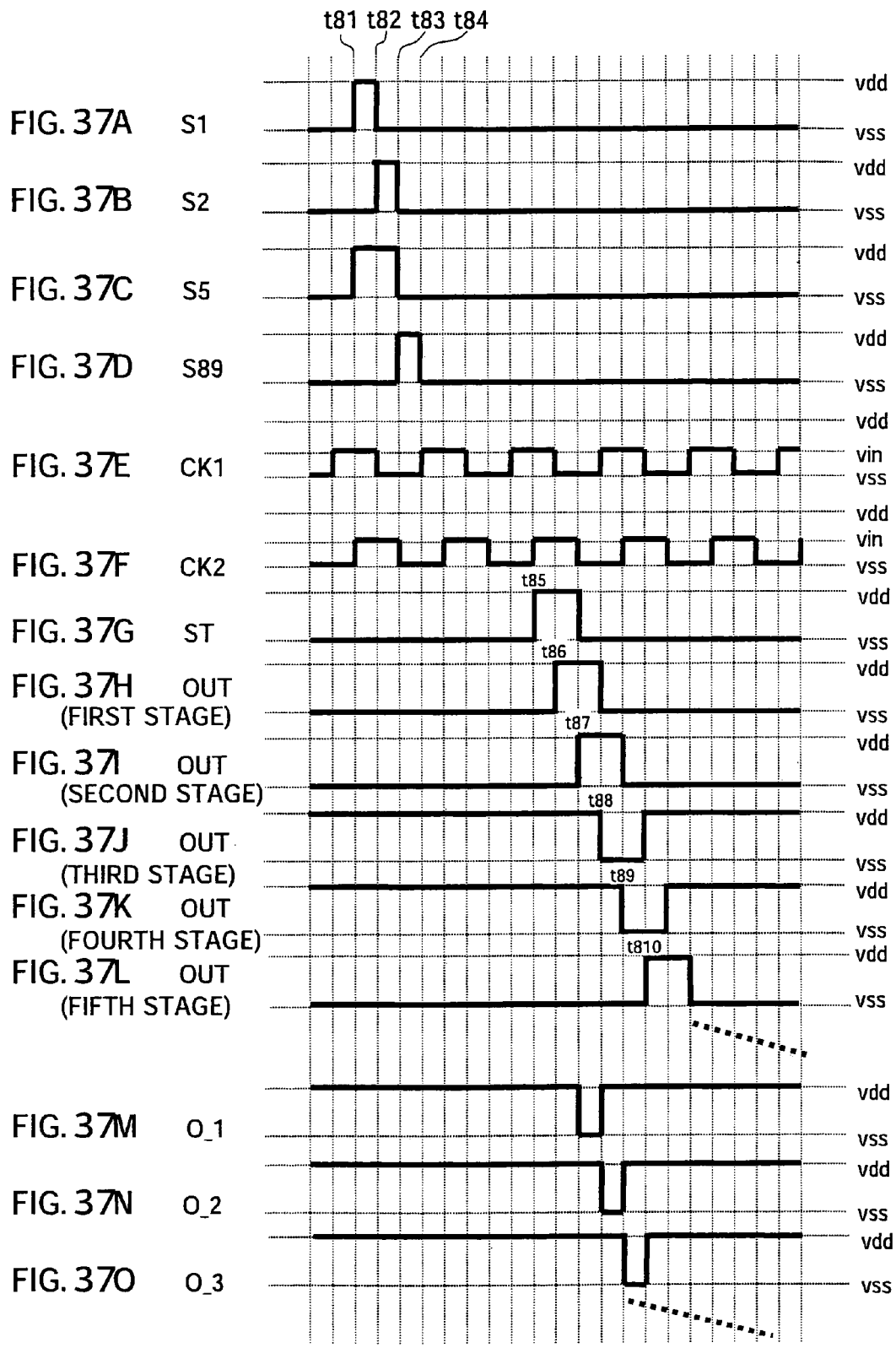
FIG. 37 is a diagram showing an example of signal waveforms of portions in the shift register shown in FIG. 36.

FIG. 37 is a diagram showing an example of signal waveforms of portions in the shift register shown in FIG. 36. FIG. 37A shows the voltage waveform of the control signal S1. FIG. 37B shows the voltage waveform of the control signal S2. FIG. 37C shows the voltage waveform of the control signal S5. FIG. 37D shows the voltage waveform of the control signal S89. FIG. 37E shows the voltage waveform of the clock signal CK1. FIG. 37F shows the voltage waveform of the clock signal CK2. FIG. 37G shows the voltage waveform of the start signal ST. FIGS. 37H to 37L show voltage waveforms of output signals OUT output from shift stages in the first stage to the fifth stage. FIGS. 37M to 37O show voltage waveforms of output signals O_1 to O_3.

In the period of the times t81 to t84 shown in FIG. 37, by the same operation as that at the times t41 to 44 shown in FIG. 15 and FIG. 18, the level shift circuit LS1 (LS1') included in the shift stage (SR1_1, SR1_2, . . . ) is initialized. Namely, in the first period (t81 to t82), in the second period (t82 to t83) during which the node NA is set at the voltage "VSS" and the node NB is set at the voltage "VDD", the node NA is set at the voltage "VDD−Vthp (Qp1)", and the node NB is set at the voltage "VSS+Vthn (Qn1)". In the sixth period (t83 to t84), the node NB is set at the voltage "VSS+Vthn (Qn1)+Vin", or the node NA is set at the voltage "VDD−Vthp (Qp1)−Vin".

In the initial state before the shift operation is carried out, assume that all of the input signals PR and the output signals OUT of the shift stages SR1_(4k+1) and SR1_(4k+2) have become the low level (VSS), and all of input signals PR and output signals OUT of the shift stages. SR2_(4k+3) and SR2_(4k+4) have become the high level (VDD).

In this case, in the shift stages SR1_(4k+1) and SR1_(4k+2), the input signal PR and the output signal OUT become the low level (VSS), therefore all of the control signals S10 and S11 generated in the NOR circuits U1 inside shift stages become the high level (VDD). When the control signals S10 and S11 become the high level, the voltage "Vin" is supplied to the node NE of the level shift circuit LS1 (LS1'). When the node NE becomes the voltage "Vin", as shown in FIG. 15, except the first and second periods (t81 to t83) for setting the voltages of the nodes NA and NB, the output signal O becomes the low level (VSS). In the first and second periods (t81 to t83) for setting the voltages of the nodes NA and NB, by turning off the transfer gate (Qn101, Qp101) connected to the output of the level shift circuit LS1 (LS1') and turning on the n-type MOS transistor Qn102, the output signal OUT of the shift stage becomes the low level (VSS). Accordingly, in the initial state before the shift operation is carried out, the input/output signals of the shift stages SR1_(4k+1) and SR1_(4k+2) are held at the low level (VSS).

Further, in this case, in the shift stages SR2_(4k+3) and SR2_(4k+4), the input signals PR and output signals OUT become the high level (VDD), therefore all of the control signals S10 and S11 generated in NAND circuits U3 inside the shift stages become the high level (VDD). When the control signals S10 and S11 become the high level, the voltage "VSS" is supplied to the node NE of the level shift circuit LS2 (LS2'). When the node NE becomes the voltage "VSS", as shown in FIG. 18, except the first and second periods (t81 to t83) for setting the voltages of the nodes NA and NB, the output signal O becomes the high level (VDD). In the first and second periods (t81 to t83) for setting the voltages of the nodes NA and NB, by turning off the transfer gate (Qn101, Qp101) connected to the output of the level shift circuit LS2 (LS2') and turning of the p-type MOS transistor Qp102, the output signal OUT of the shift stage becomes the high level (VDD). Accordingly, in the initial state before the shift operation is carried out, the input/output signals of the shift stages SR2_(4k+3) and SR2_(4k+4) are held at the high level (VDD).

When the initialization of the level shift circuit at times t81 to t84 ends, the pulse of the high level (VDD) is input as the start signal ST to the first shift stage SR1_1 of the shift register (time t85). This pulse is synchronized with the clock signal CK2 as shown in for example FIG. 37G. It is generated so as to become the high level (VDD) at the time of the fall (t86) of the clock signal CK1 from the high level (Vin) to the low level (VSS) and has a shorter pulse width than that in the period of one cycle of the clock signal CK1 (t85 to t87).

When the start signal ST becomes high level (VDD), the control signal S11 of the low level (VSS) is generated in the NOR circuit U1 included in the first shift stage SR1_1, and the clock signal CK1 is input to the node NE of the level shift circuit LS1 (LS1') thereof. When the clock signal CK1 falls from the high level (Vin) to the low level (VSS) at the time t86, the output signal OUT of the shift stage SR1_1 rises from the low level (VSS) to the high level (VDD) (FIG. 37H).

When the output signal OUT of the first shift stage SR1_1 becomes the high level (VDD), the control signal S11 of the low level (VSS) is generated in the NOR circuit U1 included in the second shift stage SR1_2, and the clock signal CK2 is input to the node NE of the level shift circuit LS1 (LS1'). The clock signal CK2 is at the high level (Vin) at the time t86, therefore the output signal OUT of the second shift stage SR1_2 is at the low level (VSS) as it is (FIG. 37I).

Even after the pulse of the high level (VDD) of the start signal St ends at the time t87, its own output signal OUT of the high level (VDD) is input to the NOR circuit U1 in the first shift stage SR1_1, therefore the output signal (control signal S11) of the NOR circuit U1 is subsequently held at the low level (VSS). Due to this, in the first shift stage SR1_1, the level shift operation is continued, and the output signal OUT thereof is held at the high level (FIG. 37H).

Further, at the time t87, when the clock signal CK2 rises from the high level (Vin) to the low level (VSS), the output signal OUT of the second shift stage SR1_2 rises from the low level (VSS) to the high level (VDD) (FIG. 37I). When the output signal OUT of the second shift stage SR1_2 becomes the high level (VDD), the pulse of the low level (VSS) is input to the third shift stage SR2_3 via the inverter circuit INV10_2 as the input signal PR. For this reason, the control signal xS11 of the high level (VDD) is generated in the NAND circuit U3 included in the third shift stage SR2_3, and the clock signal CK1 is input to the node NE of the level shift circuit LS2 (LS2') thereof. The clock signal CK1 is at the low level (VSS) as it is at the time t87, therefore the output signal OUT of the third shift stage SR2_3 is at the high level (VDD) as it is (FIG. 3J).

When the clock signal CK1 rises from the low level (VSS) to the high level (Vin) at the time t88, the output signal OUT of the level shift circuit LS1 (LS1') in the first shift stage SR1_1 falls from the high level (VDD) to the low level (VSS). When the output signal OUT becomes the low level (VSS), all of the input signals of the NOR circuits U1 become the low level (VSS), therefore the control signal S11 output from the NOR circuit U1 becomes the high level (VDD). When the control signal S11 becomes the high level (VDD), the level shift operation in the level shift circuit LS1 (LS1') is suspended. Thereafter, even when the clock signal CK1 falls from the high level (Vin) to the low level (VSS), the output signal OUT of the first shift stage SR1_1 is held at the low level (VSS) as it is.

On the other hand, even when the output signal OUT of the first shift stage SR1_1 becomes the low level (VSS) at the time t88, its own output signal OUT of the high level (VDD) is input to the NOR circuit U1 in the second shift stage SR1_2, therefore the output signal (control signal S11) of the NOR circuit U1 is subsequently held at the low level (VSS). Due to this, the level shift operation is continued in the second shift stage SR1_2, and the output signal OUT thereof is held at high level (FIG. 37I).

Further, when the clock signal CK1 rises at the time t88, the output signal OUT of the third shift stage SR2_3 falls from the high level (VDD) to the low level (VSS) (FIG. 37J). When this output signal OUT is input to the fourth shift stage SR2_4, the control signal xS11 of the high level (VDD) is generated in the NAND circuit U3 in the internal portion thereof, and the clock signal CK2 is input to the node NE of the level shift circuit LS2 (LS2'). The clock signal CK2 is at the low level (VSS) at the time t88, therefore the output signal OUT of the fourth shift stage SR2_4 is held at the high level (VDD) as it is (FIG. 37K).

When the clock signal CK2 rises from the low level (VSS) to the high level (Vin) at the time t89, the output signal OUT of the level shift circuit LS1 (LS1') in the second shift stage SR1_2 falls from the high level (VDD) to the low level (VSS). When the output signal OUT becomes the low level (VSS), all of input signals of the NOR circuits U1 become the low level (VSS), therefore control signals S11 of the NOR circuits U1 become the high level (VDD). When the control signal S11 becomes the high level (VDD), the level shift operation in the level shift circuit LS1 (LS1') is suspended. Thereafter, even when the clock signal CK2 falls from the high level (Vin) to the low level (VSS), the output signal OUT of the second shift stage SR1_2 is held at the low level (VSS) as it is.

On the other hand, even when the output signal OUT of the second shift stage SR1_2 becomes the low level (VSS) at the time t89, its own output signal OUT of the low level (VSS) is input to the NAND circuit U3 in the third shift stage SR2_3, therefore the output signal (control signal xS11) of the NAND circuit U3 is subsequently held at the high level (VDD). Due to this, the level shift operation is continued in the third shift stage SR2_3, and the output signal OUT thereof is held at the low level (FIG. 37J).

Further, when the clock signal CK2 rises at the time t89, the output signal OUT of the fourth shift stage SR2_3 falls from the high level (VDD) to the low level (VSS) (FIG. 37K). When this output signal OUT is input to the fifth shift stage SR1_5 via the inverter circuit INV10_4, the control signal S11 of the low level (VSS) is generated in the NOR circuit U1 inside that, and the clock signal CK1 is input to the node NE of the level shift circuit LS1 (LS1'). The clock signal CK1 is at the high level (VDD) at the time t89, therefore the output signal OUT of the fifth shift stage SR1_5 is at the low level (VSS) as it is (FIG. 37L). Thereafter, by the same operation, pulses of the high level or low level are successively propagated to shift stages in the latter stages in synchronization with the clock signals CK1 and CK2.

The output signals O_1, O_2, O_3, successively become the low level at the timing when both of the two cascade-connected shift stages output pulse signals. For example, in the period (t87 to t88) during which pulses of the high level are output from first and second shift stages, the output signal O_1 becomes the low level (FIG. 37M). In the period during which the pulse of the high level is output from the second shift stage and the pulse of the low level is output from the third shift stage (t88 to t89), the output signal O_2 becomes the low level (FIG. 37N). In the period (t89 to t810) during which the pulses of the low level are output from the third and fourth shift stages, the output signal O_3 becomes the low level.

As explained above, according to the present embodiment, pulse signals can be shifted in synchronization with the rise and fall of the clock signals CK1 and CK2 shifted in phase. For this reason, in comparison with the shift registers shown in FIG. 20 and FIG. 29 each using a single clock signal, even when the frequencies of the clock signals CK1 and CK2 are lowered to half, the pulse signal can be shifted at a speed equivalent to that of them. By lowering the frequency of the clock signal, the power uselessly consumed due to the charging and discharging of parasitic capacitance of the lines for transmitting the clock signal is reduced, so the power consumption can be reduced. Further, the load of the circuit for driving the clock signal becomes smaller, therefore the circuit size can be reduced.

Next, an explanation will be given of another example of the configuration of the shift register according to the present embodiment.

Figure 38:
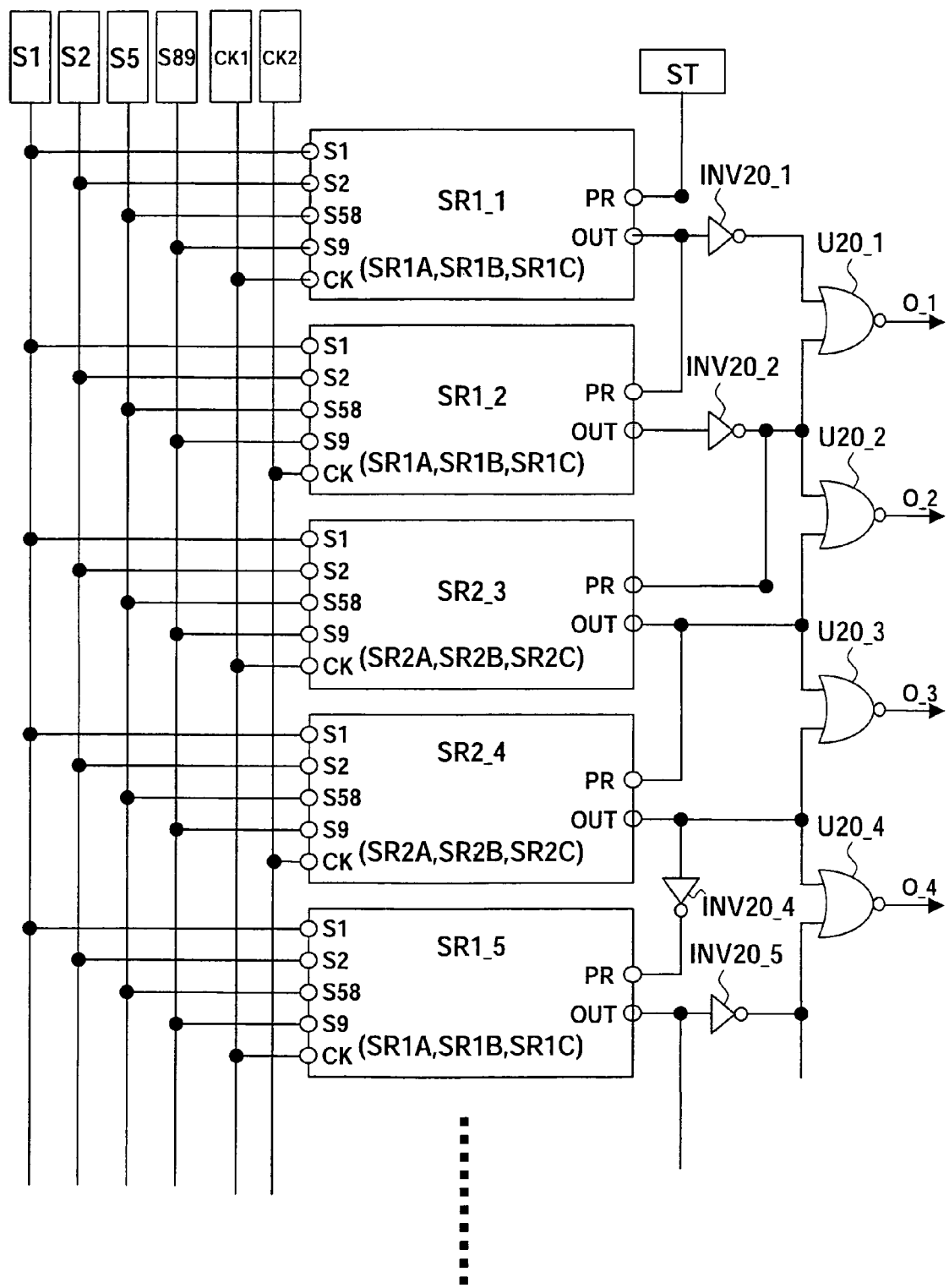
FIG. 38 is a diagram showing another example of the configuration of a shift register according to the 12th embodiment.

FIG. 38 is a diagram showing another example of the configuration of the shift register according to the present embodiment. Output signals O_1, O_2, . . . become pulse signals of the high level.

The shift register shown in FIG. 38 has a plurality of cascade-connected shift stages SR1_1, SR1_2, SR2_3, SR2_4, SR1_5, . . . , inverter circuits INV20_1, INV10_2, INV10_4, . . . , and NOR circuits U20_1, U20_2, U20_3, . . . .

The shift stages SR1_1, SR1_2, SR2_3, SR2_4, SR1_5, . . . are the same as the previously explained components having the same notations in the shift register shown in FIG. 29. Also, the connection configuration is the same as that of the shift register shown in FIG. 29.

The inverter circuit INV20_(4k+1) inverts the logic of the output signal OUT of the shift stage SR1_(4k+1).

The inverter circuit INV20_(4k+2) inverts the logic of the output signal OUT of the shift stage SR1_(4k+2) and generates the input signal PR of the next shift stage SR2_(4k+3).

The inverter circuit INV20_(4k+4) inverts the logic of the output signal OUT of the shift stage SR2_(4k+4) and generates the input signal PR of the next shift stage SR1_(4(k+1)+1).

The NOR circuit U20_(4k+1) computes the inverted OR logic between the signal obtained by inverting the logic of the output signal of the shift stage SR1_(4k+1) at the inverter circuit INV20_(4k+1) and the signal obtained by inverting the logic of the output signal OUT of the shift stage SR1_(4k+2) at the inverter circuit INV20_(4k+2) and outputs the result of computation as the output signal O_(4k+1). Namely, when the pulse signals of the high level (VDD) are output from both of the shift stage SR1_(4k+1) and the shift stage SR1_(4k+2), the NOR circuit U20_(4k+1) outputs the pulse signal of the high level (VDD).

The NOR circuit U20_(4k+2) computes the inverted OR logic between the signal obtained by inverting the logic of the output signal OUT of the shift stage SR1_(4k+2) at the inverter circuit INV20_(4k+2) and the output signal OUT of the shift stage SR2_(4k+3) and outputs the result of computation as the output signal O_(4k+2). Namely, when the pulse signal of the high level (VDD) is output from the shift stage SR1_(4k+2) and the pulse signal of the low level (VSS) is output from the shift stage SR2_(4k+3), the NOR circuit U20_(4k+2) outputs the pulse signal of the high level (VDD).

The NOR circuit U20_(4k+3) computes the inverted OR logic between the output signal OUT of the shift stage SR2_(4k+3) and the output signal OUT of the shift stage SR2_(4k+4) and outputs the result of computation as the output signal O_(4k+3). Namely, when the pulse signal of the low level (VSS) is output from the shift stage SR2_(4k+3) and the pulse signal of the low level (VSS) is output from the shift stage SR2_(4k+4), the NOR circuit U20_(4k+3) outputs the pulse signal of the high level (VDD).

The NOR circuit U20 (4k+4) computes the inverted OR logic between the output signal OUT of the shift stage SR2_(4k+4) and the signal obtained by inverting the logic of the output signal OUT of the shift stage SR1_(4(k+1)+1) at the inverter circuit. INV20_(4(k+1)+1) and outputs the result of computation as the output signal O_(4k+4). Namely, when the pulse signal of the low level (VSS) is output from the shift stage SR2_(4k+4) and the pulse signal of the high level (VDD) is output from the shift stage SR1_(4(k+1)+1), the NOR circuit U20(4k+4) outputs the pulse signal of the high level (VDD).

Figure 39:
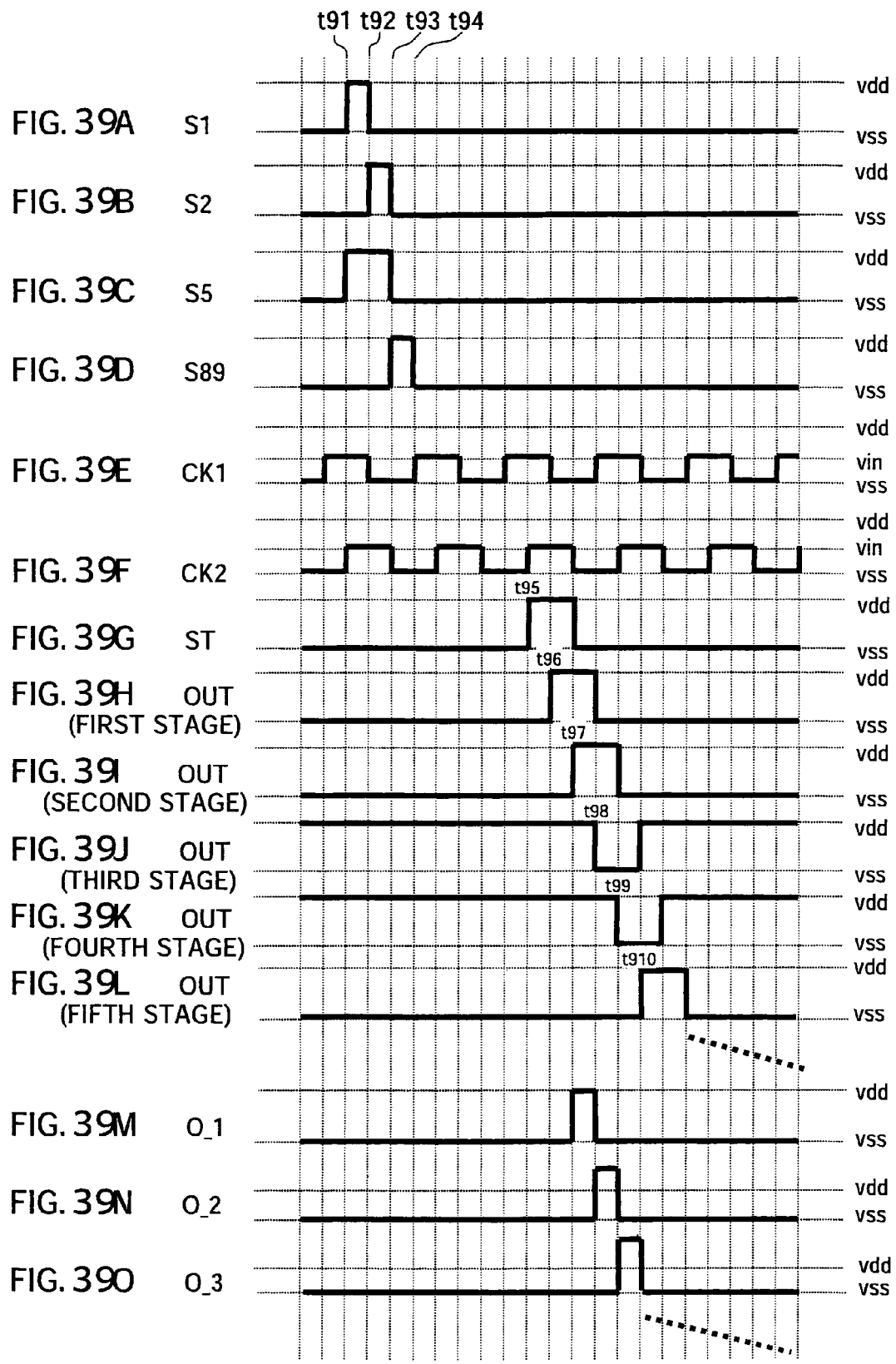
FIG. 39 is a diagram showing an example of signal waveforms of portions in the shift register shown in FIG. 38.

FIG. 39 is a diagram showing an example of signal waveforms of portions in the shift register shown in FIG. 38. Signal waveforms of FIGS. 39A to 39G correspond to signal waveforms of FIGS. 37A to 37O. As seen from the comparison of FIG. 37 and FIG. 39, the operation of the shift register shown in FIG. 36 and the operation of the shift register shown in FIG. 38 are the same concerning timings of the shift of pulse signals of shift stages. The shift register shown in FIG. 38 is different from the shift register shown in FIG. 38 in the point that, as shown in FIGS. 39M to 39N, the pulses of the output signals O_1, O_2, O_3, . . . which are successively shifted are pulses of the high level (VDD).

13th Embodiment

Next, an explanation will be given of a 13th embodiment of the present invention.

The level shift circuit and shift register explained in the embodiments explained above can be applied to a circuit generating a level shift signal to be supplied to the drive circuit of a pixel array in a display device using for example liquid crystal elements, electroluminescence (EL) elements, or light emitting diodes (LED) as pixels and to a shift register for generating pulse signals for scanning pixels.

Figure 40:
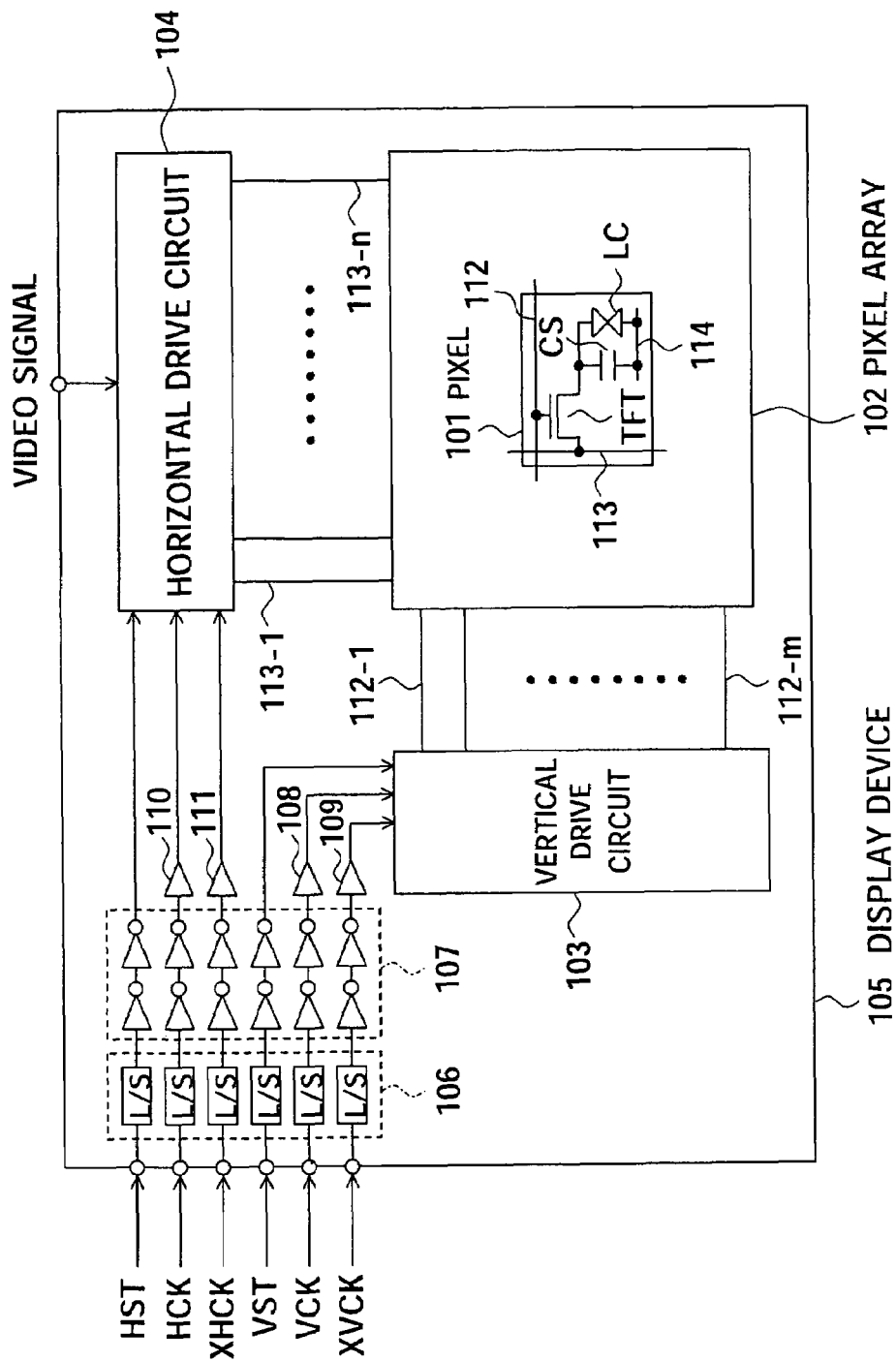
FIG. 40 is a diagram showing an example of the configuration of a display device according to an embodiment of the present invention.
Figure 41:
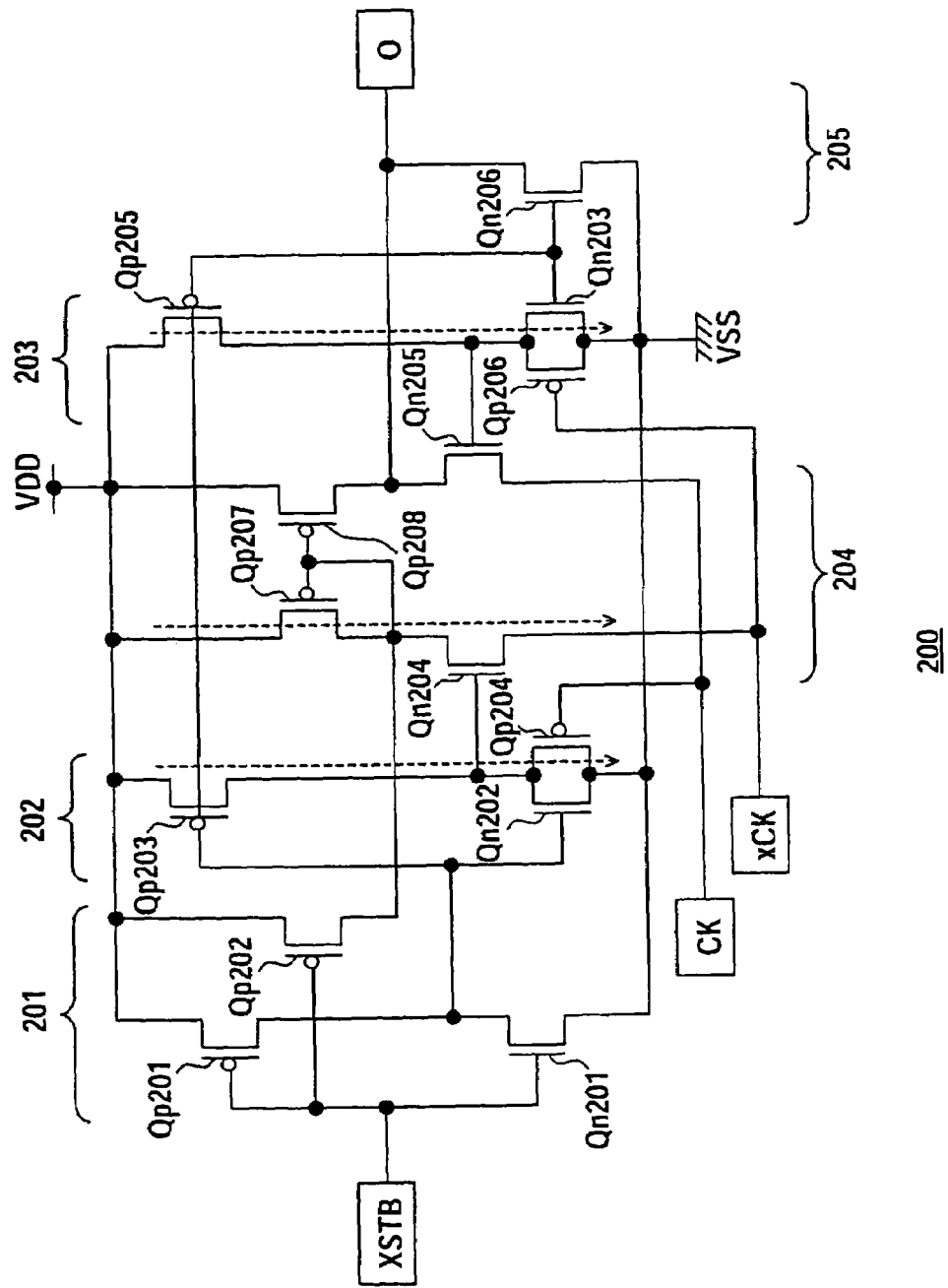
FIG. 41 is a diagram showing an example of the configuration of a conventional current mirror type level shift circuit.

FIG. 40 is a diagram showing an example of the configuration of a display device according to the present embodiment. A display device 105 shown in FIG. 40 has a pixel array 102, a vertical drive circuit 103, a horizontal drive circuit 104, a level shift circuit group 106, an inverter circuit group 107, and buffer circuits 108 to 111.

The pixel array 102 includes a plurality of pixels 101 arranged in a matrix of m rows and n columns. When for example the pixel 101 is a liquid crystal element, the pixel array 102 is formed on two transparent insulating substrates (for example glass substrates). m rows of scanning lines 112 (112-1 to 112-m) and n columns of signal lines 113 (113-1 to 113-n) of the pixel array 102 are formed in a lattice. The two substrates are arranged facing each other across a predetermined gap. A liquid crystal layer is held in the gap portion. On one of the two substrates sandwiching the liquid crystal layer therebetween, light is irradiated by a not shown back light device. Pixels 101 are formed at intersecting portions of the scanning lines 112 and the signal lines 113.

Each pixel 101 has a thin film transistor TFT, a liquid crystal cell LC, and a storage capacitor CS as shown in for example FIG. 40. The thin film transistor is connected at its gate to the scanning line 112 and connected at its source to the signal line 113. The drain of the thin film transistor TFT is connected to one electrode (pixel electrode) of the liquid crystal cell LC and one electrode of the storage capacitor CS. Here, the liquid crystal cell LC includes a pixel electrode connected to the pixel transistor TFT, a counter electrode formed on an opposite substrate to the substrate on which this pixel electrode is formed, and a liquid crystal sandwiched between these electrodes. The counter electrode of the liquid crystal LC is connected to a common line 114 together with the other electrode of for example the storage capacitor CS.

The vertical drive circuit 103 successively selects rows from the first row to an m-th row of the pixel array 102 at a timing in synchronization with vertical clock signals VCK and xVCK for each vertical scanning period designated according to a vertical start pulse VST.

The vertical drive circuit 103 has for example a shift register for vertical scanning and m drive signal output circuits corresponding to m rows of the pixel array 102. The shift register for the vertical scanning generates pulse signals for successively selecting rows from the first row to the m-th row of the pixel array 102. This shift register generates the pulse signal of the first row at a timing in response to the vertical start pulse VST and successively shifts pulse signals in a sequence of the first row, second row, . . . , and the m-th row at timings synchronized with the vertical clock signals VCK and xVCK. When the i-th (1≦i≦m) is selected by the pulse signal generated by the shift register for vertical scanning, the drive signal output circuit corresponding to the pixel column in the i-th row of the pixel array 102 supplies the drive signal to the scanning line 112-i. Due to this, the pixel columns in the i-th row become able to be driven through the signal lines 113-1 to 113-n.

The horizontal drive circuit 104 successively selects n pixels from the first column to the n-th column belonging to one row of the pixel array 102 during the selection of the vertical drive circuit 103 at timings synchronized to the horizontal clock signals HCK and XHCK for each horizontal period designated by the horizontal start pulse EST. Then, video signals are written into the selected pixels.

The horizontal drive circuit 104 has for example a shift register for the horizontal scanning and n drive signal output circuits corresponding to n columns of the pixel array 102. The shift register for the horizontal scanning generates pulse signals for successively selecting columns from the first column to the n-th column of the pixel array 102. This shift register generates pulse signals of the first column at a timing in response to the horizontal start pulse EST and shifts pulse signals in a sequence of the first column, second column, . . . , and an n-th column at timings synchronized with the horizontal clock signals HCK and xHCK. When a j-th (1≦j≦n) column is selected according to the pulse signal generated by the shift register for the horizontal scanning, the drive signal output circuit corresponding to the j-th pixel column of the pixel array 102 outputs a video signal to the signal line 113-j. Due to this, the video signal is written to the pixel connected to the signal line 113-j of the j-th column and belonging to the row during the selection by the vertical drive circuit 103.

The vertical drive circuit 103 and the horizontal drive circuit 104 are formed on the above insulating substrates together with for example the pixel array 102.

The level shift circuit group 106 shifts the levels of signals having low voltage amplitudes input from the outside of the display device 105 (vertical start pulse VST, vertical clock signals VCK and xVCK, horizontal start pulse HST, horizontal clock signals HCK and XHCK) to signals having high voltage amplitudes.

The buffer circuit 107 amplifies signals (VST, VCK, xVCK, HST, HCK, XHCK) shifted in level at the level shift circuit group 106. The vertical start pulse signal VST amplified at the buffer circuit group 107 is input to the vertical drive circuit 105. The vertical clock signals VCK and XVCK amplified at the buffer circuit group 107 are further amplified at the buffer circuits 108 and 109 and input to the vertical drive circuit 103. The horizontal start pulse signal HST amplified at the buffer circuit group 107 is input to the horizontal drive circuit 104. The horizontal clock signals HCK and XHCK amplified at the buffer circuit group 107 are further amplified at the buffer circuits 110 and 111 and input to the horizontal drive circuit 104.

In the display device according to the present embodiment having the above configuration, as the level shift circuit group 106 for generating signals having large amplitudes used for the drive of pixels, for example the vertical start pulse VST and the vertical clock signals VCK and xVCK input to the vertical drive circuit 103 and the horizontal start pulse HST and the horizontal clock signals HCK and XHCK input to the horizontal drive circuit 104, use is made of the level shift circuits explained in the previous embodiments. Accordingly, the level shift operation becomes resistant to the influence of the variation etc. of threshold voltages of the transistors due to variations in production, therefore stable operation can be realized. Further, the leakage current of each level shift circuit at the time of setting the voltages of the nodes NA and NB and at the time of the level shift operation is reduced, so the power consumption of the device can be reduced.

Further, as the shift register for the vertical scanning included in the vertical drive circuit 103 and the shift register for the horizontal scanning included in the horizontal drive circuit 104, the shift register explained in previous embodiments may be used. Due to this, it becomes unnecessary to shift levels of the signals VST, VCK, XVCK, HST, HCK, and XHCK in the level shift circuit group 106, therefore the supply of these signals to the vertical drive circuit 103 and the horizontal drive circuit 104 while keeping the low amplitudes as they are becomes possible.

While several embodiments of the present invention were explained above, the present invention is not limited to only the above formats and includes various variations.

In the level shift circuit (FIG. 6) according to the fourth embodiment, by setting the p-type MOS transistor Qp5 and the n-type MOS transistor Qn5 OFF in the period for setting the voltage, it becomes possible to simultaneously perform operations to be carried out in the first period and the third period in the level shift circuit (FIG. 2) according to the second embodiment in parallel and, at the same time, it becomes possible to simultaneously perform operations to be carried out in the second period and the fourth period in parallel. However, the level shift circuit according to the present invention is not limited to only the case where operations in the first period and the third period and operations in the second period and the fourth period are simultaneously carried out as in the level shift circuit according to the fourth embodiment. For example, it is also possible if a portion of the first period and the second period and a portion of the third period and the fourth period overlap. In this overlapping period (fifth period), by disconnecting at least one of the p-type MOS transistor Qp5 and the n-type MOS transistor QN5, the generation of a penetration current can be prevented.

Further, the level shift circuit (FIG. 6, FIG. 8) according to the fourth and fifth embodiments is provided with the p-type MOS transistor Qp5 and the n-type MOS transistor Qn5, but the present invention is not limited to this. In these level shift circuits, it is sufficient so far as at least the penetration current flowing through the p-type MOS transistor Qp1 and the n-type MOS transistor Qn1 can be prevented, therefore either transistor may be omitted as well.

Further, in the 13th embodiment, an example of using a liquid crystal element as the pixel 101 was explained, but the present invention is not limited to this. For example, the present invention can also be applied to various display devices using for example EL elements and LED elements as the pixels. Further, the level shift circuit of the present invention is not limited to display devices and can be widely applied to various devices requiring the conversion of the signal amplitude.

It should be understood by those skilled in the art that various modifications, combinations, sub-combinations and alterations may occur depending on design requirements and other factors insofar as they are within the scope of the appended claims or the equivalents thereof.

What I claim is:

1. A level shift circuit for shifting the level of an input signal and outputting the result, comprising:
    a first switch turning on or off in accordance with a voltage of a first node, switching ON and OFF when the voltage is a first threshold value, and outputting a first voltage to an output terminal of the level shift signal at the time of the ON state;
    a second switch turning on or off in accordance with the voltage of a second node, switching ON and OFF when the voltage is a second threshold value, and outputting a second voltage to the output terminal at the time of the ON state;
    a first capacitor receiving a first input signal at one terminal and connected at the other terminal to the first node;
    a second capacitor receiving a second input signal at one terminal, and connected at the other terminal to the second node; and
    a voltage setting circuit for setting the voltage of the first node at the first threshold value and setting the voltage of the second node at the second threshold value in a predetermined period and setting the first node and the second node in a floating state after the predetermined period.

2. A level shift circuit as set forth in claim 1, wherein
    the first threshold value and the second threshold value are included within a range from the first voltage to the second voltage,
    the first switch turns on when the voltage of the first node is at the second voltage side with respect to the first threshold value and turns off when it is at the first voltage side,
    the second switch turns on when the voltage of the second node is at the first voltage side with respect to the second threshold value and turns off when it is at the second voltage side, and
    the voltage setting circuit charges the first capacitor so that the voltage of the first node is at the second voltage side with respect to the first threshold value in a first period, supplies the voltage output from the first switch in the ON state to the first node in a second period after the charging, charges the second capacitor so that the voltage of the second node is at the first voltage side with respect to the second threshold value in a third period, and supplies the voltage output from the second switch in the ON state to the second node in a fourth period after the charging.

3. A level shift circuit as set forth in claim 2, wherein the voltage setting circuit charges the second capacitor in the third period after the first switch turns off in the second period.

4. A level shift circuit as set forth in claim 3, wherein the voltage setting circuit charges the second capacitor so that the voltage of the second node is at the second voltage side with respect to the second threshold value in the first period.

5. A level shift circuit as set forth in claim 3, wherein said voltage setting circuit includes:

a first voltage supply circuit supplying a predetermined voltage at said second voltage side with respect to said first threshold value to said first node in said first period, a third switch connecting one terminal of said first switch from which said first voltage is output when on and said first node in said second period, a second voltage supply circuit supplying a predetermined voltage at said first voltage side with respect to said second threshold value to said second node in said third period, and a fourth switch connecting one terminal of said second switch from which said second voltage is output when on and said second node in said fourth period.

6. A level shift circuit as set forth in claim 5, wherein said first voltage supply circuit supplies a predetermined voltage at said second voltage side with respect to said first threshold value to said first node and said second node in said first period.

7. A level shift circuit as set forth in claim 3, wherein the voltage setting circuit disconnects the first switch and the output terminal and/or disconnects the second switch and the output terminal in the first period, the second period, the third period, and the fourth period.

8. A level shift circuit as set forth in claim 3, wherein the voltage setting circuit disconnects the first switch and the output terminal and connects the second switch and the output terminal in the first period and the second period and connects the first switch and the output terminal and disconnects the second switch and the output terminal in the third period and the fourth period.

9. A level shift circuit as set forth in claim 8, wherein
said first input signal and said second input signal have voltages from a third voltage to a fourth voltage, when said first input signal changes from said third voltage to said fourth voltage, the voltage of said first node changes from said first threshold value to a direction toward said second voltage, when said second input signal changes from said third voltage to said fourth voltage, the voltage of said second node changes from said second threshold value to a direction toward said second voltage, and said voltage setting circuit supplies voltage to said first node in said first period and said second period when said first input signal has said third voltage and supplies voltage to said second node in said third period and said fourth period when said second input signal has said fourth voltage.

10. A level shift circuit as set forth in claim 7, wherein said voltage setting circuit includes:
a first voltage supply circuit supplying a predetermined voltage at said second voltage side with respect to said first threshold value to said first node in said first period, a third switch connecting one terminal of said first switch from which said first voltage is output when on and said first node in said second period, a second voltage supply circuit supplying a predetermined voltage at said first voltage side with respect to said second threshold value to said second node in said third period, a fourth switch connecting one terminal of said second switch from which said second voltage is output when on and said second node in said fourth period, and a fifth switch disconnecting the first switch and the output terminal and/or disconnecting the second switch and the output terminal in the first period, the second period, the third period, and the fourth period.

11. A level shift circuit as set forth in claim 8, wherein said voltage setting circuit includes:
a first voltage supply circuit supplying a predetermined voltage at said second voltage side with respect to said first threshold value to said first node in said first period, a third switch connecting one terminal of said first switch from which said first voltage is output when on and said first node in said second period, a second voltage supply circuit supplying a predetermined voltage at said first voltage side with respect to said second threshold value to said second node in said third period, a fourth switch connecting one terminal of said second switch from which said second voltage is output when on and said second node in said fourth period, and a fifth switch disconnecting the first switch and the output terminal and connecting the second switch and the output terminal in the first period and the second period and connecting the first switch and the output terminal and disconnecting the second switch and the output terminal in the third period and the fourth period.

12. A level shift circuit as set forth in claim 2, wherein the voltage setting circuit disconnects the first switch and the output terminal and/or disconnects the second switch and the output terminal in a fifth period in which at least a portion of the first period and the second period and at least a portion of the third period and the fourth period overlap.

13. A level shift circuit as set forth in claim 12, wherein the voltage setting circuit charges the second capacitor in the third period parallel to the charging of the first capacitor in the first period and supplies voltage to the second node in the fourth period parallel to the supply of voltage to the first node in the second period.

14. A level shift circuit as set forth in claim 12, wherein said voltage setting circuit includes:
a first voltage supply circuit supplying a predetermined voltage at said second voltage side with respect to said first threshold value to said first node in said first period, a third switch connecting one terminal of said first switch from which said first voltage is output when on and said first node in said second period, a second voltage supply circuit supplying a predetermined voltage at said first voltage side with respect to said second threshold value to said second node in said third period, a fourth switch connecting one terminal of said second switch from which said second voltage is output when on and said second node in said fourth period, and a fifth switch disconnecting the first switch and the output terminal and/or disconnecting the second switch and the output terminal in a fifth period.

15. A level shift circuit as set forth in claim 2, wherein said voltage setting circuit includes:
a first voltage supply circuit supplying a predetermined voltage at said second voltage side with respect to said first threshold value to said first node in said first period, a third switch connecting one terminal of said first switch from which said first voltage is output when on and said first node in said first period and said second period, a second voltage supply circuit supplying a predetermined voltage at said first voltage side with respect to said second threshold value to said second node in said third period, a fourth switch connecting one terminal of said second switch from which said second voltage is output when on and said second node in said third period and said fourth period, and a fifth switch disconnecting the first switch and the output terminal in said first period and said second period and disconnecting the second switch and the output terminal in said third period and said fourth period.

16. A level shift circuit as set forth in claim 2, wherein said voltage setting circuit includes:
   a first voltage supply circuit supplying a predetermined voltage at said second voltage side with respect to said first threshold value to said first node in said first period,
   a third switch connecting one terminal of said first switch from which said first voltage is output when on and said first node in said second period,
   a second voltage supply circuit supplying a predetermined voltage at said first voltage side with respect to said second threshold value to said second node in said third period, and
   a fourth switch connecting one terminal of said second switch from which said second voltage is output when on and said second node in said fourth period;
said third switch includes
   a first switch element having a first terminal connected to said first switch, a second terminal connected to said first node, and a control terminal inputting a voltage for controlling a conduction state between said first terminal and said second terminal,
   a first capacitance element connected between said control terminal and first terminal of the first switch element,
   a first drive input node inputting a voltage for driving said first switch element on or off, and
   a second switch element connected between said first drive input node and said control terminal of the first switch element, turning on when the voltage of said control terminal of the first switch element is at said second voltage side with respect to a predetermined threshold voltage between said first voltage and said second voltage in a state where voltage for driving said first switch element on is input to said first drive input node, and turning off when at said first voltage side with respect to the predetermined threshold voltage; and
said fourth switch includes
   a third switch element having a first terminal connected to said second switch, a second terminal connected to said second node, and a control terminal inputting a voltage for controlling a conduction state between said first terminal and said second terminal,
   a second capacitance element connected between said control terminal and first terminal of the third switch element,
   a second drive input node inputting a voltage for driving said third switch element on or off, and
   a fourth switch element connected between said second drive input node and said control terminal of the third switch element, turning on when the voltage of said control terminal of the third switch element is at said first voltage side with respect to a predetermined threshold voltage between said first voltage and said second voltage in a state where voltage for driving said third switch element on is input to said second drive input node, and turning off when at said second voltage side with respect to the predetermined threshold voltage.

17. A level shift circuit as set forth in claim 16, wherein said first switch element and said second switch element include insulated gate type transistors having first conductivity types,
said third switch element and said fourth switch element include insulated gate type transistors having second conductivity types,
said first capacitance element includes a parasitic capacitance element between a gate and drain of said insulated gate type transistor of said first switch element, and
said second capacitance element includes a parasitic capacitance element between a gate and drain of said insulated gate type transistor of said third switch element.

18. A level shift circuit as set forth in claim 2, further comprising:
   a first input circuit inputting an input signal having a voltage from a third voltage to a fourth voltage as said first input signal and said second input signal to said first capacitor and said second capacitor in a period outputting a level shift signal from said output terminal and
   a second input circuit inputting a predetermined voltage included in a range from said third voltage to said fourth voltage as said first input signal and said second input signal to said first capacitor and said second capacitor in a period where said voltage setting circuit sets voltages of said first node and said second node.

19. A level shift circuit as set forth in claim 18, wherein said second input circuit inputs said third voltage to said first capacitor and said second capacitor as said predetermined voltage,
said voltage setting circuit sets the voltage of said second node to a sixth voltage shifted to said first voltage side from said second threshold value by exactly the difference between said third voltage and said fourth voltage in a sixth period after setting the voltage of said second node to said second threshold value, and
the voltages of said first node and said second node shift to said second voltage side by exactly said difference when the input signal from said first input circuit changes from said third voltage to said fourth voltage.

20. A level shift circuit as set forth in claim 19, wherein said voltage setting circuit includes
   a third capacitor having one terminal connected to said second node and
   a third voltage supply circuit supplying said fourth voltage to the other terminal of said third capacitor in said third period and said fourth period and supplying said third voltage to the other terminal of said third capacitor in said sixth period.

* * * * *